(12) United States Patent
Blackburn et al.

(10) Patent No.: US 11,676,772 B2
(45) Date of Patent: Jun. 13, 2023

(54) NANOSTRUCTURED DEVICES HAVING PEROVSKITE NANOCRYSTAL LAYER FOR PHOTODETECTION, OPTICAL MEMORY, AND NEUROMORPHIC FUNCTIONALITY

(71) Applicant: Alliance for Sustainable Energy, LLC, Golden, CO (US)

(72) Inventors: Jeffrey Lee Blackburn, Golden, CO (US); Ji Hao, Santa Clara, CA (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 17/522,794

(22) Filed: Nov. 9, 2021

(65) Prior Publication Data
US 2022/0148819 A1    May 12, 2022

Related U.S. Application Data

(60) Provisional application No. 63/111,987, filed on Nov. 10, 2020.

(51) Int. Cl.
| | |
|---|---|
| *H01L 51/42* | (2006.01) |
| *H01G 9/20* | (2006.01) |
| *G01J 1/44* | (2006.01) |
| *H01L 51/00* | (2006.01) |

(52) U.S. Cl.
CPC .............. *H01G 9/2009* (2013.01); *G01J 1/44* (2013.01); *H01L 51/0077* (2013.01); *H01L 51/428* (2013.01); *H01L 51/4253* (2013.01)

(58) Field of Classification Search
CPC ......... B82Y 20/00; G01J 1/42; G01J 2001/42; G01J 2001/44; G01J 1/44; H01G 9/20; H01L 51/00; H01L 51/42

USPC ........................................... 250/214 R, 214.1
See application file for complete search history.

(56) References Cited

U.S. PATENT DOCUMENTS

| 10,273,403 B2 | 4/2019 | Luther et al. |
| 2022/0127529 A1* | 4/2022 | Chang .................. H01L 51/502 |

OTHER PUBLICATIONS

Bansal, P. et al., "Charge transfer between lead halide perovskite nanocrystals and single-walled carbon nanotubes," RSC Nanoscale Advances, vol. 2, 2020, 6 pages.
Bera, K. et al., "Graphene Sandwich Stable Perovskite Quantum-Dot Light-Emissive Ultrasensitive and Ultrafast Broadband Vertical Phototransistors," ACS Nano, vol. 13, 2019, 13 pages.
Blackburn, J.L., "Semiconducting Single-Walled Carbon Nanotubes in Solar Energy Harvesting," ACS Energy Letters, vol. 2, 2017, 16 pages.

(Continued)

*Primary Examiner* — Que Tan Le
(74) *Attorney, Agent, or Firm* — Michael A. McIntyre

(57) ABSTRACT

The present disclosure relates to a device that includes a perovskite nanocrystal (NC) layer, a charge separating layer, an insulating layer, a gate electrode, a cathode, and an anode, where the charge separating layer is positioned between the perovskite NC layer and the insulating layer, the insulating layer is positioned between the charge separating layer and the gate electrode, and the cathode and the anode both electrically contact the charge separating layer and the insulating layer. In some embodiments of the present disclosure, the device may be configured to operate as at least one of a photodetector, an optical switching device, and/or a neuromorphic switching device.

20 Claims, 50 Drawing Sheets

(56) References Cited

OTHER PUBLICATIONS

Brennan, M. et al., "Light-Induced Anion Phase Segregation in Mimxed Halide Perovskites," ACS Energy Letters, vol. 3, 2018, 10 pages.

Chowdhury, F. et al., "Perovskite Quantum Dot-Reduced Graphene Oxide Superstructure for Efficient Photodetection," ACS Applied Materials and Interfaces, vol. 12, 2020, 9 pages.

Deng, Y. et al., "Light-Induced Self-Poling Effect on Organometal Trihalide Perovskite Solar Cells for Increased Device Efficiency and Stability," Advanced Energy Materials, vol. 5, 2015, 6 pages.

Dequilettes, D. et al., "Photo-induced halide redistribution in organic-inorganic perovskite films," Nature Communications, May 24, 2016, 9 pages.

Dowgiallo, A-M et al., "Ultrafast Spectroscopic Signature of Charge Transfer between Single-Walled Carbon Nanotubes and C60," ACS Nano, vol. 8, No. 8, 2014, 9 pages.

Dowgiallo, A-M et al., "Probing Exciton Diffusion and Dissociation in Single-Walled Carbon Nanotube-C60 Heterojunctions," Journal of Physical Chemistry Letters, vol. 7, 2016, 6 pages.

Eckstein, K. et al., "Quantifying Doping Levels in Carbon Nanotubes by Optical Spectroscopy," Journal of Physical Chemistry C, vol. 123, 2019, 6 pages.

Ferguson, A. et al., "Efficiency of Charge-Transfer Doping in Organic Semiconductors Probed with Quantitative Microwave and Direct-Current Conductance," Journal of Physical Chemistry Letters, vol. 9, 2018, 7 pages.

Gaulding, E.A. et al., "Conductivity Tuning via Doping with Electron Donating and Withdrawing Molecules in Perovskite CsPbI3 Nanocrystal Films," Advanced Materials Communication, vol. 31, 2019, 9 pages.

Habisreutinger, S. et al., "Rapid Charge-Transfer Cascade through SWCNT Composites Enabling Low-Voltage Losses for Perovskite Solar Cells," ACS Energy Letters, vol. 4, 2019, 8 pages.

Ihly, R. et al., "Efficient charge extraction and slow recombination in organic-inorganic perovskites capped with semiconducting single-walled carbon nanotubes," Energy & Environmental Science, vol. 9, 2016, 11 pages.

Konstantatos, G. et al., "Hybrid graphene-quantum dot phototransistors with ultrahigh gain," Nature Nanotechnology, vol. 7, Jun. 2021, 6 pages.

Li, F. et al., "Ultrahigh Carrier Mobility Achieved in Photoresponsive Hybrid Perovskite Films via Coupling with Single-Walled Carbon Nanotubes," Advanced Science News, vol. 29, 2017, 8 pages.

Li, F. et al., Correction: "Ultrahigh Carrier Mobility Achieved in Photoresponsive Hybrid Perovskite Films via Coupling with Single-Walled Carbon Nanotubes," Advanced Science News, vol. 29, 2017, 1 page.

Li, Yu-Tao et al, "Light-Enhanced Ion Migration in Two-Dimensional Perovskite Single Crystals Revealed in Carbon Nanotubes/Two-Dimensional Perovskite Heterostructure and Its Photomemory Application," ACS Central Science, vol. 5, 2019, 9 pages.

Liu, Z. et al., "Photoresponsive Transistors Based on Lead-Free Perovskite and Carbon Nanotubes," Advanced Functional Materials, vol. 30, 2020, 10 pages.

Ma, C. et al., "Solution-Processed Mixed-Dimensional Hybrid Perovskite/Carbon Nanotube Electronics," ACS Nano, vol. 14, 2020, 11 pages.

Pradhan, B. et al., "Ultrasensitive and ultrathin phototransistors and photonic synapses using perovskite quantum dots grown from graphene lattice," Science Advances, vol. 6, 2020, 12 pages.

Rother, M. et al., "Aerosol-Jet Printing of Polymer-Sorted (6,5) Carbon Nanotubes for Field-Effect Transistors with High Reproducibility," Advanced Electronic Materials, vol. 3, 2017, 9 pages.

Schulz, P. et al., "Charge Transfer Dynamics between Carbon Nanotubes and Hybrid Organic Metal Halide Perovskite Films," Journal of Physical Chemistry Letters, vol. 7, 2016, 8 pages.

Spina, M. et al., "Ultrasensitive 1D field-effect phototransistors: CH3NH3PbI3 nanowire sensitized individual carbon nanotubes," RSC Nanoscale Communication, vol. 8, 2016, 6 pages.

Tian, H. et al., "Extremely Low Operating Current Resistive Memory Based on Exfoliated 2D Perovskite Single Crystals for Neuromorphic Computing," ACS Nano, vol. 11, 2017, 10 pages.

Van Der Burgt, J.S. et al., "Cuboidal Supraparticles Self-Assembled from Cubic CsPbBr3 Perovskite Nanocrystals," Journal of Physical Chemistry C, vol. 122, 2018, 7 pages.

Veeramalai, C.P. et al., "Porous Single-Wall Carbon Nanotuibe Templates Decorated with All-inorganic Perovskite Nanocrystals for Ultraflexible Photodetectors," ACS Applied Nano Materials, vol. 3, 2020, 9 pages.

Wang, K. et al., "Light-Stimulated Synaptic Transistors Fabricated by a Facile Solution Process Based on Inorganic Perovskite Quantum Dots and Organic Semiconductors," Wiley Small, vol. 15, 2019, 8 pages.

Xiao, Z. et al., "Energy-Efficient Hybrid Perovskite Memristors and Synaptic Devices," Advanced Electronic Materials, vol. 2, 2016, 8 pages.

Xing, J. et al., "Ultrafast ion migration in hybrid perovskite polycrystalline thin films under light and suppression in single crystals," RSC Phys. Chem. Chem. Phys., vol. 18, 2016, 7 pages.

Yuan, Y. et al., "Ion Migration in Organometal Trihalide Perovskite and Its Impact on Photovoltaic Efficiency and Stability," ACC. Chem. Res., vol. 49, 2016, 8 pages.

Zhao, Y-C. et al., "Quantification of light-enhanced ionic transport in lead iodide perovskite thin films and its solar cell applications," Light: Science and Applications, vol. 6, 2017, 8 pages.

Zhao, Y-Q. et al., "Layer-dependent transport and optoelectronic property in two-dimensional perovskite: (PEA)2PbI4," RSC Nanoscale, vol. 10, 2018, 12 pages.

Zheng, J. et al., "Flexible photodetectors based on reticulated SWNT/perovskite quantum dot heterostructures with ultrahigh durability," RSC Nanoscale, vol. 11, 2019, 7 pages.

Zhu, H. et al., "Perovskite and Conjugated Polymer Wrapped Semiconducting Carbon Nanotube Hybrid Films for High-Performance Transistors and Phototransistors," ACS Nano, vol. 13, 2019, 11 pages.

Zorn, N.F. et al., "Probing Mobile Charge Carriers in Semiconducting Carbon Nanotube Networks by Charge Modulation Spectroscopy," ACS Nano, vol. 14, 2020, 12 pages.

* cited by examiner

NANOSTRUCTURED DEVICES HAVING PEROVSKITE NANOCRYSTAL LAYER FOR PHOTODETECTION, OPTICAL MEMORY, AND NEUROMORPHIC FUNCTIONALITY

CROSS-REFERENCE TO RELATED APPLICATIONS

This application claims priority from U.S. Provisional Patent Application No. 63/111,987 filed on Nov. 10, 2020, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

SUMMARY

An aspect of the present disclosure is a device that includes a perovskite nanocrystal (NC) layer, a charge separating layer, an insulating layer, a gate electrode, a cathode, and an anode, where the charge separating layer is positioned between the perovskite NC layer and the insulating layer, the insulating layer is positioned between the charge separating layer and the gate electrode, and the cathode and the anode both electrically contact the charge separating layer and the insulating layer. In some embodiments of the present disclosure, the perovskite NC layer may include a plurality of perovskite nanocrystals where each perovskite nanocrystal has an average characteristic width between about 1 nm and about 100 nm. In some embodiments of the present disclosure, the plurality of perovskite nanocrystals may include at least one of a formamidinium lead halide ($FAPbX_3$) and/or a cesium lead halide ($CsPbX_3$). In some embodiments of the present disclosure, the plurality of perovskite nanocrystals may include at least one of $CsPbI_3$, $CsPbBr_3$, and/or $FAPbBr_3$.

In some embodiments of the present disclosure, the charge separating layer may include at least one of a carbonaceous material, a semiconductor, a polymer, and/or a small molecule. In some embodiments of the present disclosure, the carbonaceous material may include at least one of a carbon nanotube, graphene, a graphene oxide, a fullerene, a carbon fiber, and/or graphite. In some embodiments of the present disclosure, the carbon nanotube may include at least one of a single-walled carbon nanotube (SWCNT), a double-walled carbon nanotube (DWCNT), and/or a multi-walled carbon nanotube (MWCNT). In some embodiments of the present disclosure, the insulating layer may include a metal oxide.

In some embodiments of the present disclosure, the device may be configured to generate a current when the perovskite NC layer is exposed to a light. In some embodiments of the present disclosure, the device may further include a light source configured to provide the light. In some embodiments of the present disclosure, the light may have a wavelength between about 200 nm and about 1500 nm. In some embodiments of the present disclosure, the light may provide a pulse energy between about 73 fJ and about 250 µJ.

In some embodiments of the present disclosure, the device may be characterized by an optical responsivity between about $2.57 \times 10^3$ A/W and about $1.1 \times 10^9$ A/W. In some embodiments of the present disclosure, the optical responsivity may correspond to a fluence between about 30.7 mW/cm2 and about $10^{-8}$ mW/cm$^2$, respectively. In some embodiments of the present disclosure, the device may further include a source drain voltage electrically connecting the cathode and the anode. In some embodiments of the present disclosure, the source drain voltage may be configured to provide a voltage between about 0.01 V and about 10 V. In some embodiments of the present disclosure, the device may further include a gate voltage electrically connected to the gate electrode. In some embodiments of the present disclosure, the gate voltage may be configured to provide a voltage between about −60 V and about 60 V. In some embodiments of the present disclosure, the device may be configured to operate as at least one of a photodetector, an optical switching device, and/or a neuromorphic switching device.

An aspect of the present disclosure is a method that includes applying at least one of a source drain voltage, a gate voltage, and/or a light pulse to a device, and measuring a photocurrent generated by the device as a result of the applying, where the device includes a perovskite nanocrystal (NC) layer, a charge separating layer, an insulating layer, a gate electrode, a cathode, and an anode.

BRIEF DESCRIPTION OF DRAWINGS

Some embodiments are illustrated in referenced figures of the drawings. It is intended that the embodiments and figures disclosed herein are to be considered illustrative rather than limiting.

Figure 1:
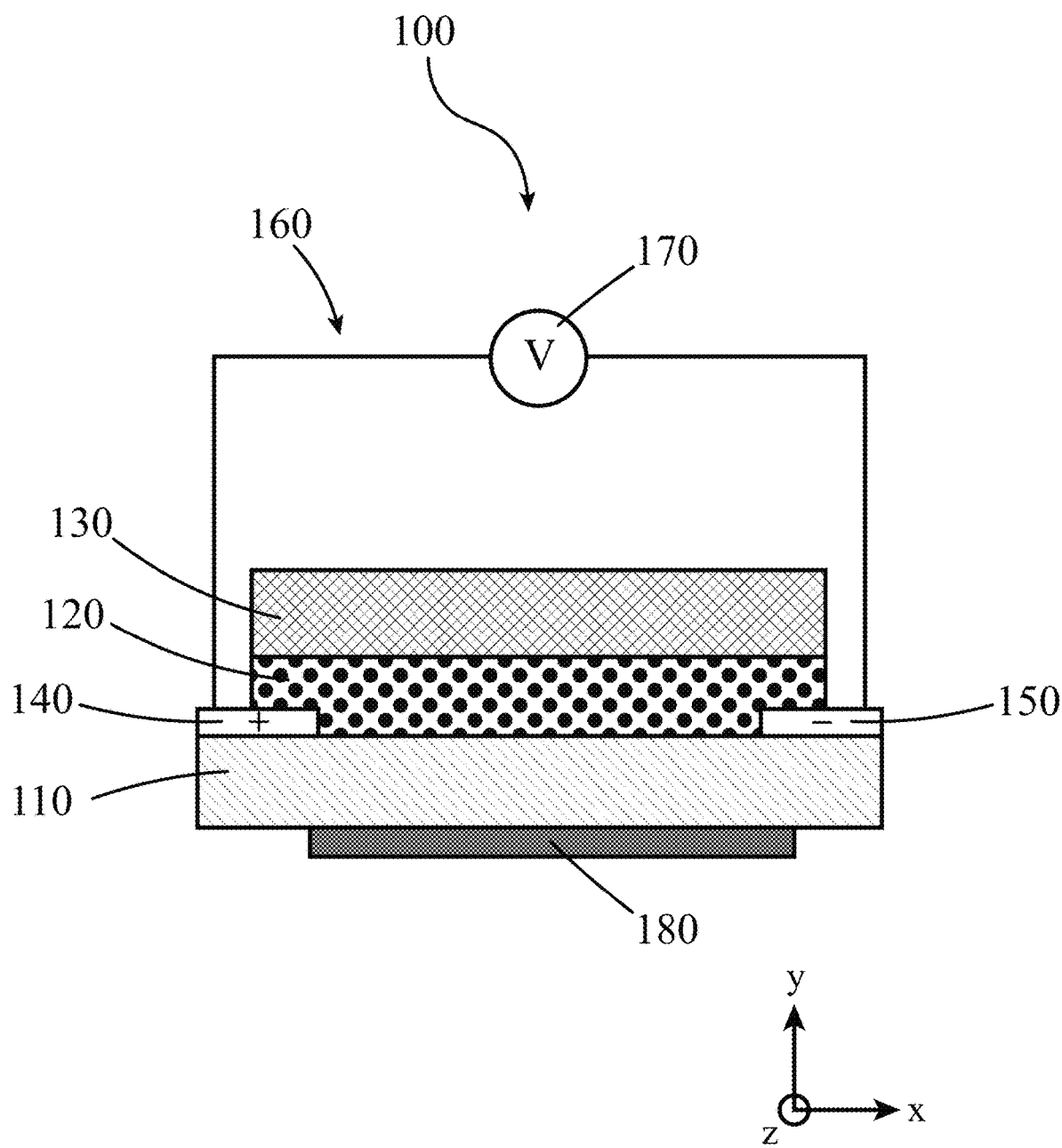
FIG. 1 illustrates a photodetector, according to some embodiments of the present disclosure.

REFERENCE NUMERALS 100 device
110 insulating layer
120 charge separating layer
130 perovskite nanocrystal (NC) layer
140 cathode
150 anode
160 circuit
170 source drain voltage
180 gate electrode
200 nanocrystal
210 intervening material
300 perovskite
310 A-cation
320 B-cation
330 X-anion

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to +1%, ±0.9%, ±0.8%, ±0.7%, ±0.6%, +0.5%, ±0.4%, ±0.3%, ±0.2%, or ±0.1% of a specific numeric value or target.

Among other things, the present disclosure relates to versatile heterojunctions between metal-halide perovskite nanocrystals (NC) and semiconducting single-walled carbon nanotubes that enable room-temperature, long-lived (thousands of seconds), writable and erasable persistent photoconductivity (PPC). Optical switching and basic neuromorphic functions can be stimulated at low operating voltages with femto- to pico-Joule energies per spiking event and detailed analysis demonstrates that PPC in this nanoscale interface arises from field-assisted control of ion migration within an array of perovskite nanocrystals. Contactless optical measurements also identify these systems as potential candidates for photonic synapses that are both stimulated and read in the optical domain. As shown herein, the exceptional tunability of PPC of some of the exemplary perovskite/carbon nanotube systems illustrates their promise for neuromorphic computing and other technologies that utilize optical memory.

Figure 2:
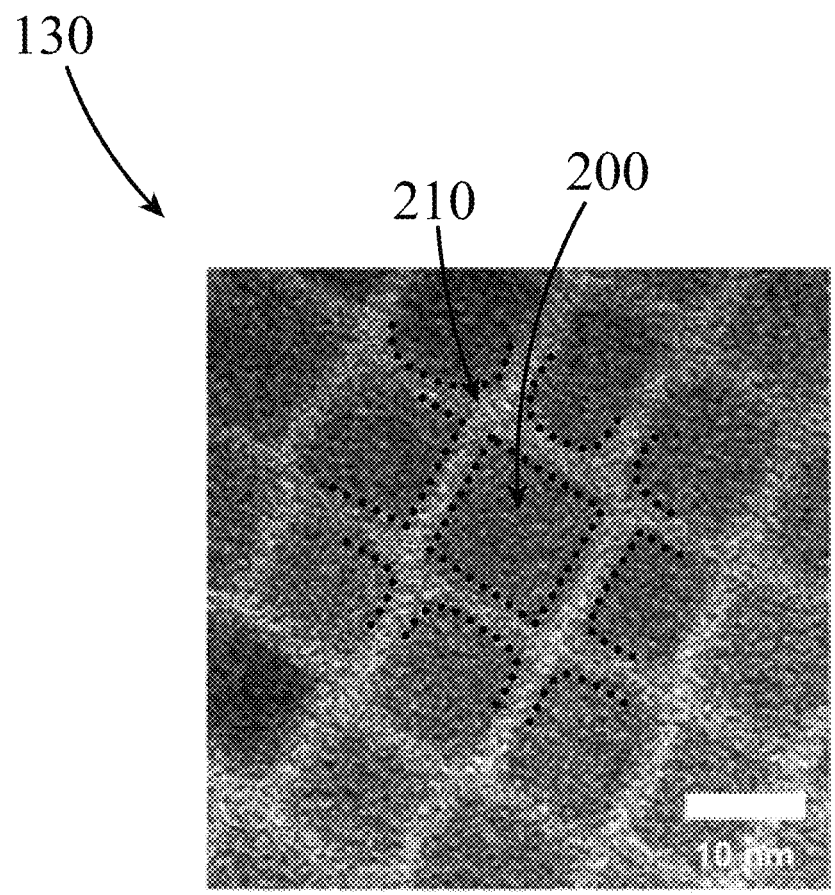
FIG. 2 illustrates a plurality of perovskite nanocrystals, according to some embodiments of the present disclosure.

FIG. 1 illustrates a device 100, according to some embodiments of the present disclosure. As described herein, such a device 100 may be configured to operate as at least one of a photodetector, an optical switching device, and/or a neuromorphic switching device. In some embodiments of the present disclosure, such a device 100 may include a layer constructed of a plurality of perovskite nanocrystals, referred to herein as a perovskite nanocrystal layer 130, or perovskite NC layer 130. Perovskite materials, including perovskite nanocrystals, are described in more detail below (see FIGS. 3A-3C and 4). Referring to FIG. 2, as described herein, the plurality of perovskite nanocrystals (a single nanocrystal 200 is called out in FIG. 2), together making up a perovskite NC layer 130, may be characterized by an intervening material 210 positioned between the individual perovskite nanocrystals 200, where the intervening layer 210 is substantially free of a ligand such that the absence of these ligands may result in the device demonstrating unique optoelectronic properties and/or performance metrics. In some embodiments of the present disclosure, the intervening material 210 positioned between neighboring perovskite nanocrystals 200 may include at least one of a lead halide, a cesium halide, and/or a formamidinium halide. An example of a ligand that is not present in an intervening material 210, e.g. has been removed from the intervening material 210, includes oleylamine. In some embodiments of the present disclosure, the individual perovskite nanocrystals 200 making up the perovskite NC layer 130 of a device 100 may have an average characteristic width between about one nanometer and about 100 nm. In some embodiments of the present disclosure, the plurality of perovskite nanocrystals 200 may be constructed of at least one of a formamidinium lead halide ($FAPbX_3$) and/or a cesium lead halide ($CsPbX_3$), where the halide may include at least one of bromine, iodine, and/or chlorine. In some embodiments of the present disclosure, the perovskite nanocrystals 200 may be further characterized by a surface that is enriched in charge trapping sites.

In some embodiments of the present disclosure, an improved optoelectronic property and/or performance metric of a device 100 from which a ligand has been removed from the intervening material 210 positioned between neighboring perovskite nanocrystals 200 may include at least one of a high optical responsivity, a high external quantum efficiency (EQE), and/or an optical switching resulting from at least one of a low light pulse energy, a long photocurrent decay transient, and/or under a gate bias voltage. In some embodiments of the present disclosure, a device as described herein may have a high optical responsivity characterized by a value between about $2.57\times10^3$ A/W at a fluence of about 30.7 $mW/cm^2$ and about $1.1\times10^9$ A/W at a fluence of about $10^{-8}$ $mW/cm^2$. In some embodiments of the present disclosure, a pulse energy of a device as described herein may be between about 73 fJ and about 250 µJ. In some embodiments of the present disclosure, a device as described herein may have a photocurrent decay transient up to about 5,000 seconds.

Referring again to FIG. 1, in addition to a perovskite NC layer 130, a device 100 may further include a charge separating layer 120, an insulating layer 110, a gate electrode 180, a cathode 140, and an anode 150, according to some embodiments of the present disclosure. As shown in FIG. 1, an insulating layer 110 may be positioned between the gate electrode 180 and each of the cathode 140 and the anode 150. A gate electrode 180 is a doped semiconductor or metallic layer separated from the channel layer by the insulating layer. In some embodiments of the present disclosure, an insulating layer 110 may be constructed of a dielectric material such as a metal oxide and/or a plastic. Examples of metal oxides suitable for an insulating layer 110 include $SiO_2$, $Al_2O_3$, $TiO_2$, and/or $ZrO_2$. This gate electrode can be used to electrostatically control the carrier density and channel current of the heterojunction structure. The cathode 140 and the anode 140 may be electrically connected via a circuit 160 containing a source drain voltage 170, where the circuit 160 may include an electrically conductive metal wire. Referring again to FIG. 1, both the cathode 140 and the anode 150 may each be physically in contact with the charge separating layer 120. In some embodiments of the present disclosure, a charge separating layer 120 may be constructed of a carbonaceous material, for example of carbon nanotubes, more specifically of single-walled carbon nanotubes (SWCNTs), double-walled carbon nanotubes (DWCNTs), and/or multi-walled carbon nanotubes (MWCNTs). Other suitable materials that may be used in place of or in addition to carbon nanotubes include at least one of graphene, graphene oxide, fullerenes, carbon fibers, graphite, and/or combinations thereof. A charge separating layer 120 may also be constructed of another semiconducting layer such as monolayer of transition metal dichalcogenides (e.g., $MoS_2$, $MoSe_2$, $WS_2$, $WSe_2$), mono-elemental layers (e.g. silicene, borophene, and/or phosphorene), semiconducting polymers (e.g., P3HT and/or PBTTT), or small molecules (e.g., tetracene, rubrene, and/or anthracene).

In some embodiments of the present disclosure, a photocurrent response level of a device as described herein may be manipulated by at least one of a voltage applied to the cathode and the anode, a light pulse energy, and/or an applied gate voltage. In some embodiments of the present disclosure, a photocurrent response triggered by a light pulse energy may be erased by an applied gate voltage. In some embodiments of the present disclosure, neuromorphic operations of a device as described herein may be enabled by electron trapping at undercoordinated nanocrystal surface sites. In some embodiments of the present disclosure, a voltage range across the cathode/anode can be more than about 0.01V. In some embodiments of the present disclosure, a gate voltage may range between about −60V and about +60V. In some embodiments of the present disclosure, a light used to provide a pulse energy may have a wavelength less than or equal to about 405 nm, less than or equal to about 532 nm, or in a range between about 400 nm and about 700 nm. In some embodiments of the present disclosure, a light pulse energy be equal to or higher than about 7 femto Joule.

Figure 3A:
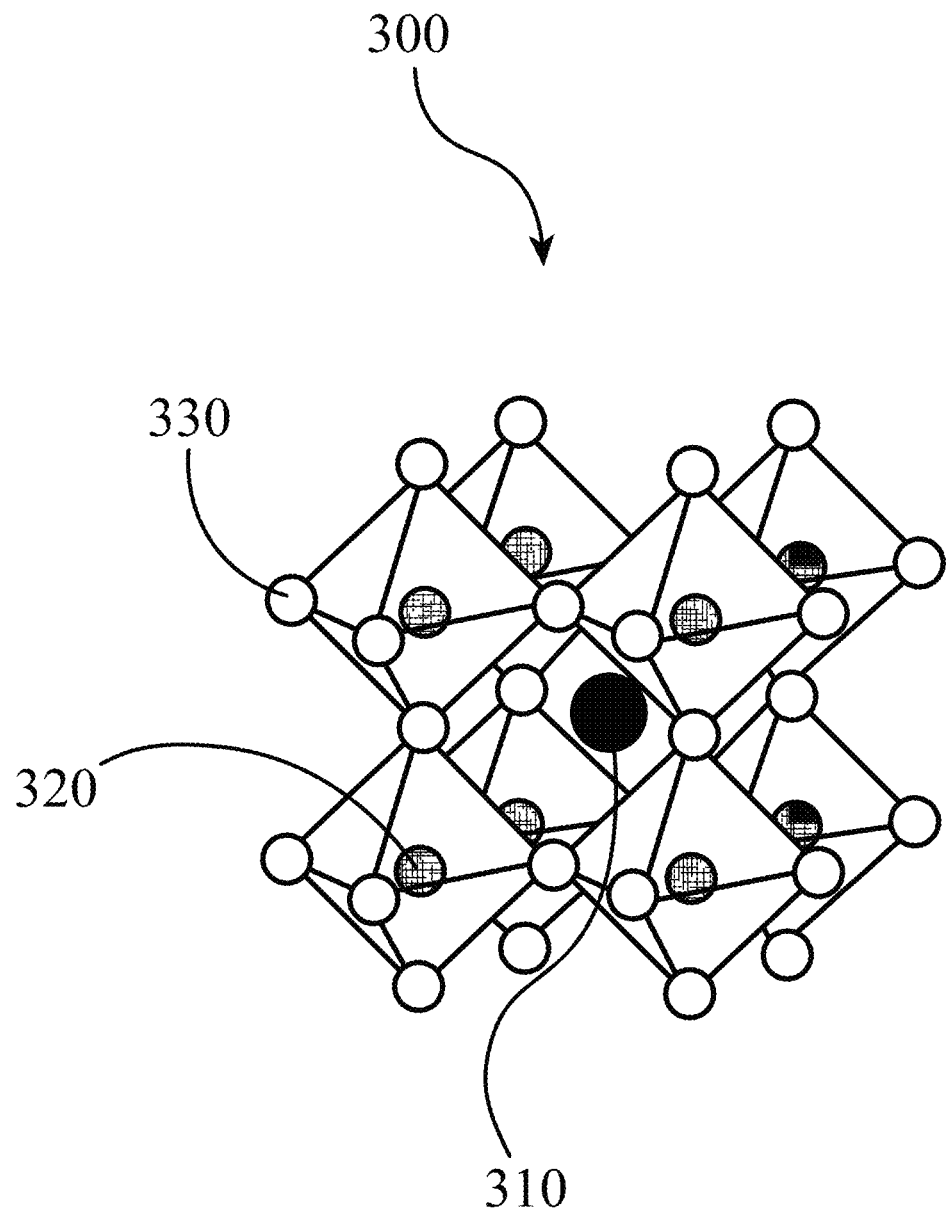
FIGS. 3A, 3B, and 3C illustrate a perovskite, according to some embodiments of the present disclosure.
Figure 3B:
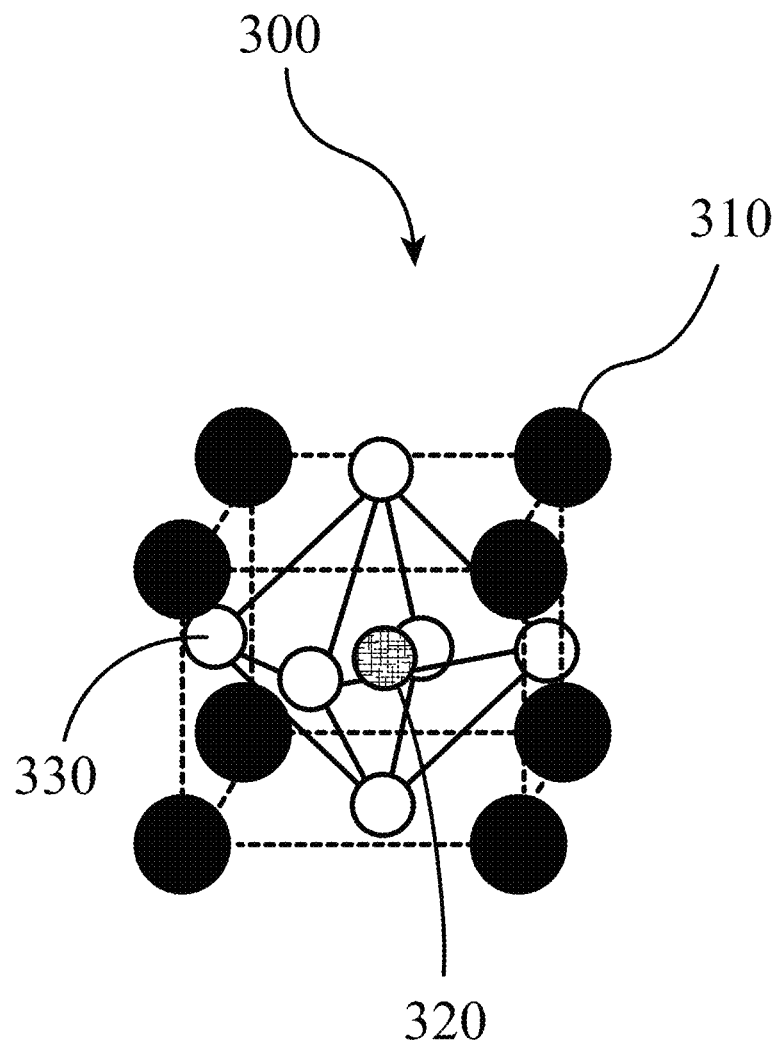
Figure 3C:
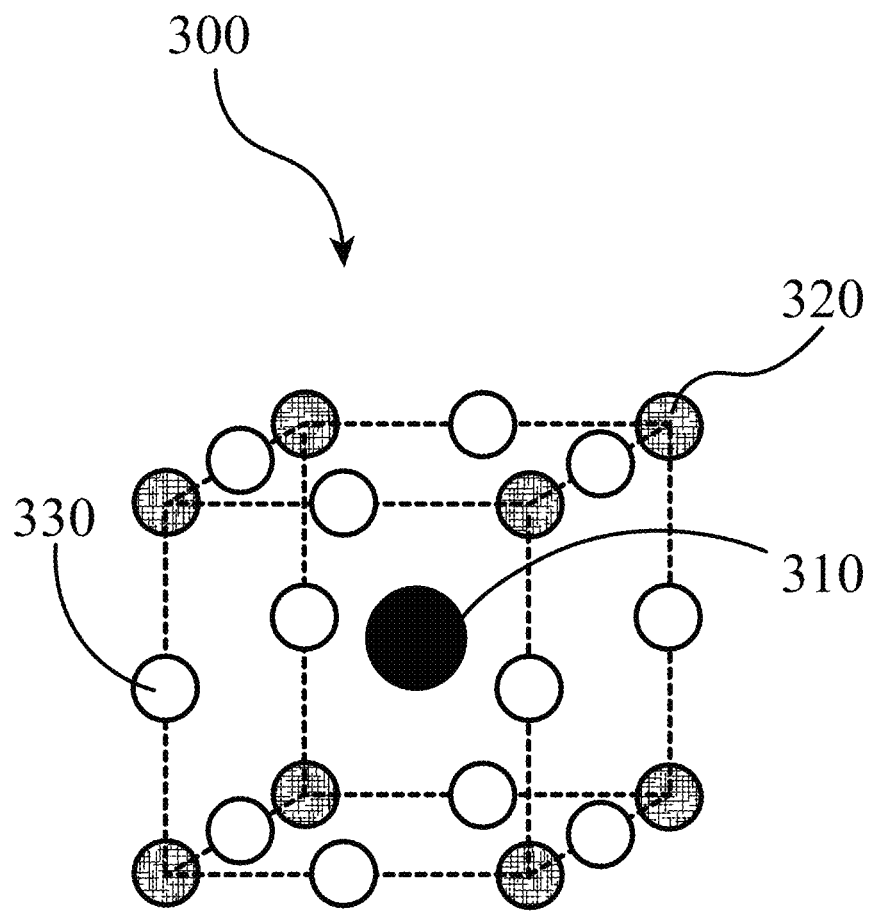

FIGS. 3A, 3B, and 3C illustrate that perovskites 300, for example, halide perovskites, may organize into cubic crystalline structures with corner-sharing octahedra, as well as other crystalline structures such as tetragonal, hexagonal, and orthorhombic with either edge- or face-sharing octahedra, and may be described by the general formula $ABX_3$, where X (330) is an anion and A (310) and B (320) are cations, typically of different sizes. In some embodiments of the present disclosure, a perovskite may have a layered structure that includes 3D structures described above positioned between sheets of organic cations; these are often termed 2D perovskites. Mixtures of the 2D and 3D phases are also possible. FIG. 3A illustrates that a perovskite 300 may be organized into eight octahedra surrounding a central A-cation 310, where each octahedra is formed by six X-anions 330 surrounding a central B-cation 320. FIG. 3B illustrates that a perovskite 300 may be visualized as a cubic unit cell, where the B-cation 320 is positioned at the center of the cube, an A-cation 310 is positioned at each corner of the cube, and an X-anion 330 is face-centered on each face of the cube. FIG. 3C illustrates that a perovskite 300 may also be visualized as a cubic unit cell, where the B-cation 320 resides at the eight corners of a cube, while the A-cation 310 is located at the center of the cube and with 12 X-anions 330 centrally located between B-cations 320 along each edge of the unit cell. For both unit cells illustrated in FIGS. 3B and 3C, the A-cations 310, the B-cations 320, and the X-anions 330 balance to the general formula $ABX_3$, after accounting for the fractions of each atom shared with neighboring unit cells. For example, referring to FIG. 3B, the single B-cation 320 atom is not shared with any of the neighboring unit cells. However, each of the six X-anions 330 is shared between two unit cells, and each of the eight A-cations 310 is shared between eight unit cells. So, for the unit cell shown in FIG. 3B, the stoichiometry simplifies to B=1, A=8*0.125=1, and X=6*0.5=3, or $ABX_3$. Similarly, referring again to FIG. 3C, since the A-cation is centrally positioned, it is not shared with any of the unit cells neighbors. However, each of the 12 X-anions 330 is shared between four neighboring unit cells, and each of the eight B-cations 320 is shared between eight neighboring unit cells, resulting in A=1, B=8*0.125=1, and X=12*0.25=3, or $ABX_3$. Referring again to FIG. 3C, the X-anions 330 and the B-cations 320 are shown as aligned along an axis; e.g. where the angle at the X-anion 330 between two neighboring B-cations 320 is exactly 180 degrees, referred to herein as the tilt angle. However, a perovskite 300 may have a tilt angle not equal to 180 degrees. For example, some embodiments of the present disclosure may have a tilt angle between 153 and 180 degrees.

Typical inorganic oxide perovskites include calcium titanium oxide (calcium titanate) minerals such as, for example, $CaTiO_3$ and $SrTiO_3$, while typical inorganic halide perovskites include $CsPbI_3$ and $CsPbBr_3$. In some embodiments of the present invention, the A-cation 310 may include a nitrogen-containing organic compound such as an alkylammonium compound. The B-cation 320 may include a metal and the X-anion 330 may include a halogen. Additional examples for the A-cation 310 include organic cations and/or inorganic cations, for example, Cs, Rb, K, Na, Li, and/or Fr. Organic A-cations 310 may be an alkylammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 310 include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$), hydrazinium, acetylammonium, dimethylammonium, imidazolium, guanidinium, benzylammonium, phenethylammonium, butylammonium and/or any other suitable nitrogen-containing or organic compound. In other examples, an A-cation 310 may include an alkylamine. Thus, an A-cation 310 may include an organic component with one or more amine groups. For example, an A-cation 310 may be an alkyl diamine halide such as formamidinium ($CH(NH_2)_2$). Thus, the A-cation 310 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$), and the like.

Examples of metal B-cations 320 include, for example, lead, tin, germanium, and or any other 2+ valence state metal that can charge-balance the perovskite 300. Further examples include transition metals in the 2+ state such as Mn, Mg, Zn, Cd, and/or lanthanides such as Eu. B-cations may also include elements in the 3+ valence state, as described below, including, for example, Bi, La, and/or Y. Examples for X-anions 330 include halogens: e.g. fluorine, chlorine, bromine, iodine and/or astatine. In some cases, the perovskite halide may include more than one X-anion 330, for example pairs of halogens; chlorine and iodine, bromine and iodine, and/or any other suitable pairing of halogens. In other cases, the perovskite 300 may include two or more halogens of fluorine, chlorine, bromine, iodine, and/or astatine.

Thus, the A-cation 310, the B-cation 320, and X-anion 330 may be selected within the general formula of $ABX_3$ to produce a wide variety of perovskites 300, including, for example, methylammonium lead triiodide ($CH_3NH_3PbI_3$), and mixed halide perovskites such as $CH_3NH_3PbI_3\text{-xClx}$ and $CH_3NH_3PbI_{3-x}Br_x$. Thus, a perovskite 300 may have more than one halogen element, where the various halogen elements are present in non-integer quantities; e.g. x is not equal to 1, 2, or 3. In addition, perovskite halides, like other organic-inorganic perovskites, can form three-dimensional (3-D), two-dimensional (2-D), one-dimensional (1-D), or zero-dimensional (0-D) networks, possessing the same unit structure. As described herein, the A-cation 110 of a perovskite 300, may include one or more A-cations, for example, one or more of cesium, FA, MA, etc. Similarly, the B-cation 320 of a perovskite 300, may include one or more B-cations, for example, one or more of lead, tin, germanium, etc. Similarly, the X-anion 330 of a perovskite 300 may include one or more anions, for example, one or more halogens (e.g. at least one of I, Br, Cl, and/or F), thiocyanate, and/or sulfur. Any combination is possible provided that the charges balance.

For example, a perovskite having the basic crystal structure illustrated in FIGS. 3A-3C, in at least one of a cubic, orthorhombic, and/or tetragonal structure, may have other compositions resulting from the combination of the cations having various valence states in addition to the 2+ state and/or 1+ state described above for lead and alkyl ammonium cations; e.g. compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Figure 4:
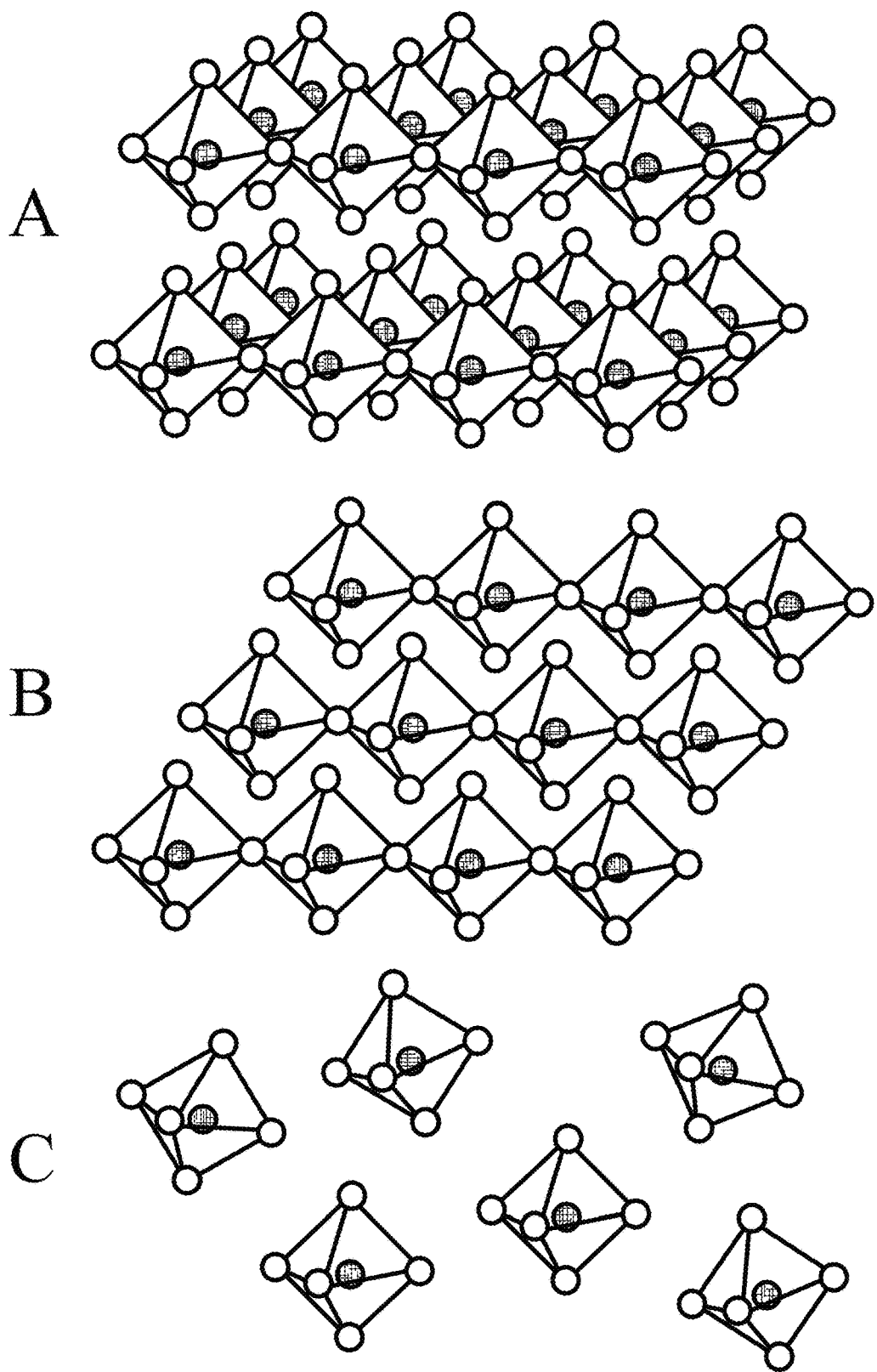
FIG. 4 illustrates 2D, 1D, and 0D perovskite structures, in Panels A, B, and C, respectively, according to some embodiments of the present disclosure.

In addition, perovskite halides, like other organic-inorganic perovskites, can form a three-dimensional (3D) network, a two-dimensional (2D) network, a one-dimensional (1D) network and/or a zero-dimensional (0D) network, possessing the same unit structure. A perovskite's 3D network is illustrated in FIGS. 3A, 3B, and 3C. FIG. 4 illustrates a 2D perovskite network, a 1D perovskite network, and a 0D perovskite network, in Panels A, B, and C, respectively. As described above, a 3D perovskite may adopt a general chemical formula of $ABX_3$, in which the A-cation may be a monovalent cation (e.g. methylammonium and/or formamidinium $CH(NH_2)_{2+}$), the B-cation may be a divalent cation (e.g. $Pb^{2+}$ and/or $Sn^{2+}$), and the X-anion may be a halide anion ($I^-$, $Br^-$, and/or $Cl^-$). In this formula, the 3D network of perovskites may be constructed by linking all corner sharing $BX_6$ octahedra, with the A-cation filling the space between eight octahedral unit cells to balance the crystal charge.

Referring to Panel A of FIG. 4, through the chemically accomplished dimensional reduction of the 3D crystal lattice, 2D perovskites, $(A')_m(A)_{n-1}B_nX_{3n+1}$, may adopt a new structural and compositional dimension, A' (not shown), where monovalent (m=2) or divalent (m=1) cations can intercalate between the X-anions of the 2D perovskite sheets. Referring to Panel B of FIG. 4, 1D perovskites are constructed by $BX_6$ octahedral chained segments spatially isolated from each other by surrounding bulky organic cations (not shown), leading to bulk assemblies of paralleled octahedral chains. Referring to Panel C of FIG. 4, typically, the 0D perovskites are constructed of isolated inorganic octahedral clusters and surrounded by small cations (not shown) which are connected via hydrogen bonding.

In some embodiments of the present disclosure, devices 100 like those described above were obtained by utilizing a highly enriched (6,5) semiconducting single-walled carbon nanotube (s-SWCNT) layer as a charge separating layer 120 combined with a layer of small inorganic perovskite NCs as the primary absorber layer; i.e., a perovskite NC layer 130. As explained below, these layers were combined in a geometry that, among other things, allowed efficient lateral transport (in the XZ plane in FIG. 1) of carriers between electrodes 140 and 150 while simultaneously building up an out-of-plane (XY and YZ planes in FIG. 1) electric field that could drive ion migration to realize PPC. As shown herein, this combination of layers resulted in a photodetector capable of room-temperature writing and erasing of optical memory that definitively demonstrates ion migration, in particular migration of the X-anions, as the source of PPC. In some embodiments of the present disclosure, exceptionally high optical responsivity (up to $1.1 \times 10^9$ A/W at a fluence of $10^{-8}$ mW/cm$^2$) enabled optical switching with pulses energies as low as 8 pJ per pulse at low operating voltages for both the gate ($V_{GS}=0$ V) and source-drain ($V_{DS}=1$ V), where the gate voltage is the voltage applied to the gate electrode 180 in FIG. 1 and the source-drain voltage 170 is the voltage applied to electrodes 140 and 150 in FIG 1. PPC stimulated by short light pulses (from the s scale to the second scale) was retained for thousands of seconds at room temperature, enabling the demonstration of both synaptic plasticity and long-term potentiation. Thus, the exemplary devices described herein and illustrated in FIG. 1 illustrate the nearly limitless tunability available, based on the rich pallet of possible A-cation, B-cation, and X-anion species used to synthesize the perovskite NCs and the control over NC size and surface chemistry, and underscores the promise these materials offer for the development of a new class of hybrid optical memory devices.

Figure 5:
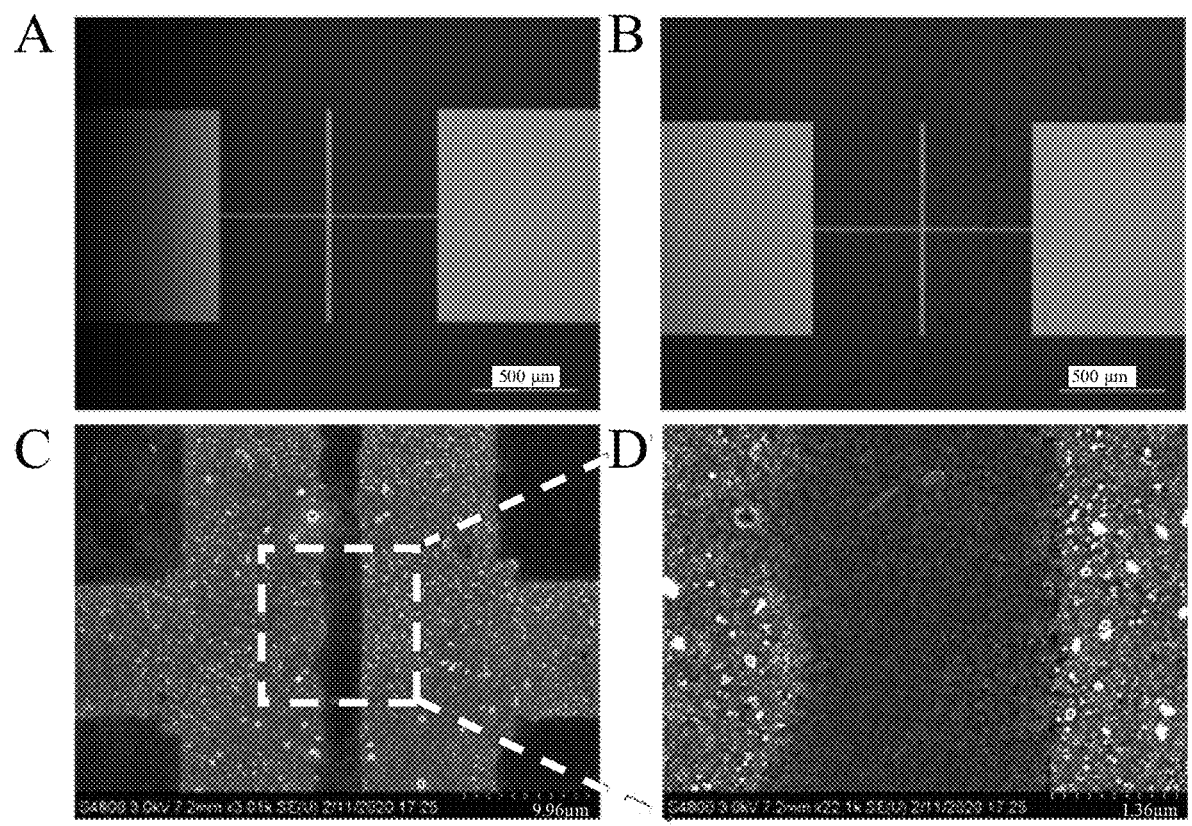
FIG. 5 illustrates an optical microscope image of a FET substrate before any material deposition (Panel A), an optical microscope image of a FET device following (6,5) SWCNT ultrasonic spray deposition (Panel B), a high-resolution SEM image of a FET device following perovskite nanocrystal ($CsPbI_3$) deposition onto the (6,5) s-SWCNT network (Panel C), and an enlarged SEM image (Panel D) of the channel area of the ($CsPbI_3$)NC/(6,5) s-SWCNT FET device (the boxed area of Panel C), according to some embodiments of the present disclosure. The thicknesses of these heterojunction structures on devices were between 30~50nm, which were characterized by using a Dektak stylus profiler.
Figure 6:
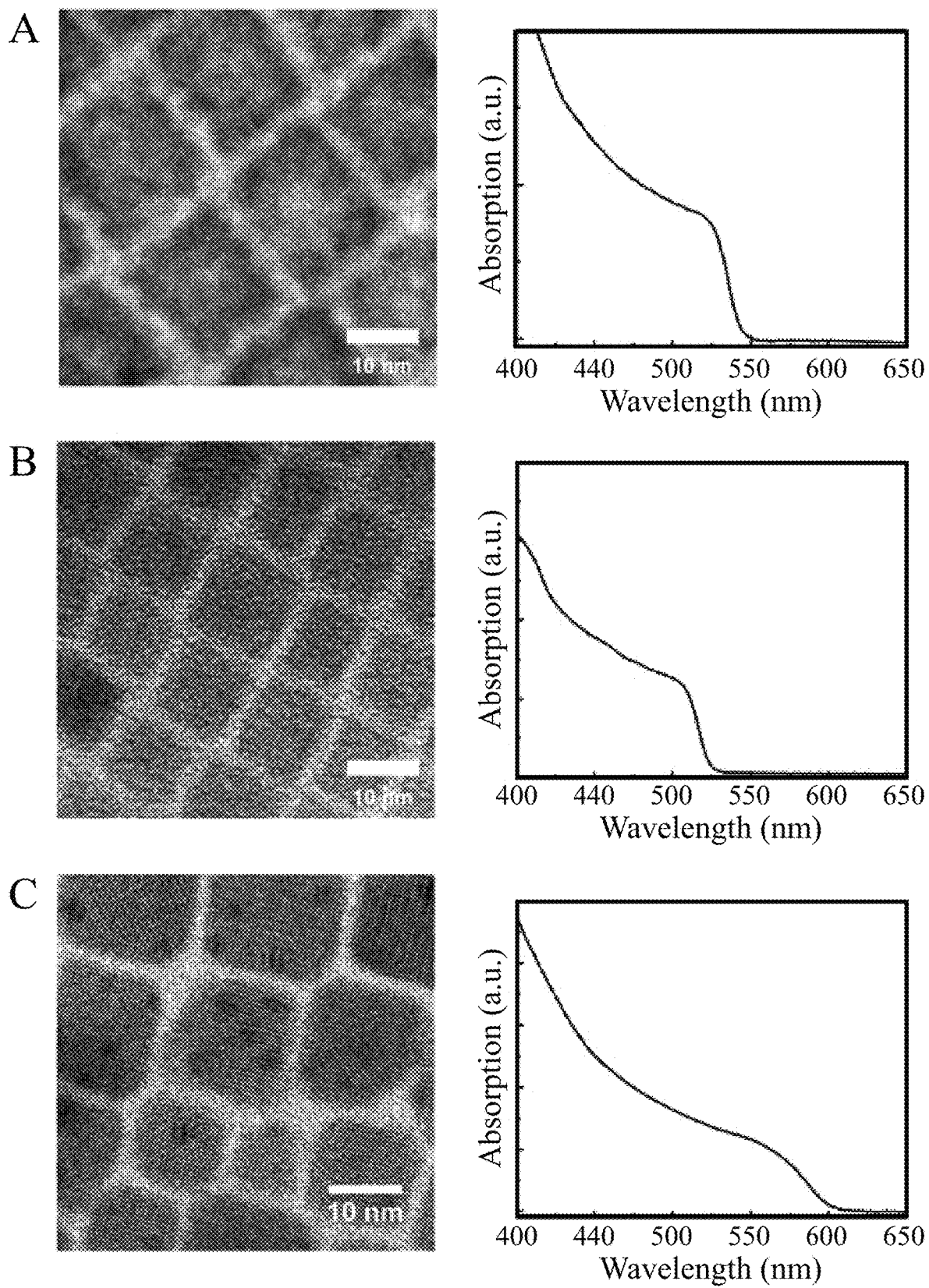
FIG. 6 illustrates TEM images (left) and absorption spectra (right) of (Panel A) $FAPbBr_3$ NCs, (Panel B) CsPbBr3 NCs, and (Panel C) $CsPbI_3$ NCs, according to some embodiments of the present disclosure.

As described herein, in some embodiments of the present disclosure, near-monochiral (6, 5) s-SWCNT networks were used to synthesize charge separating layers 120 and perovskite NC arrays to synthesize perovskite NC layers 130, which were then used to fabricate devices 100 having charge-separating NC/SWCNT bilayer heterojunctions, physically located at the interface between the perovskite NC layer 130 and the charge separating layer 120. In some embodiments of the present disclosure, exemplary devices were manufactured by first depositing (ca. 10 nm) electronically coupled SWCNT networks (i.e., charge separating layer 120) onto a substrate (i.e., insulating layer 110), followed by the depositing of a layer 130 of perovskite nanocrystals having a layer thickness between about 30 nm and about 50 nm (see FIG. 5). Three types of perovskite NCs were evaluated for synthesizing perovskite NC layers 130— cesium lead iodide ($CsPbI_3$), cesium lead bromide ($CsPbBr_3$), and formamidinium lead bromide ($FAPbBr_3$)— to produce devices 100 having three types of charge-separating heterojunctions. All of perovskite NCs tested herein had average widths between about 10 nm and about 15 nm (see FIG. 6).

Figure 7A:
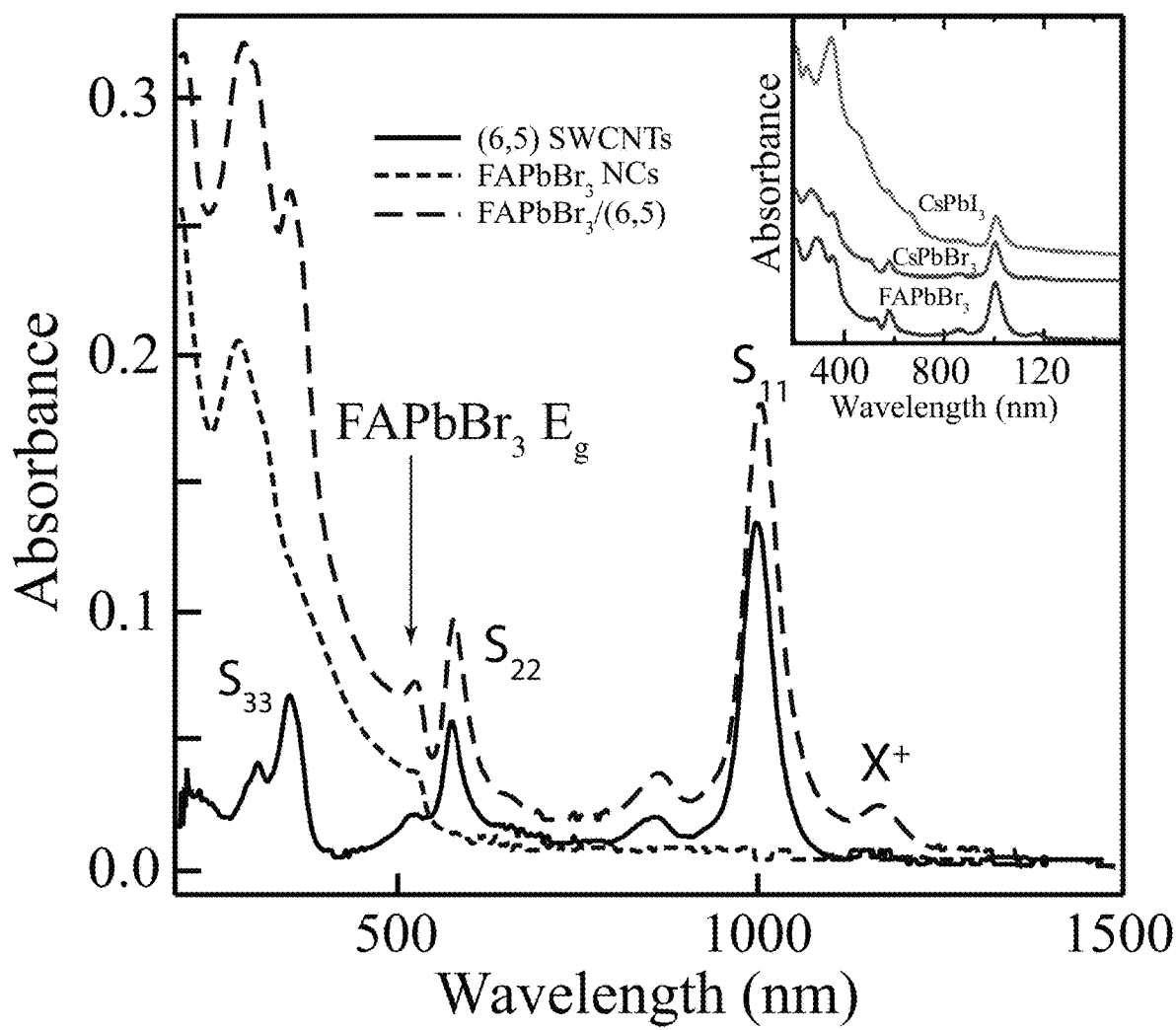
FIG. 7A illustrates absorption spectra of a neat (6,5) s-SWCNT film, a neat $FAPbBr_3$ NC array, and a $FAPbBr_3$ NC/(6,5) s-SWCNT heterojunction, according to some embodiments of the present disclosure.
Figure 8:
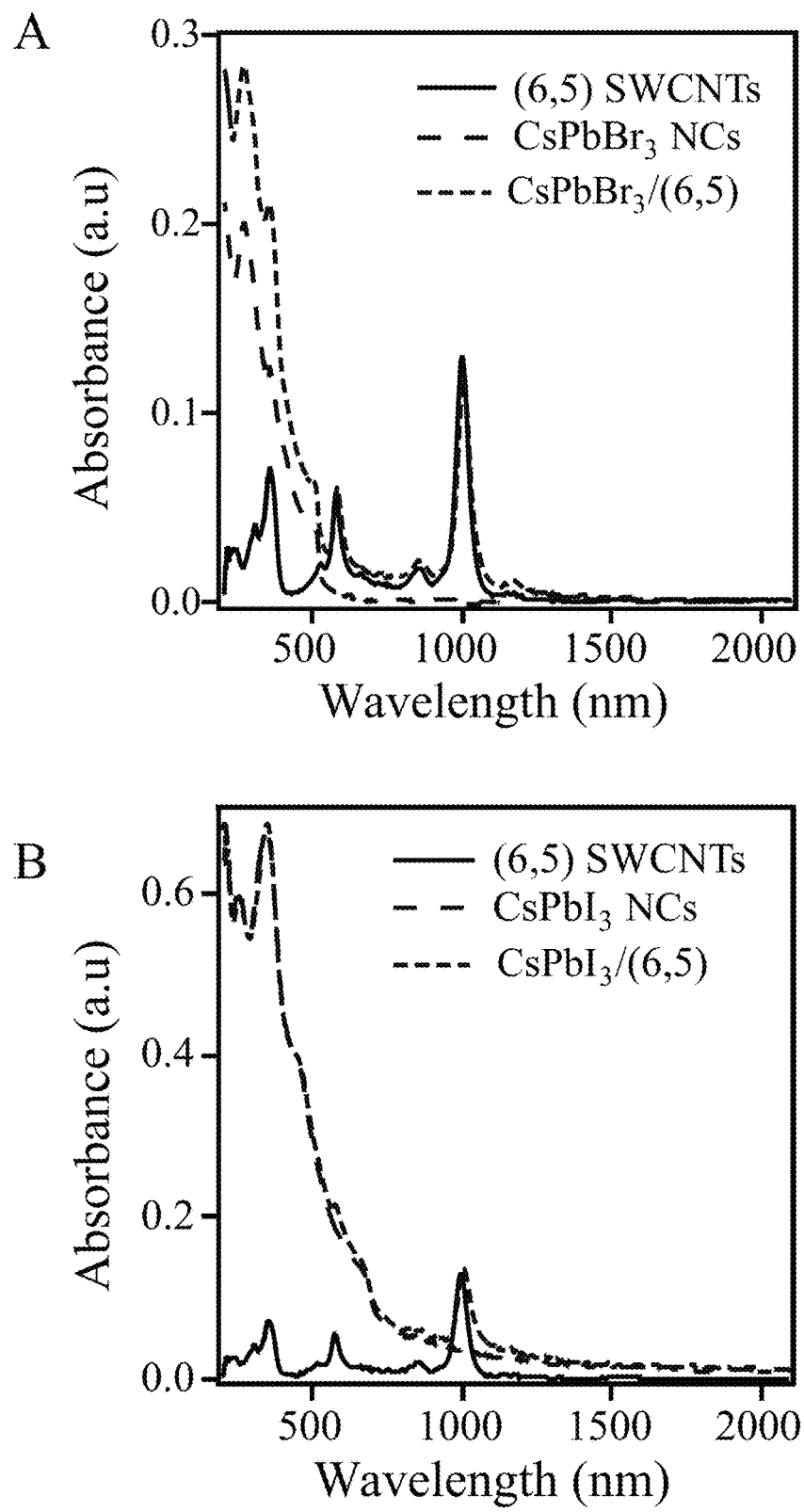
FIG. 8 illustrates full-panel absorption comparisons of neat (6,5) s-SWCNT networks, neat perovskite NCs, and heterojunction structure spectra for the $CsPbBr_3$ (Panel A) and $CsPbI_3$ (Panel B) samples, according to some embodiments of the present disclosure.
Figure 9:
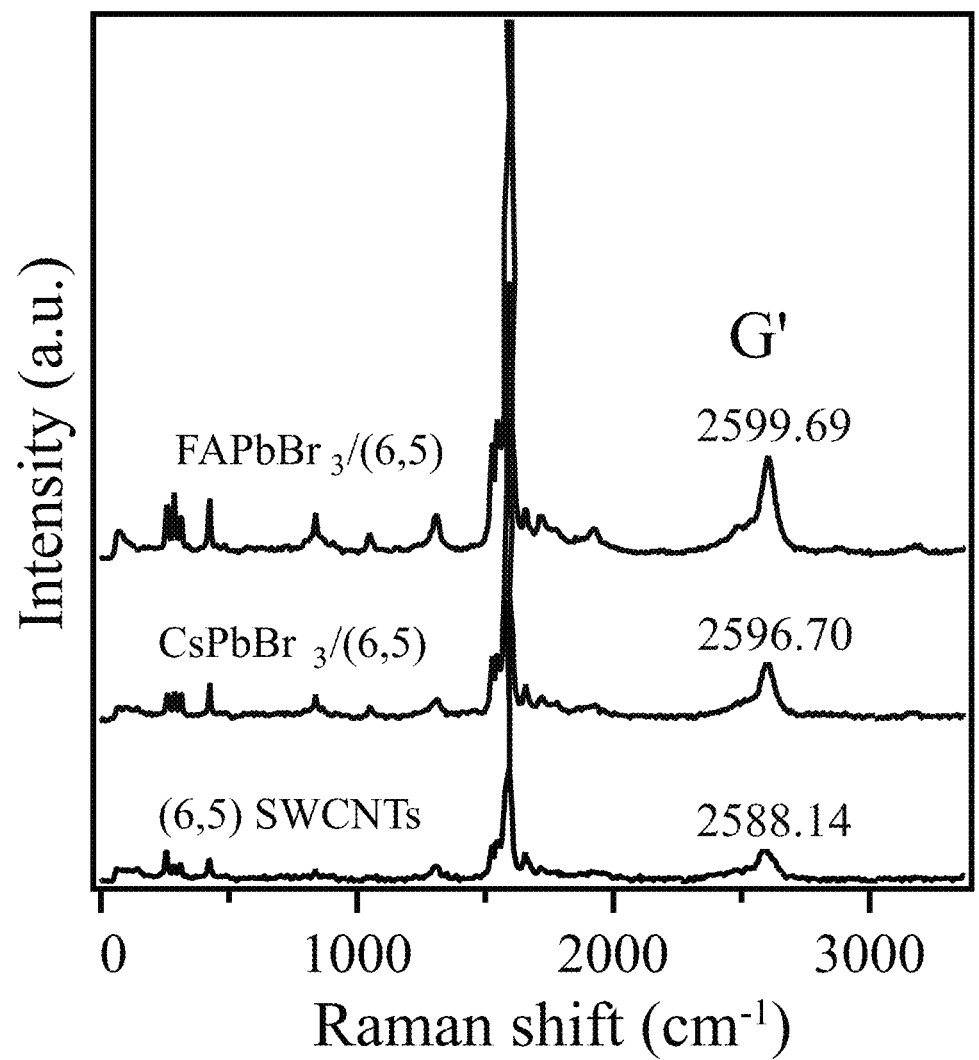
FIG. 9 illustrates confocal Raman spectra of $FAPbBr_3$/(6, 5), $CsPbBr_3$/(6,5), and (6,5) SWCNTs, according to some embodiments of the present disclosure. G' peak positions of $FAPbBr_3$/(6,5), $CsPbBr_3$/(6,5), and (6,5) SWCNTs are obtained through the Lorentzian fitting, which are 2599.69 $cm^{-1}$, 2596.70 $cm^{-1}$, 2588 $cm^{-1}$. Compared with (6,5) SWCNTs, the G' peak positions of $FAPbBr_3$/(6,5) and $CsPbBr_3$/(6,5) show a blue shift, which is caused by the removal of electron density from the SWCNT pi network contracts carbon-carbon bonds and stiffens the phonons. Thus, the observed hypsochromic shift confirms that a net ground-state transfer of holes occurs from the NCs to the s-SWCNTs.

FIG. 7A shows the absorption spectra of a charge separating layer 120 constructed of a (6, 5) SWCNT network, a perovskite NC layer 130 constructed of a FAPbBr$_3$ NC array, and a combination of these two layers forming a FAPbBr$_3$ NC/SWCNT heterojunction. All three heterojunction spectra, resulting from each of the combinations, CsPbI$_3$ NC/SWCNT, CsPbBr$_3$ NC/SWCNT, and FAPbBr$_3$ NC/SWCNT are shown in the inset of FIG. 7A and full absorption comparisons of the individual components and composite for (6, 5) SWCNTs and CsPbBr$_3$ and (6, 5) SWCNTs and CsPbI$_3$ are shown in Panels A and B of FIG. 8, respectively. Referring to FIG. 8, the SWCNT spectra (solid lines) clearly show the first ($S_{11}$), second ($S_{22}$), and third ($S_{33}$) excitonic transitions at 998 nm, 574 nm, and 352 nm, respectively; while absorption from the wrapping polymer (PFO-BPy) can be seen at 400 nm. The spectrum of FAPbBr$_3$ NCs (dashed line) illustrated in FIG. 7A has a clear absorption onset around 536 nm. The heterojunction spectra (FAPbBr$_3$/(6,5) in FIG. 7A, CsPbBr$_3$/(6,5) in Panel A of FIG. 8, and CsPbI$_3$/(6,5) in Panel B of FIG. 8 are mostly a linear superposition of the SWCNT and NC spectra, with the exception of an additional feature at 1168 nm, which can be assigned to the creation of charged excitons ($X^+$), or trions. This feature denotes the presence of charge carriers in the SWCNT network making up the charge separation layers 120, indicating a ground-state charge transfer interaction between the NCs of the perovskite NC layers 120 and the SWCNTs making up the charge separating layers 120. Field-effect transistor measurements (vide infra) and the redshift of the SWCNT G' peak in Raman spectra (see FIG. 9) indicate that, in all three examples, upon contact (in the dark), holes were transferred from the perovskite NC layers 130 to the (6,5) s-SWCNTs of the charge separating layer 120. Importantly, this ground-state charge transfer and the relative work function offsets of the s-SWCNT charge separating layer 120 and the perovskite NC layer 130 (measured by photoelectron spectroscopy) should lead to downward band bending in the perovskite NC layer 130 at the interface between the perovskite NC layer 130 and the charge separating layer 120 and an accumulation of bromine vacancies at the interface to charge-compensate the electrons in the NC array. This interfacial accumulation of bromine vacancies implies the formation of a bromine-rich surface in the dark. Although these data prove conclusively that X-anions migrate as a result of the test conditions, it is believed that the A-cations and B-cations also migrate at the test conditions.

Figure 7B:
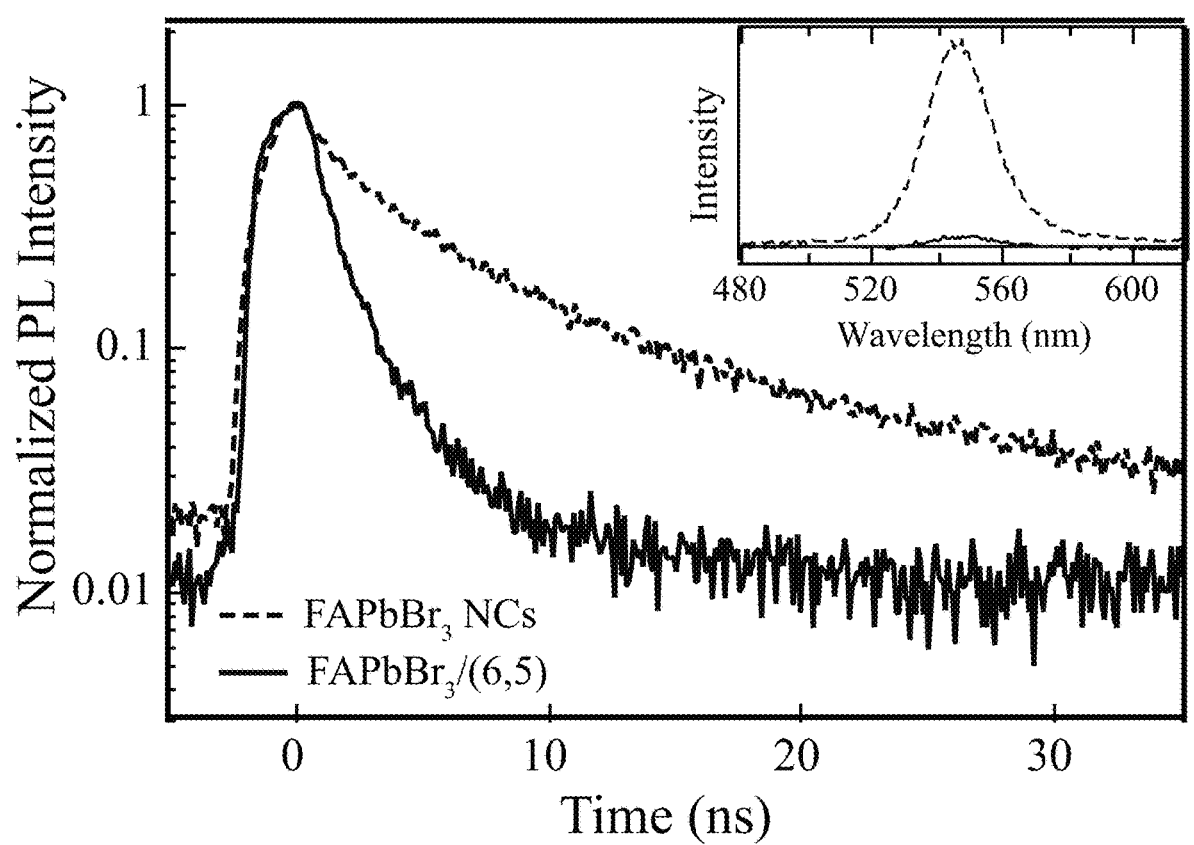
FIG. 7B illustrates time-resolved photoluminescence (TRPL) decay transients of the $FAPbBr_3$ 545 nm emission for neat $FAPbBr_3$ NC array (dashed line), and $FAPbBr_3$ NC/(6,5) s-SWCNT heterojunction (solid line), according to some embodiments of the present disclosure. Inset shows the PL spectra for the same two samples. Excitation at 405 nm.
Figure 10A:
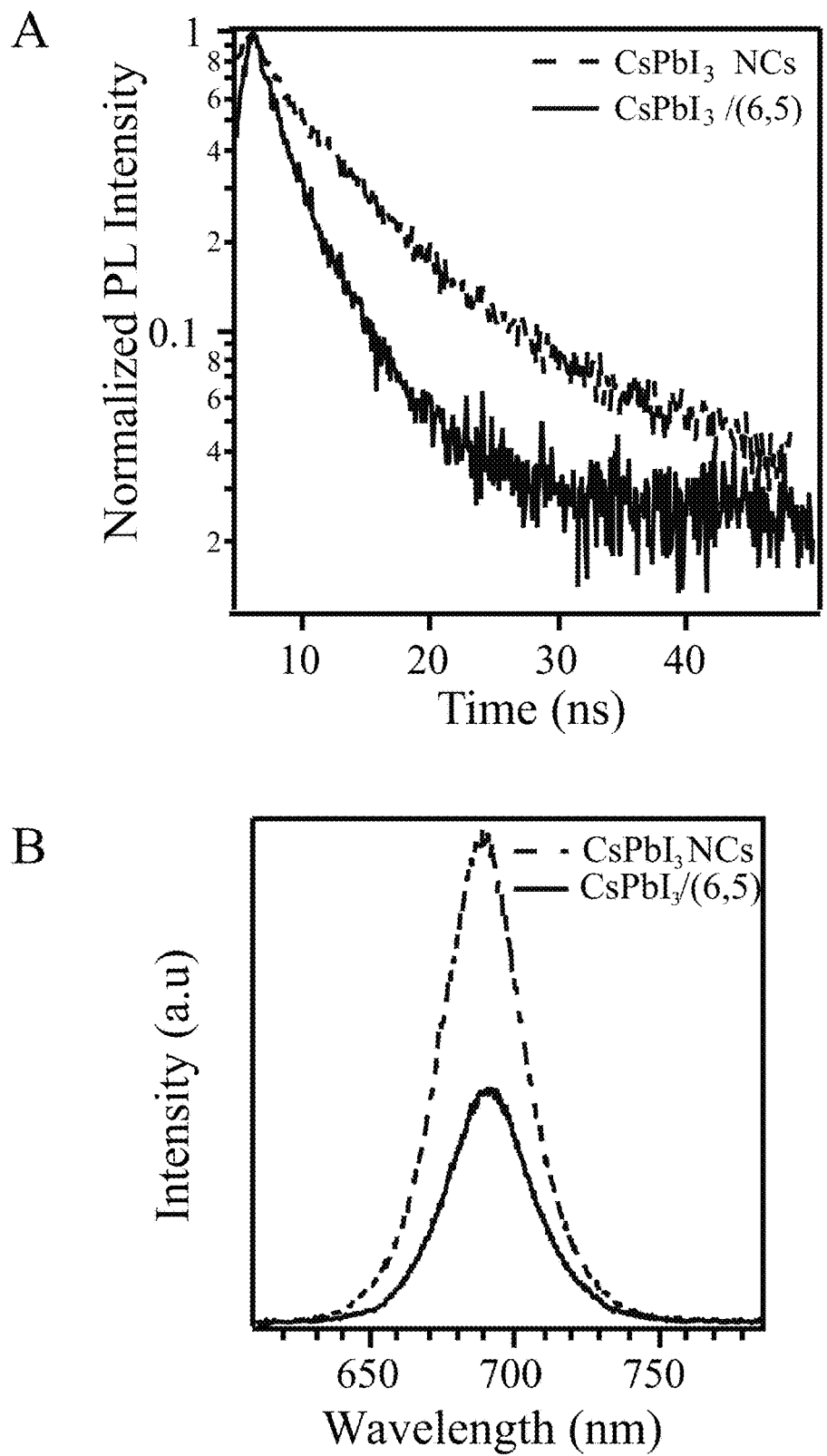
FIG. 10A illustrates (Panel A) time-resolved PL and (Panel B) steady-state spectra of $CsPbI_3$ perovskite nanocrystals with (6,5) SWCNTs, according to some embodiments of the present disclosure.
Figure 10B:
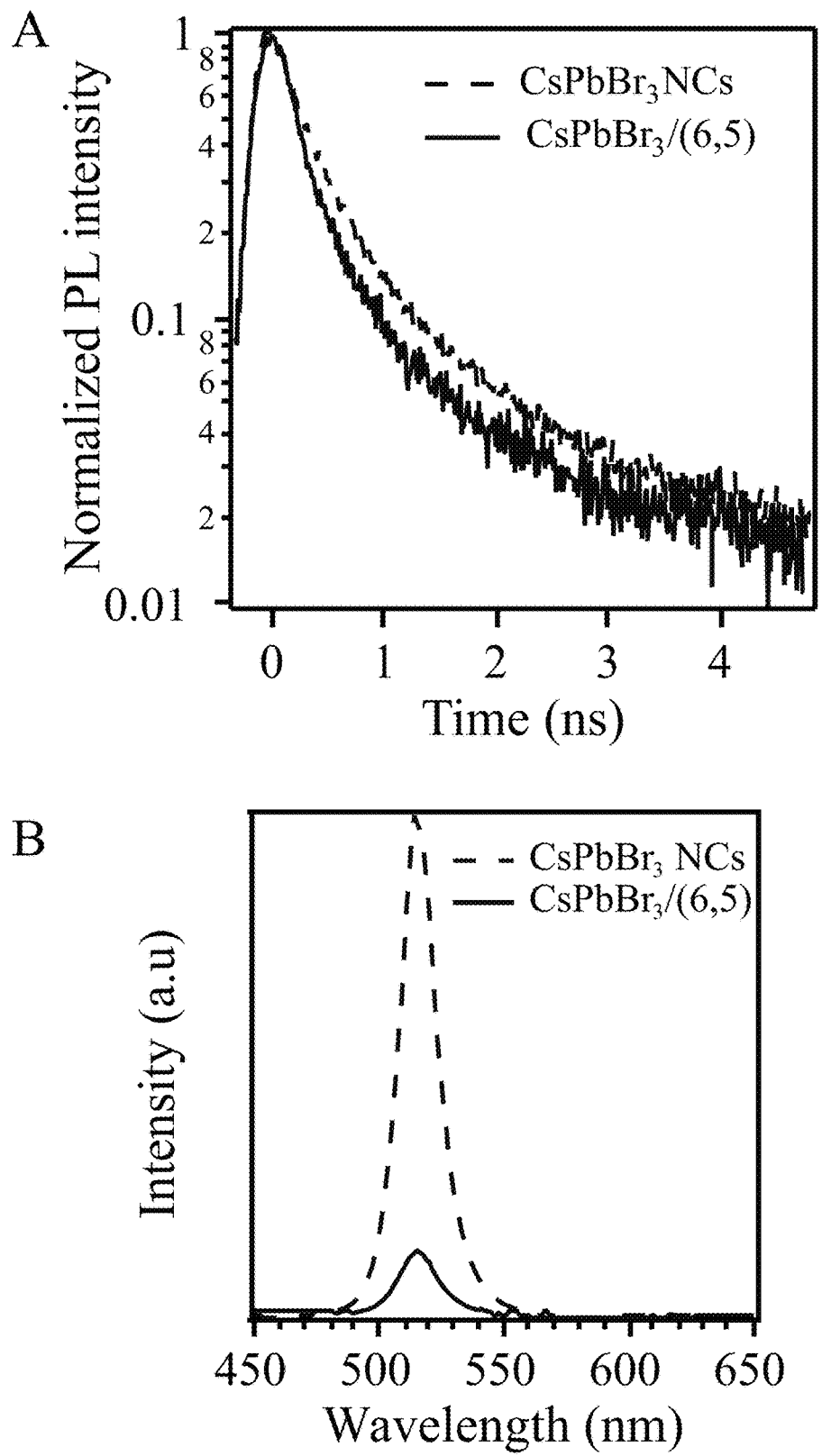
FIG. 10B illustrates (Panel A) time-resolved PL and (Panel B) steady-state spectra of $CsPbBr_3$ perovskite nanocrystals with (6,5) SWCNTs, according to some embodiments of the present disclosure.

FIG. 7B demonstrates that the photoluminescence (PL) of FAPbBr$_3$ NCs was strongly quenched by (6, 5) s-SWCNTs (see the inset of FIG. 7B), and the average PL lifetime was reduced from 4.65 ns in FAPbBr$_3$ NCs to 1.28 ns in the heterojunction. The strong quench is demonstrated by the PL peak intensity of FAPbBr$_3$ with (6,5) s-SWCNTs, which is much lower compared to the PL peak intensity of FAPbBr$_3$ NCs. Similar effects were observed for the heterojunctions constructed of (6, 5) SWCNTs/CsPbBr$_3$ and (6, 5) SWCNTs/CsPbI$_3$ (see FIGS. 10B and 10A, respectively). While these effects may indicate photoinduced energy or charge transfer (or both) from the perovskite NCs to (6,5) s-SWCNTs, complementary measurements (vide infra) demonstrate that photoinduced hole transfer is the dominant effect.

Figure 7C:
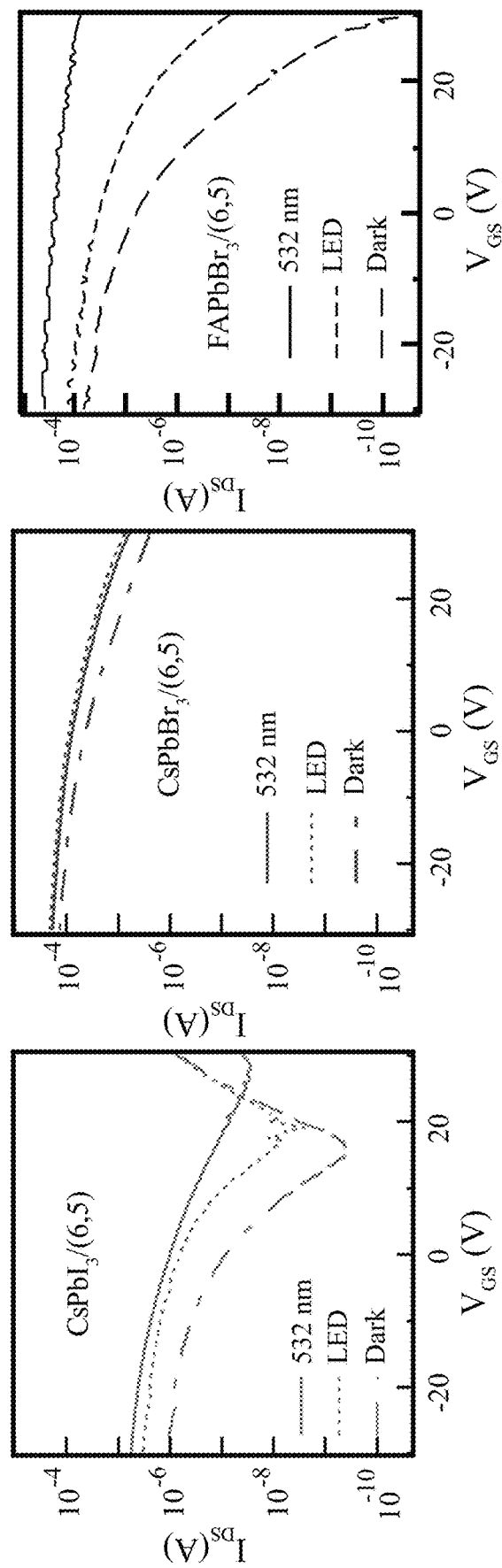
FIG. 7C illustrates FET transfer curves for $CsPbI_3$ NC/s-SWCNT, $CsPbBr_3$ NC/s-SWCNT, and $FAPbBr_3$ NC/s-SWCNT heterojunctions, according to some embodiments of the present disclosure. The long-dashed lines show the heterojunction FETs in the dark, the short-dashed line correspond to during illumination with a white-light LED, and the solid lines correspond to during continuous illumination with 532 nm laser (P=30.7 mW/cm², $V_{DS}$=3 V).

As shown herein, field-effect transistors (FETs) and phototransistors (see FIGS. 7C and 7D) provide an unambiguous route to identify charge transfer in the NC/SWCNT heterojunctions. FIG. 7C shows the characteristic transfer curves ($I_{DS}$ Vs. $V_{GS}$) for FETs fabricated for the three types of heterojunctions, either in the dark or illuminated with white light (LED) or a 532 nm laser.

Figure 7D:
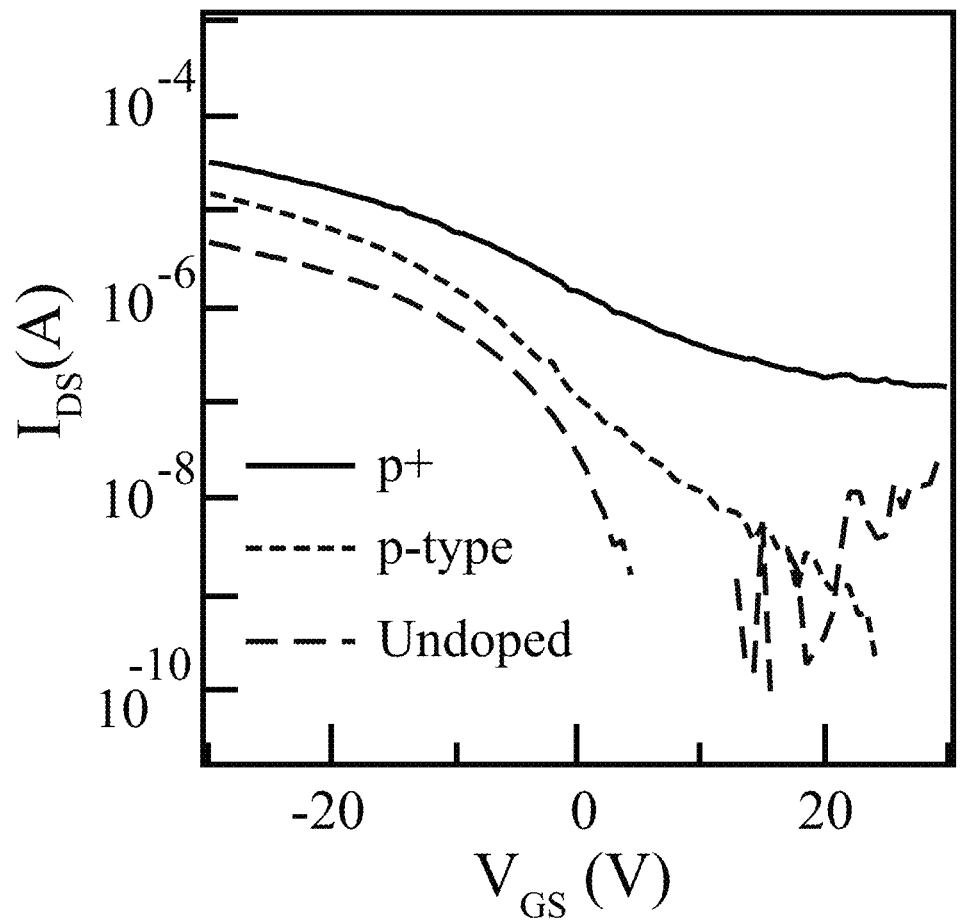
FIG. 7D illustrates FET transfer curves for neat (6,5) s-SWCNT thin films that are undoped, lightly doped p-type with a one-electron oxidant (triethyloxonium hexachloroantimonate or OA), or heavily doped with OA, according to some embodiments of the present disclosure. All transfer curves, measured in the dark, $V_{DS}$=3V.
Figure 11:
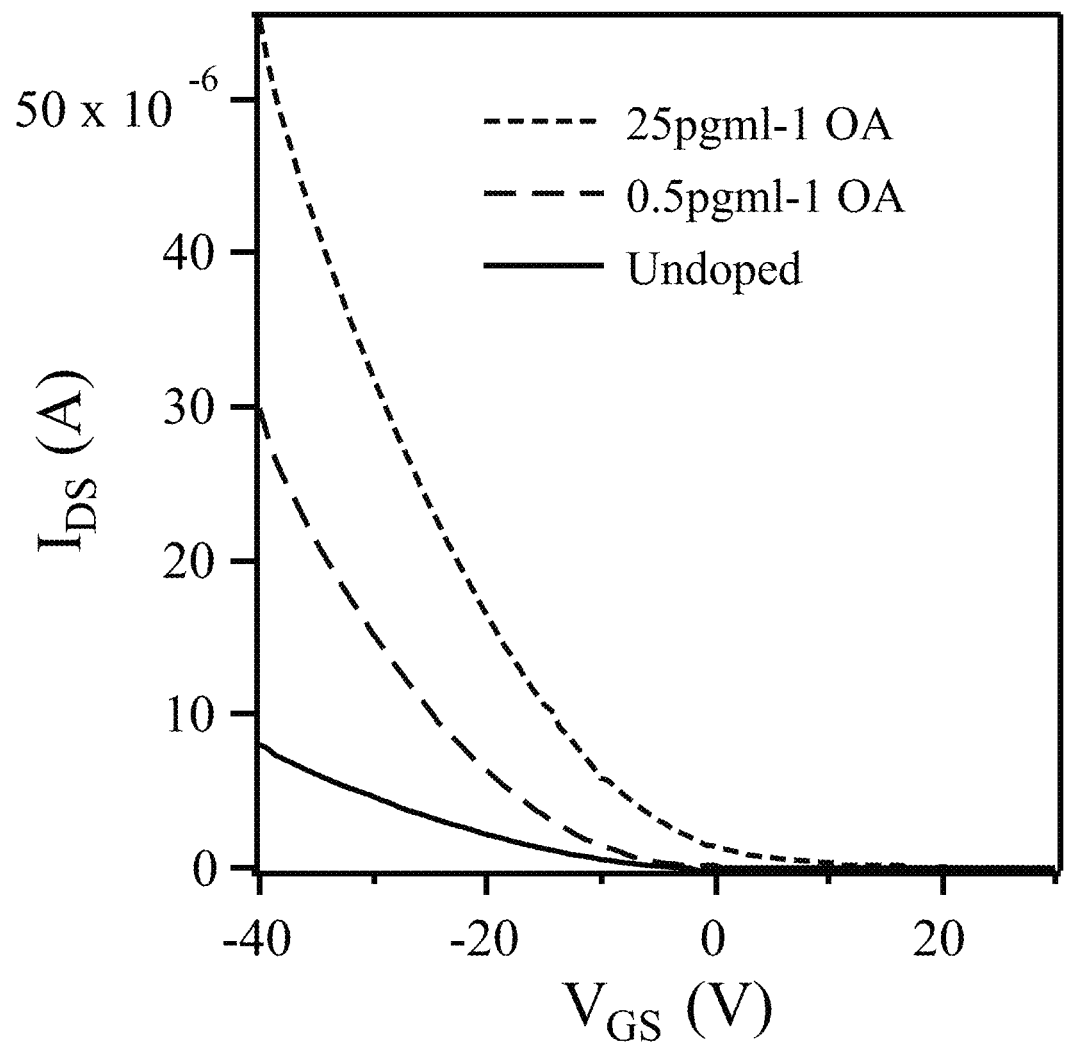
FIG. 11 illustrates $I_{DS}$ vs. $V_{GS}$ transfer characteristics of (6,5) SWCNT device doped by three different concentrations of one-electron oxidant (triethyloxonium hexachloroantimonate (OA)), according to some embodiments of the present disclosure. Transfer curves of the pristine SWCNTs (i.e., undoped), 0.5 pg/mL OA-doped SWCNTs and 25 pg/mL OA-doped SWCNTs. The calculated hole carrier motilities are separately 0.118, 0.442, and 0.755 $cm^2V^{-1}s^{-1}$ at 0, 0.5, 25 pg/mL concentrations of OA solutions. With progressive doping, the threshold voltage of the (6, 5) s-SWCNT FET transfer curve shifts to more positive voltages and the off-current increases, as expected for a larger ground-state density of holes.

FIG. 7C illustrates that the threshold voltages of all dark heterojunction FETs were shifted to higher positive voltages than an undoped SWCNT FET (see FIG. 7D and FIG. 11). A comparison to intentionally doped SWCNT FETs (see FIG. 7D) confirms that the ground-state charge transfer inferred from absorption measurements (see FIG. 7A) is a net transfer of holes from perovskite NCs to produce p-type SWCNT FET channels (an SWCNT channel is the layer 120 between electrodes 140 and 150 in FIG. 1). Illumination increased the channel currents ($I_{DS}$) for all heterojunction FETs due to the generation of photocurrent ($I_{ph}=I_{light}-I_{dark}$ where $I_{light}$ and $I_{dark}$ are the source-drain currents under illumination and in dark, respectively) and shifted the threshold voltages to higher positive voltages. It is important to note here that DC mobility in the s-SWCNT network (>1 cm$^2$/Vs) was at least four orders of magnitude larger than that of the NC array (ca. 10$^{-5}$ cm$^2$/Vs), so the dominant source of both dark current and photocurrent in these heterojunction (photo)transistors were the s-SWCNT network. With this in mind, the large photocurrents and concomitant shifts of the threshold voltages upon illumination unambiguously demonstrate that photogenerated holes were injected into (6, 5) s-SWCNT channels of the charge separating layer 120 from perovskite NCs of the perovskite layer 130.

Figure 7E:
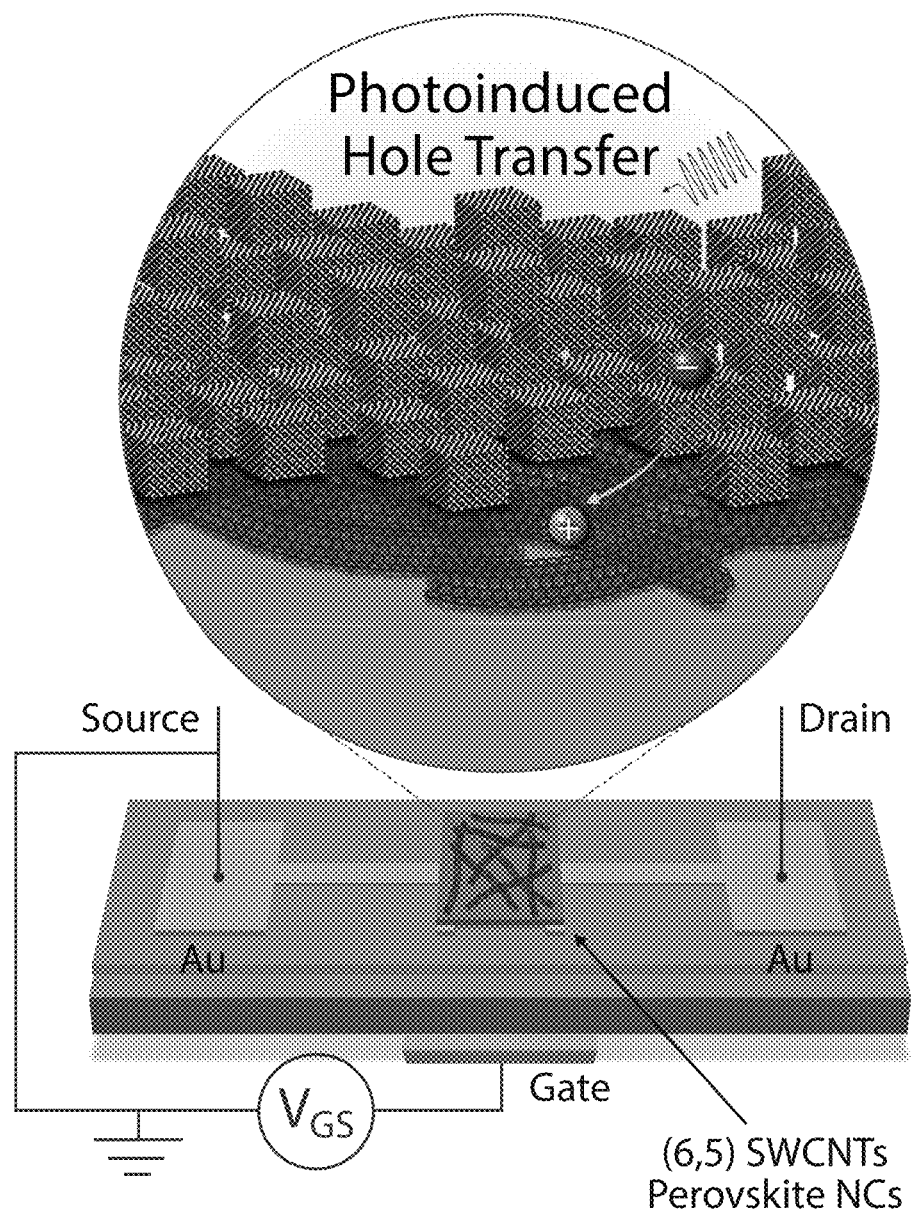
FIG. 7E illustrates a schematic of the FET setup used in the experiments represented in FIGS. 7A-7D, according to some embodiments of the present disclosure. The blow-up highlights a schematic of the NC/s-SWCNT interface and the photoinduced hole transfer event that occurs at this interface to drive the photocurrent observed in phototransistors.

FIG. 7E schematically depicts the excited-state charge transfer realized in the heterojunction phototransistors. Photoinduced electron-hole pairs are first generated in the perovskite NC layer 130 under illumination. Due to the driving force for photoinduced charge transfer at the NC-SWCNT junction (i.e., the interface between the charge separating layer 120 and the perovskite NC layer 130), holes are injected into (6,5) s-SWCNTs of the charge separating layer 130, thereby increasing the hole density in the s-SWCNT channel, i.e., the area between electrodes 140 and 150 in FIG. 1. Lateral hole transport between source and drain electrodes under the applied bias then contributes to the observed $I_{ph}$, while a large photoinduced field (large arrow) is generated in the direction perpendicular to the source-drain channel direction. This photoinduced field has important consequences for the realization of ion migration and PPC (vide infra).

Figure 12A:
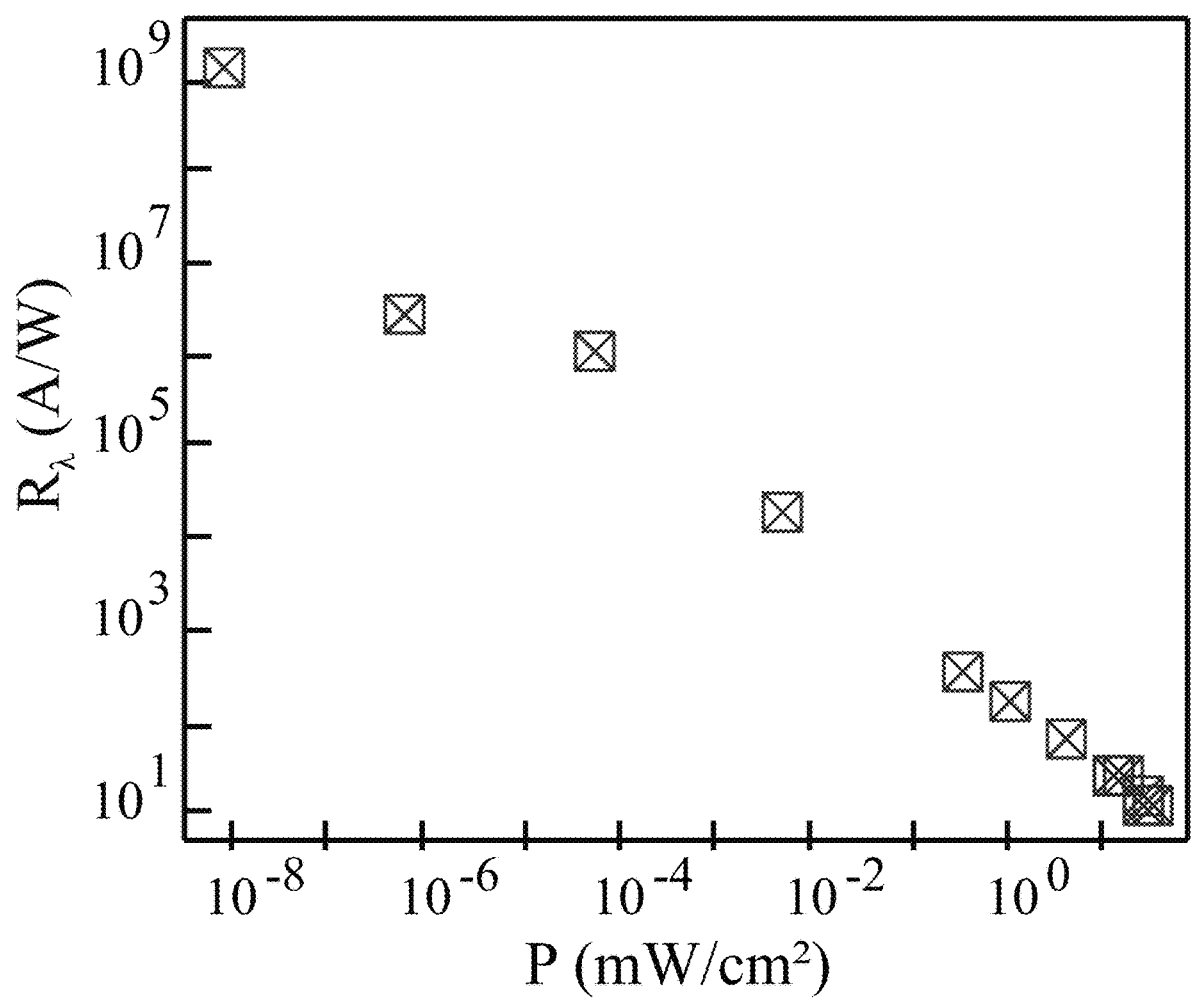
FIG. 12A illustrates photoresponsivity ($R_y$) as a function of incident 405 nm (continuous excitation) fluence with $V_{GS}$=−40V, $V_{DS}$=3V for a$FAPbBr_3$NC/SWCNT heterojunction, according to some embodiments of the present disclosure.

Using the FAPbBr$_3$ heterojunction as an example, FIG. 12A demonstrates that the NC/SWCNT phototransistors can realize an exceptionally high photo-response over many orders of magnitude for the incident photon fluence. The phototransistor responsivity (R) is expressed as $$R=I_{ph}/(P\times A) \qquad \text{Equation 1}$$

where P is the incident light power and A is the channel area. The responsivity of the device of FIG. 12A increased with decreasing photon fluence and reached 1.1×10$^9$ A/W at a fluence of 10$^{-8}$ mW/cm$^2$. This photoresponsivity is in line with some of the highest values achieved for heterojunction phototransistors utilizing high-mobility channels such as graphene and monolayer MoS$_2$. The external quantum efficiency (EQE) is expressed as $$EQE = \frac{I_{ph}/e}{P/h\nu} = R\frac{hc}{e\lambda} \qquad \text{Equation 2}$$

where h is Planck's constant, c represents the speed of light, and is the light wavelength. EQE values for the FAPbBr$_3$/(6,5) device in FIG. 12A, measured at $V_{DS}$=3 V, $V_{GS}$=40 V and an excitation wavelength of 532 nm, exceeds 10$^5$% at fluence values below 10 mW/cm². A full comparison and discussion of the phototransistor performance metrics for all heterojunctions is shown in FIGS. 13A-13H.

Figure 12B:
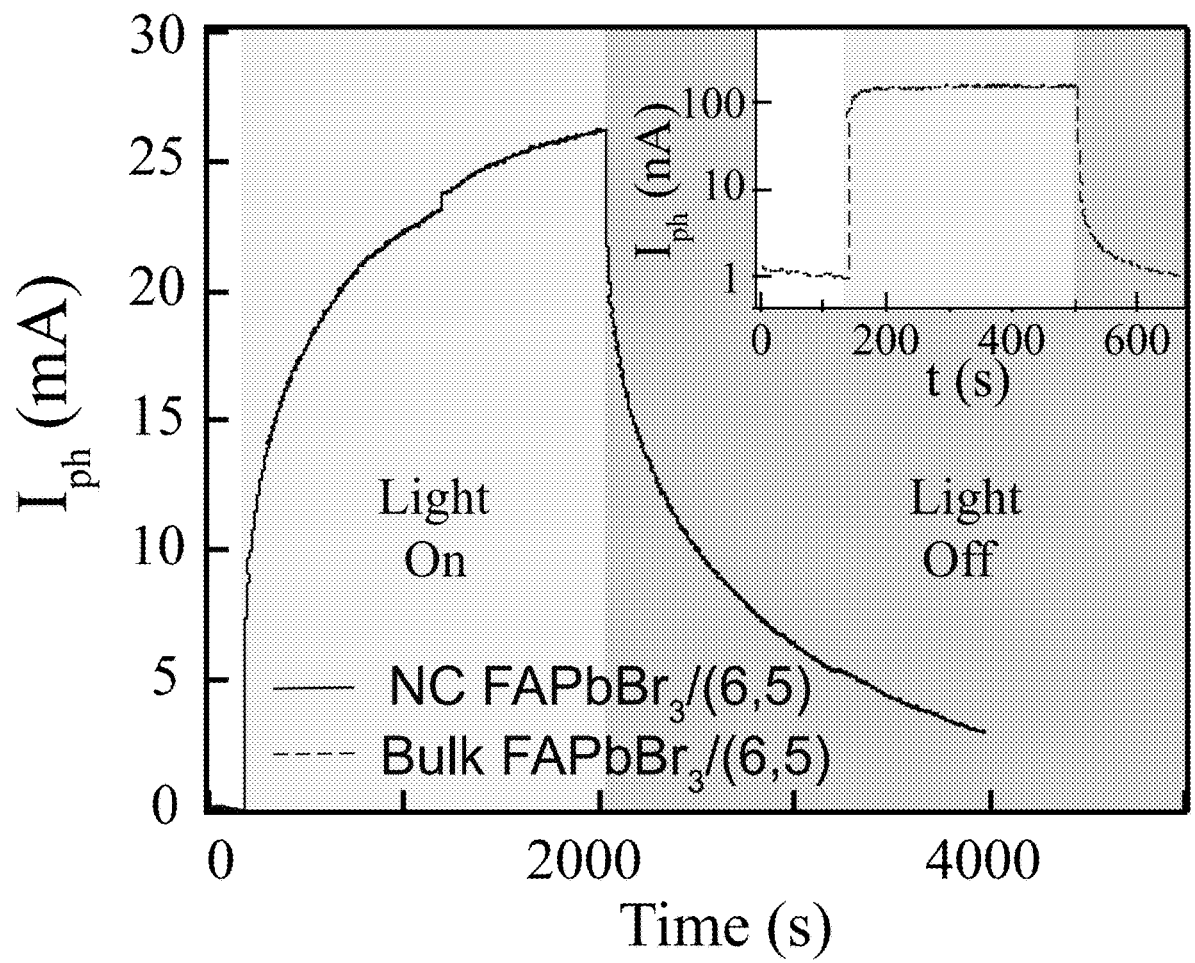
FIG. 12B illustrates photocurrent as a function of time, with $V_{GS}$=0V and $V_{DS}$=3V and photoexcitation using a 405 nm laser for a FAPbBr3 NC/SWCNT heterojunction, according to some embodiments of the present disclosure. The inset shows the same experiment performed on a bulk FAPbBr3/(6,5) sample.
Figure 12C:
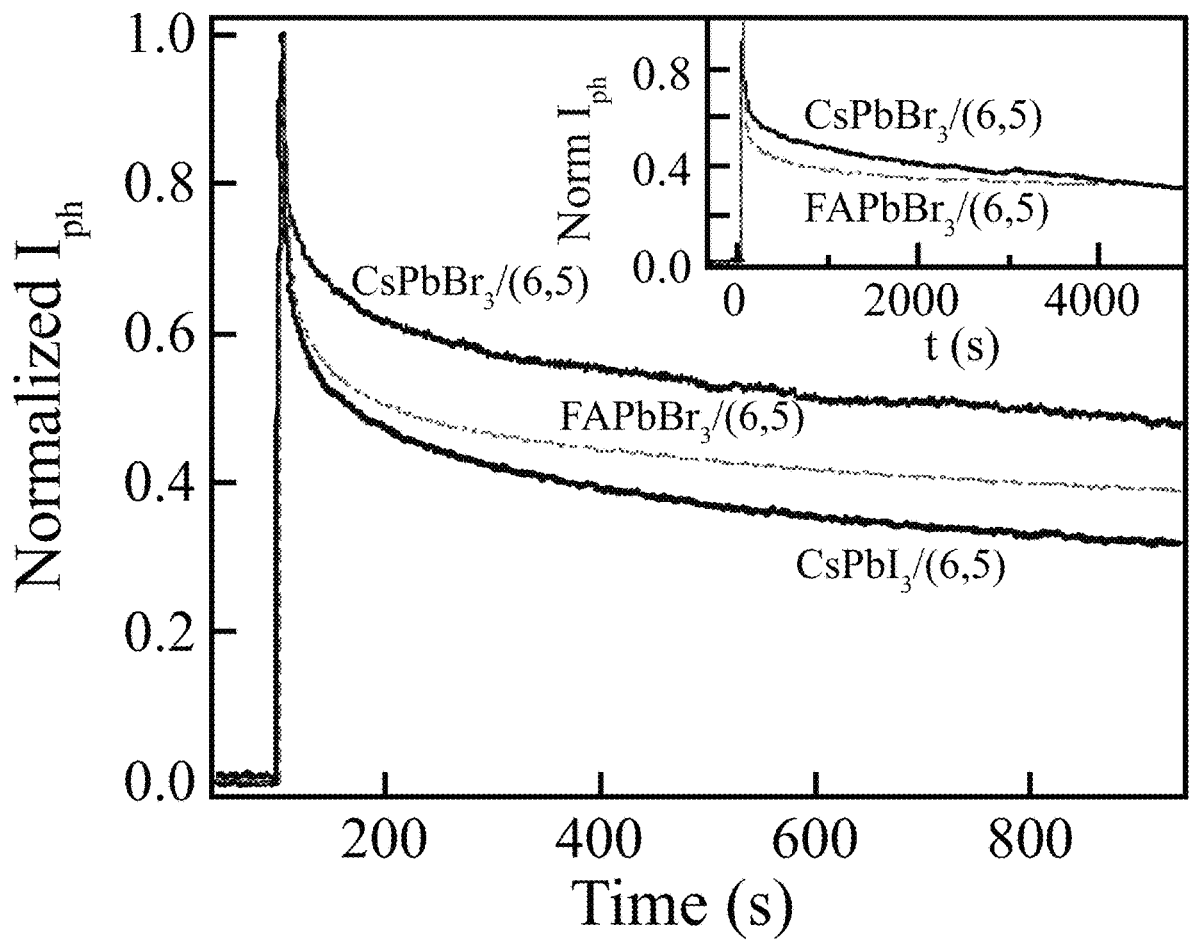
FIG. 12C illustrates curves resulting from the stimulation of PPC in the three NC/SWCNT bilayers of a $FAPbBr_3$ NC/SWCNT heterojunction with 5 seconds of a 405 nm light pulse, according to some embodiments of the present disclosure. The inset shows the $CsPbBr_3$/(6,5) bilayer photocurrent transient to 5000 seconds.
Figure 12D:
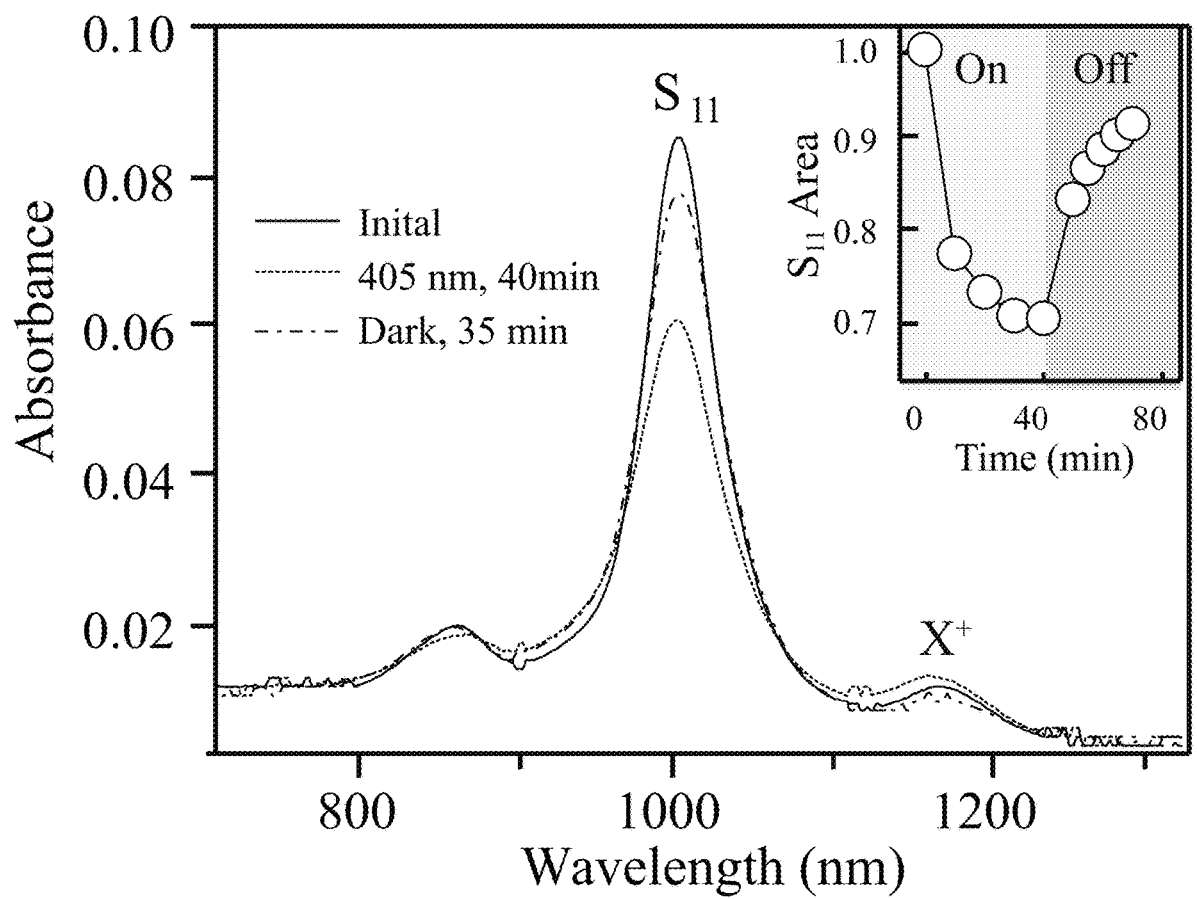
FIG. 12D illustrates time-dependent static absorption spectra in the near-IR region (highlighting changes to $S_{11}$ and $X^+$peaks) for an unilluminated FAPbBr3 NC/SWCNT heterojunction, after 40 minutes of continuous 405 nm illumination, and after the 405 nm illumination is ceased (after 40 minutes of illumination) for 35 minutes, according to some embodiments of the present disclosure. Inset shows the temporal changes to the s-SWCNT $S_{11}$ area during the continuous illumination phase and after the illumination is turned off.
Figure 12E:
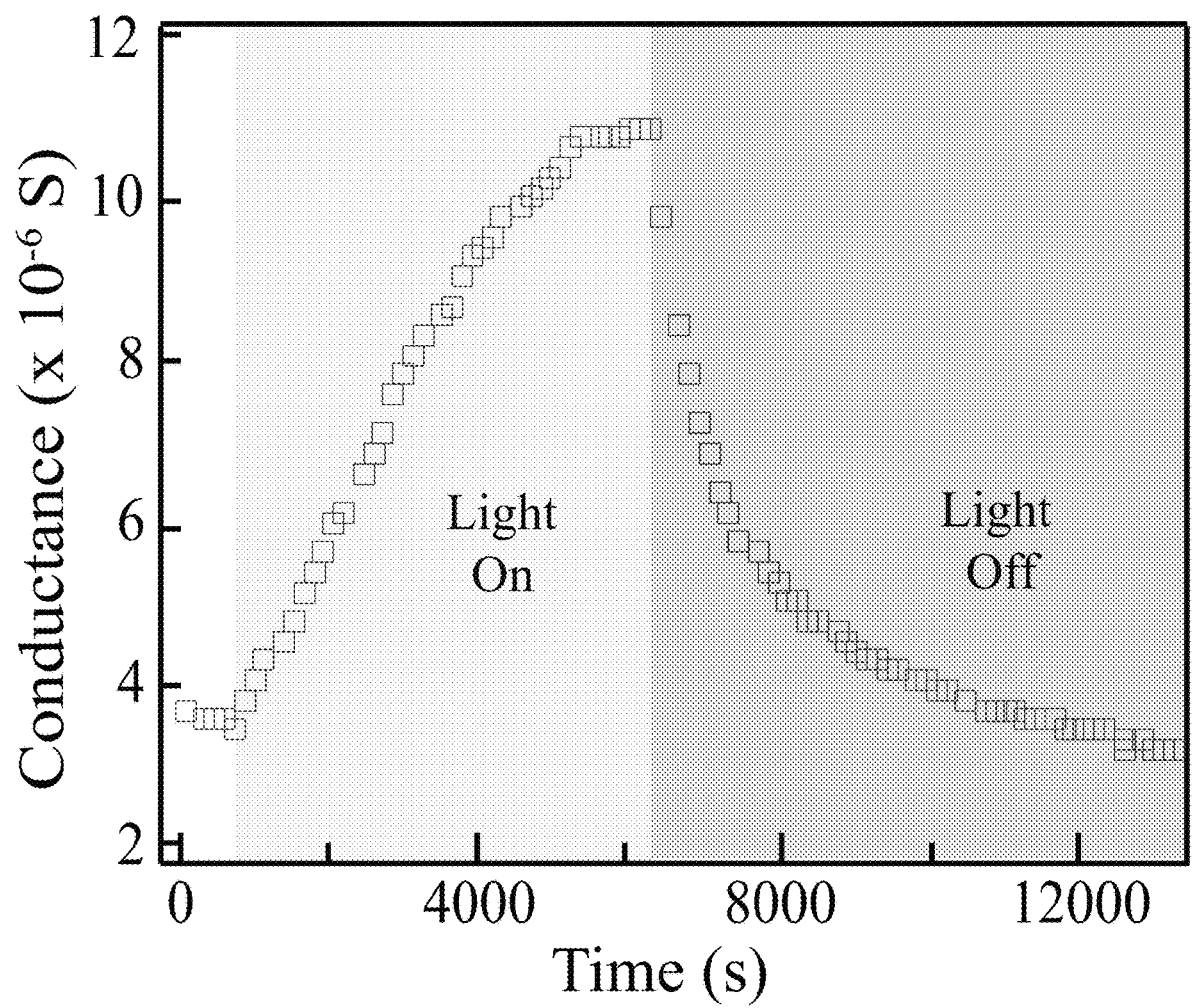
FIG. 12E illustrates slow growth of 9 GHz conductance in a $FAPbBr_3$ NC/SWCNT heterojunction during continuous illumination and slow decay after the 532 nm laser is turned off, according to some embodiments of the present disclosure.
Figure 12F:
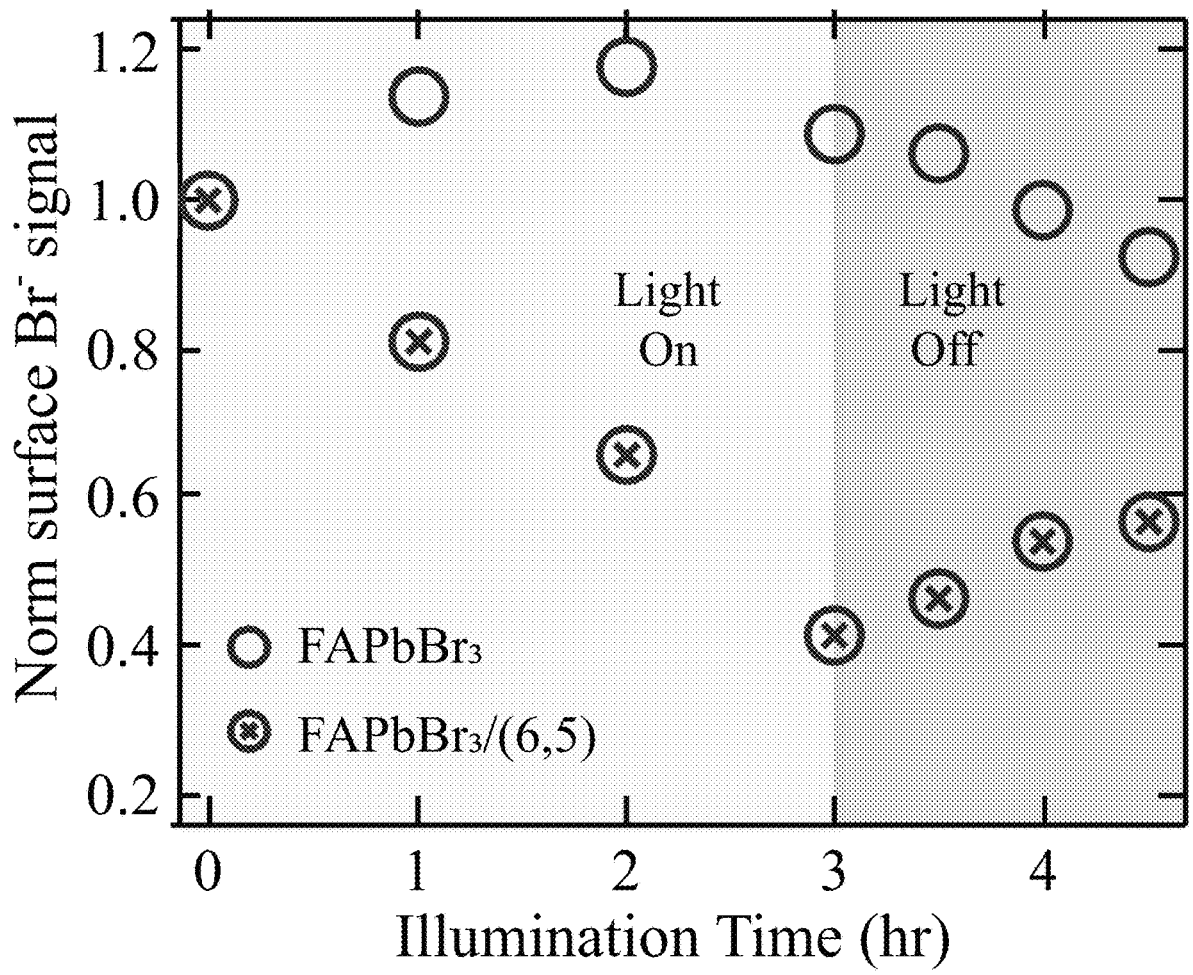
FIG. 12F illustrates the normalized surface bromine concentration, as measured by TOF-SIMS, for a FAPbBr3 NC array and $FAPbBr_3$/(6,5) heterojunction, as a function of continuous illumination with a 405 nm laser, according to some embodiments of the present disclosure.
Figure 13A:
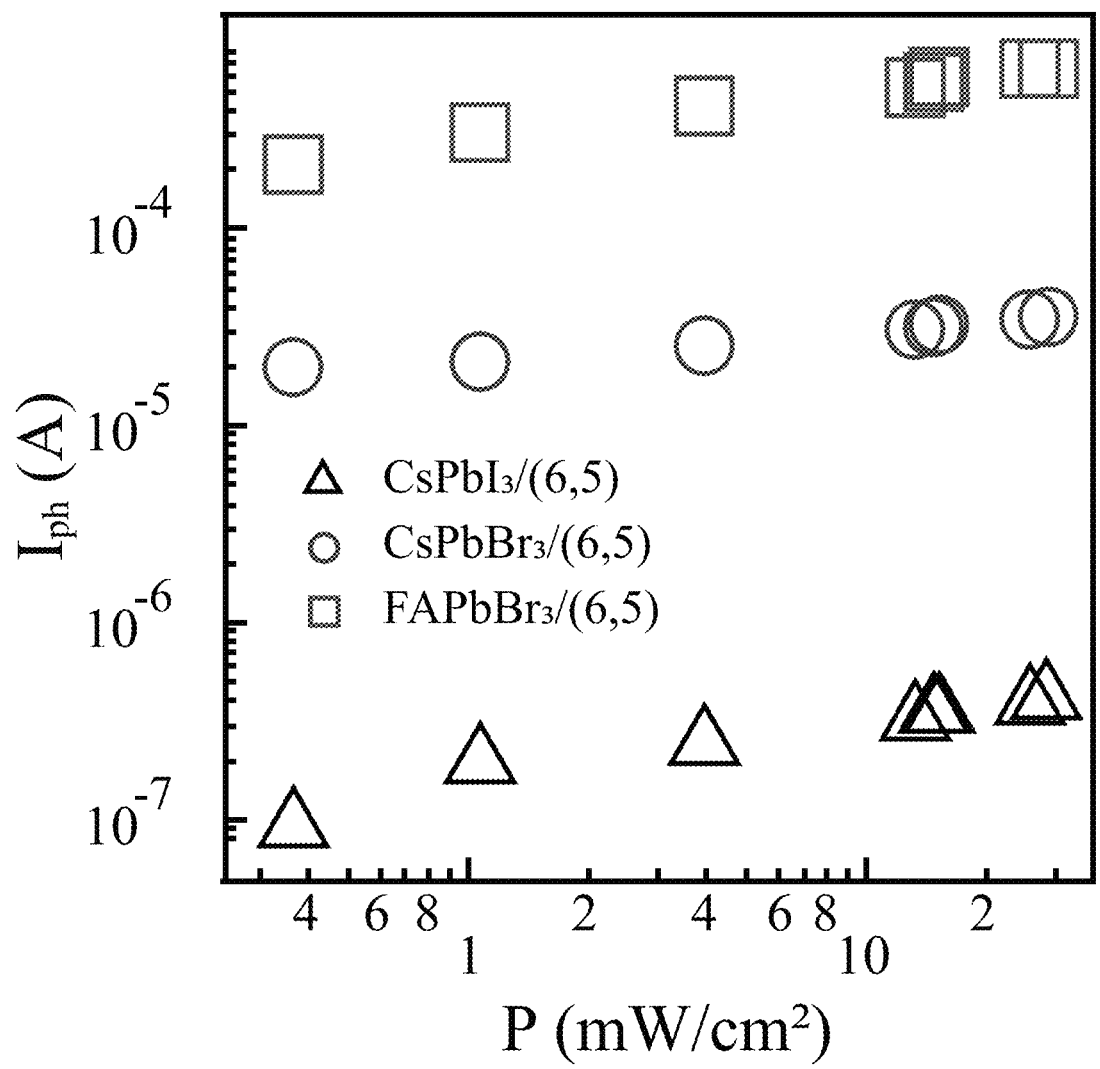
FIG. 13A illustrates photocurrent for heterojunction phototransistors as a function of power density at $V_{GS}$=0V, $V_{DS}$=3V, and excitation with a 532 nm laser, according to some embodiments of the present disclosure.
Figure 13B:
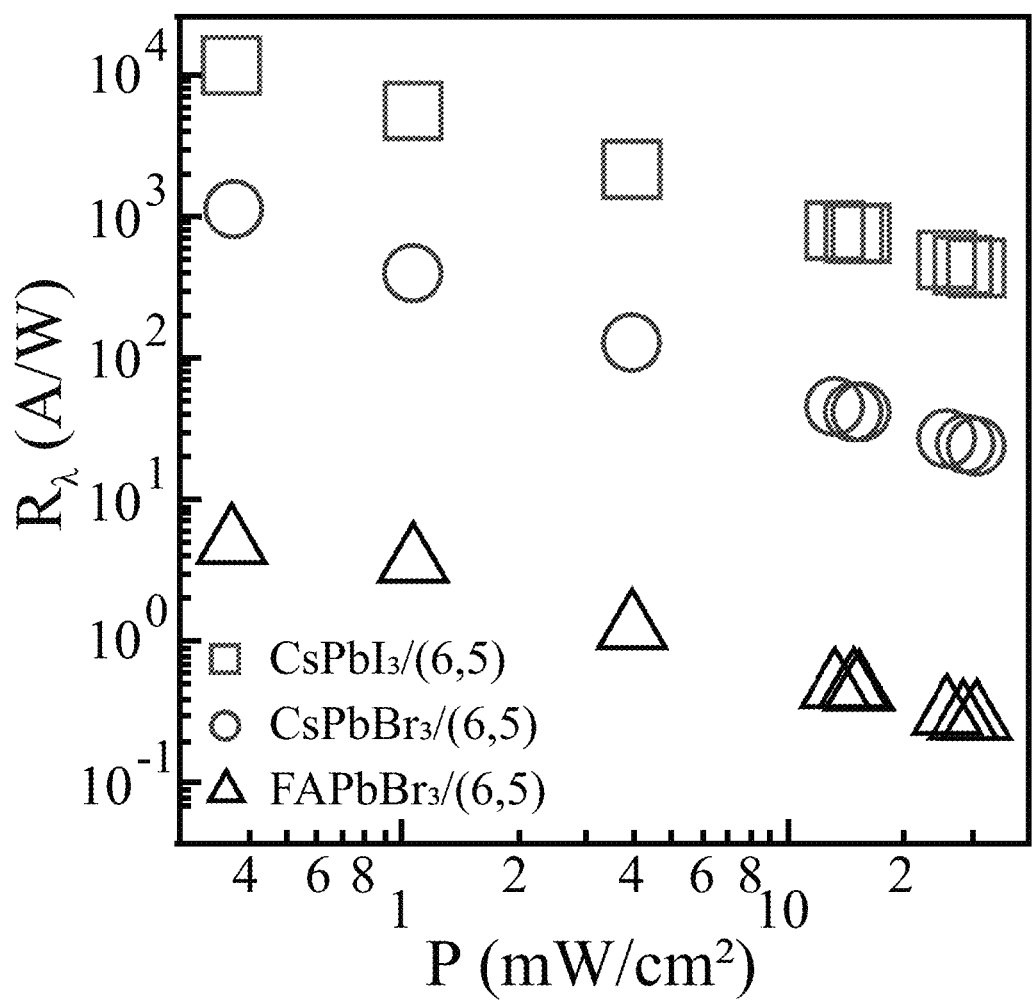
FIG. 13B illustrates responsivity for heterojunction phototransistors as a function of power density at $V_{GD}$=0V, $V_{DS}$=3V, and excitation with a 532 nm laser, according to some embodiments of the present disclosure.
Figure 13C:
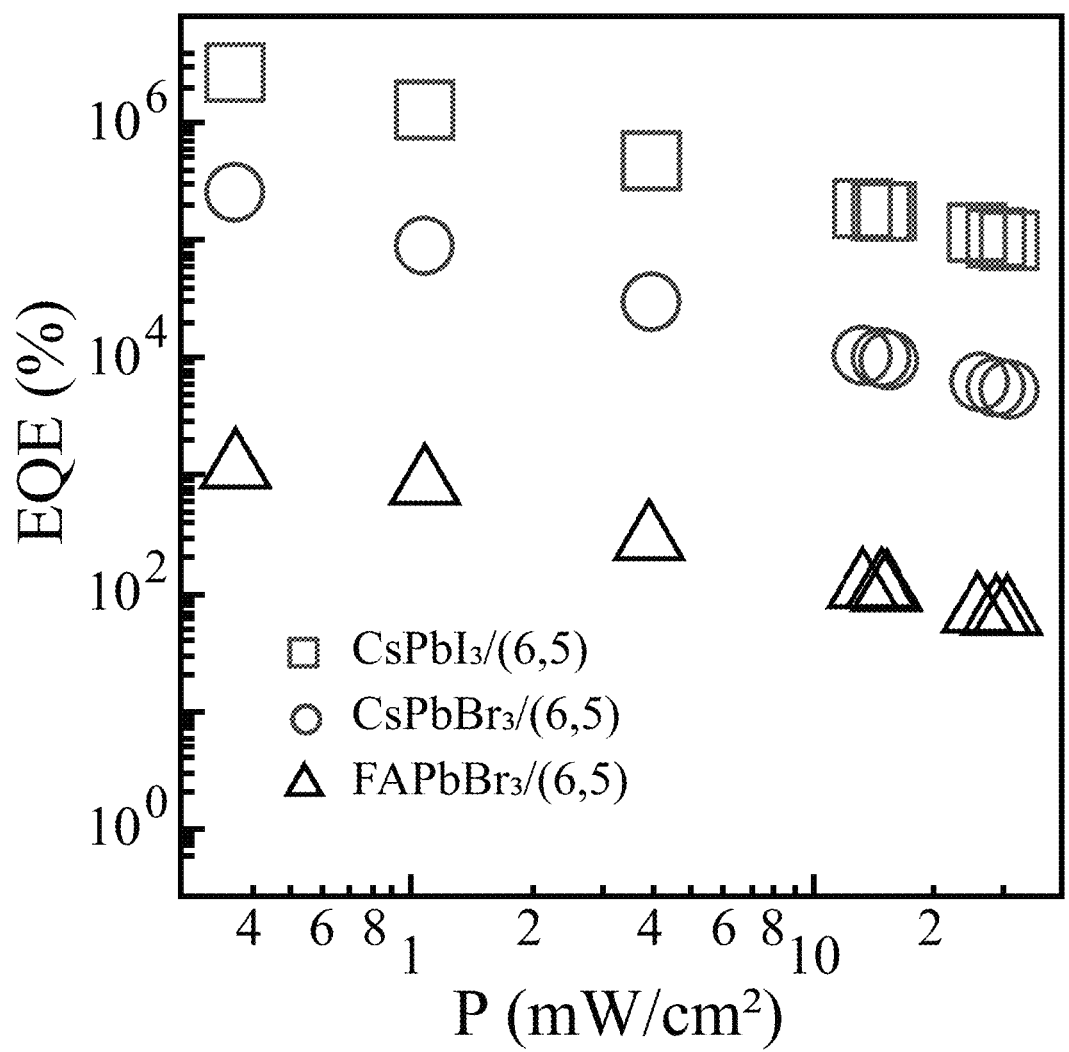
FIG. 13C illustrates external quantum efficiency for heterojunction phototransistors as a function of power density at $V_{GS}$=0V, $V_{DS}$=3V, and excitation with a 532 nm laser, according to some embodiments of the present disclosure.
Figure 13D:
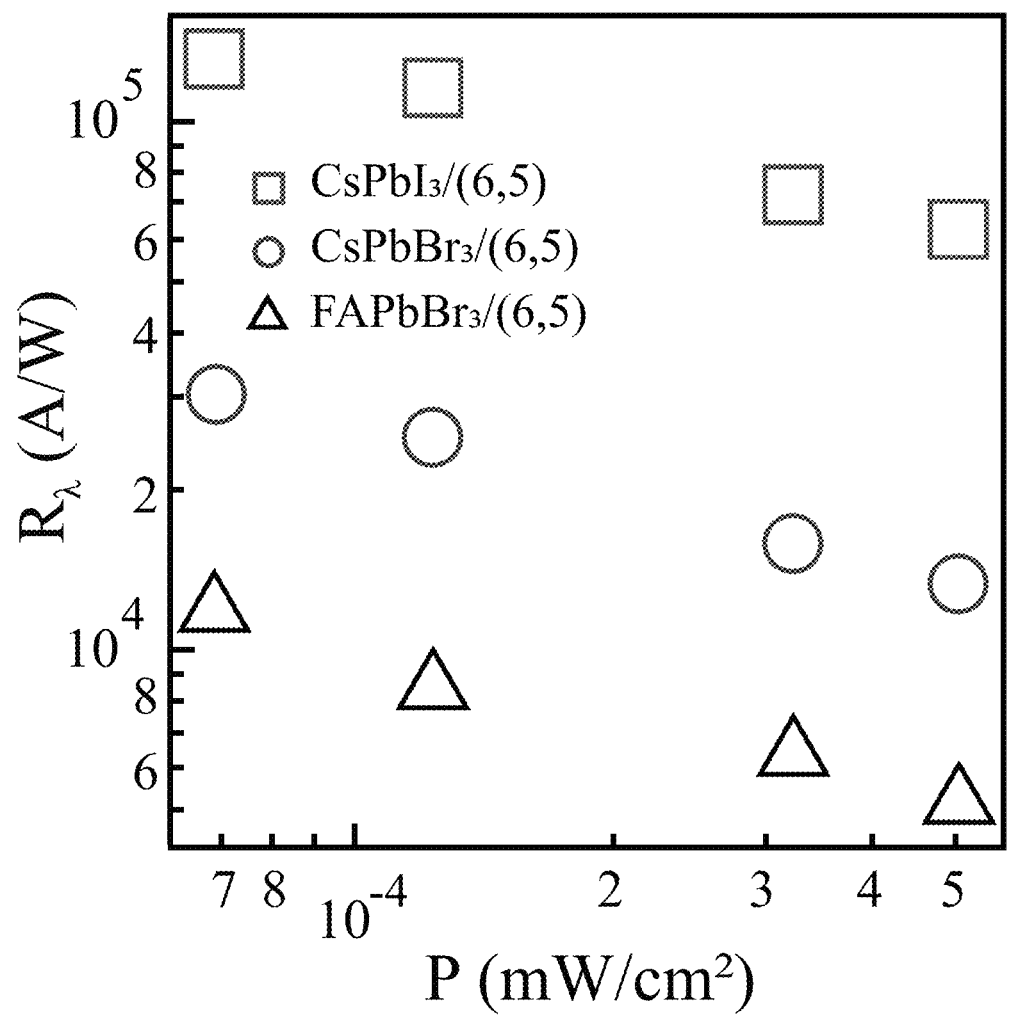
FIG. 13D illustrates responsivity for heterojunction phototransistors as a function of power density at a gate voltage $V_{GS}$=0V, source-drain bias $V_{DS}$=0.1V, and excitation with a 405 nm laser, according to some embodiments of the present disclosure.
Figure 13E:
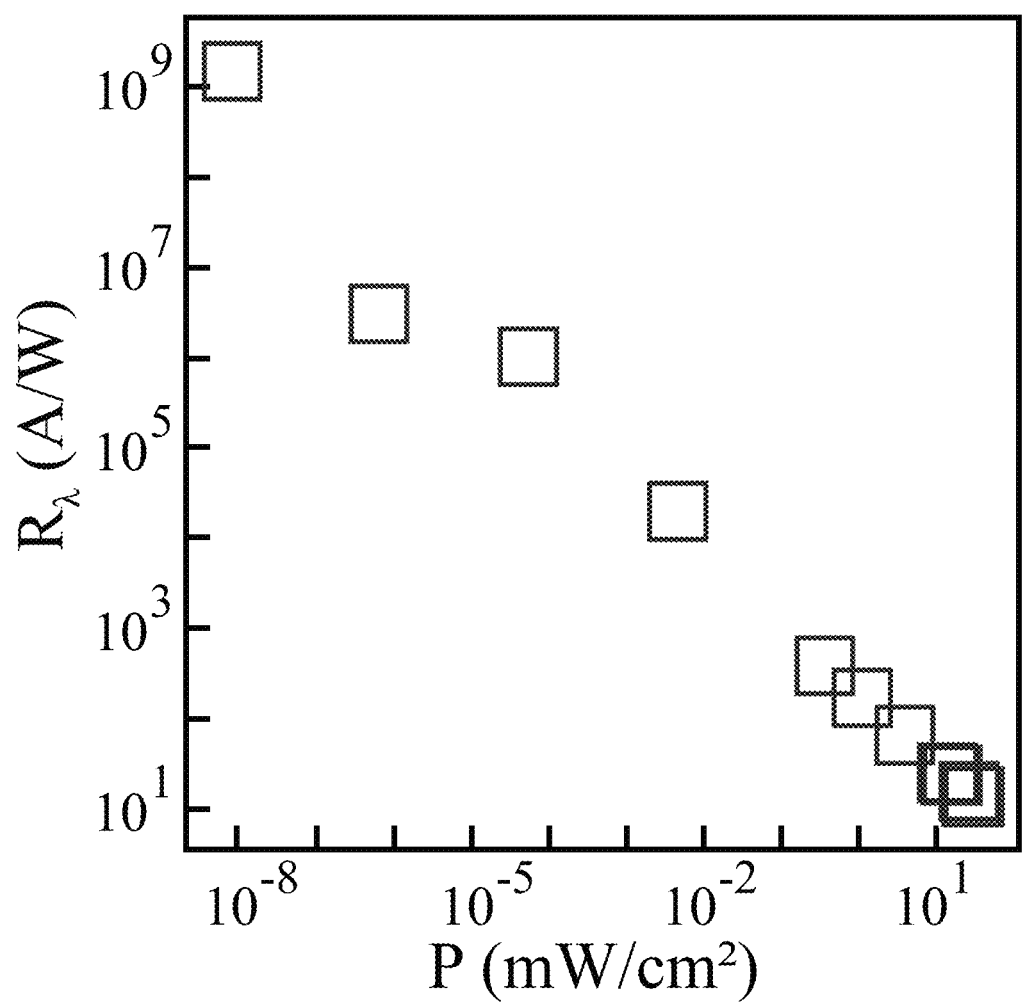
FIG. 13E illustrates responsivity for a $FAPbBr_3$/(6,5) heterojunction phototransistor as a function of power density at $V_{GS}$=0V, $V_{DS}$=3V, and excitation with a 405 nm laser, according to some embodiments of the present disclosure.
Figure 13F:
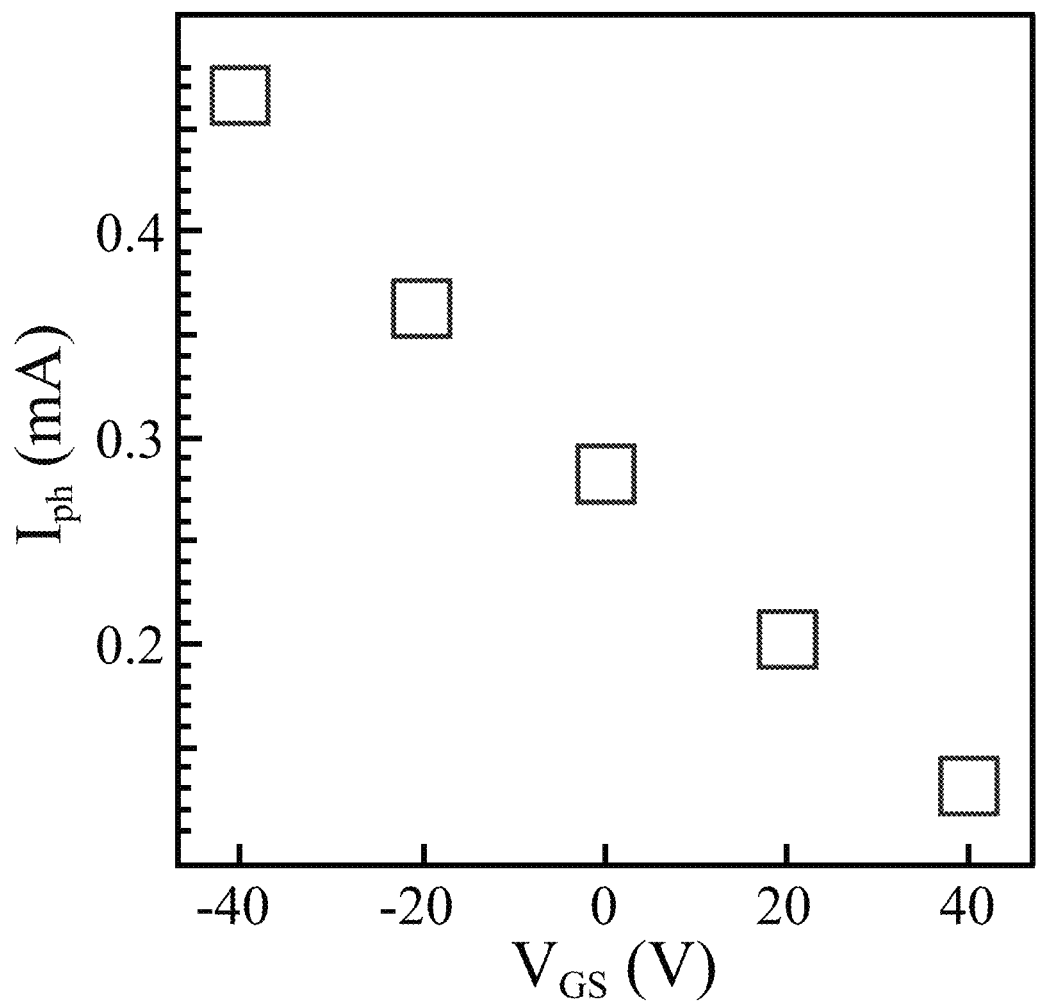
FIG. 13F illustrates photocurrent for a $FAPbBr_3$/(6,5) heterojunction phototransistor as a function of $V_{GS}$ for constant $V_{DS}$=3V and excitation with a 532 nm laser with a fluence of 30mW/cm², according to some embodiments of the present disclosure.
Figure 13G:
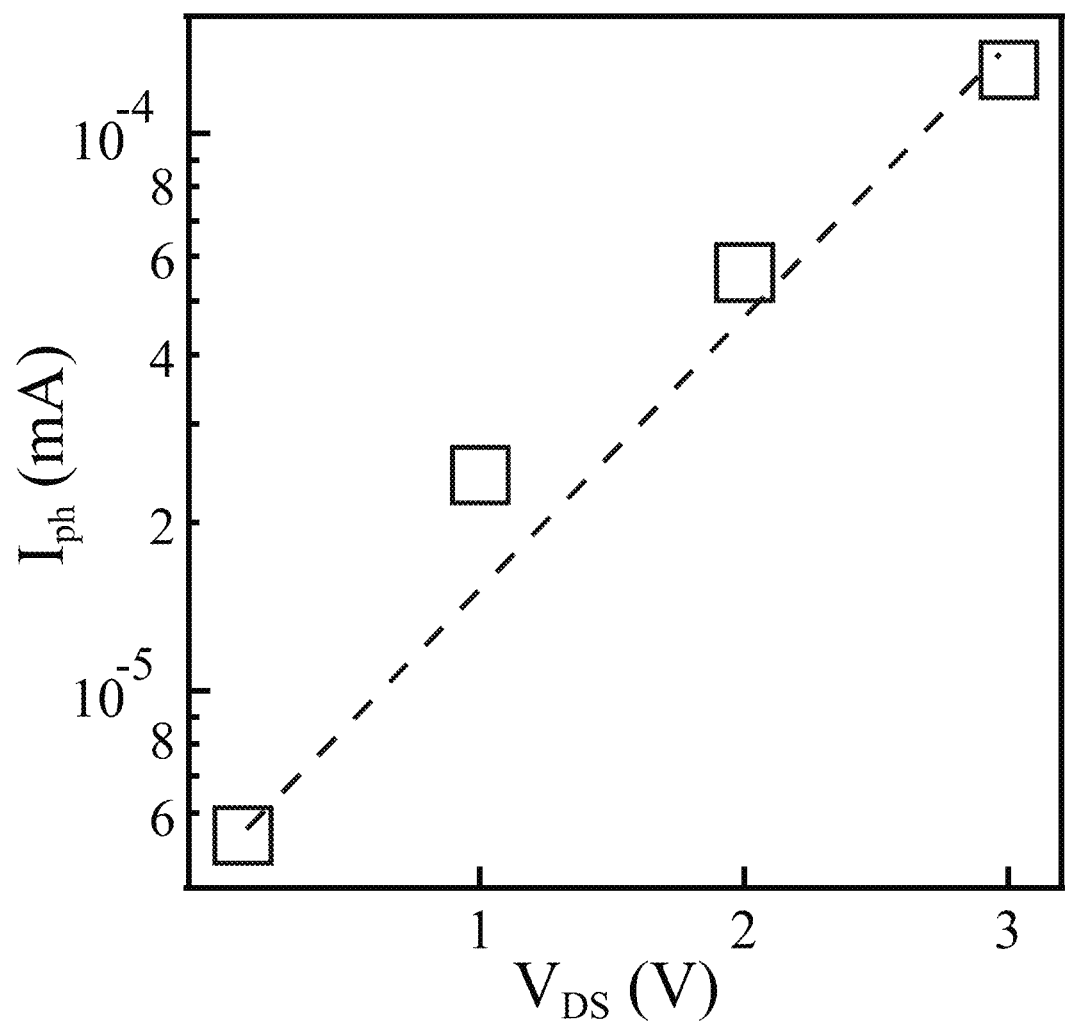
FIG. 13G illustrates photocurrent for a $FAPbBr_3$/(6,5) heterojunction phototransistor as a function of $V_{DS}$ for constant $V_{GS}$=0V and excitation with a 532 nm laser with a fluence of 30 mW/cm², according to some embodiments of the present disclosure.
Figure 13H:
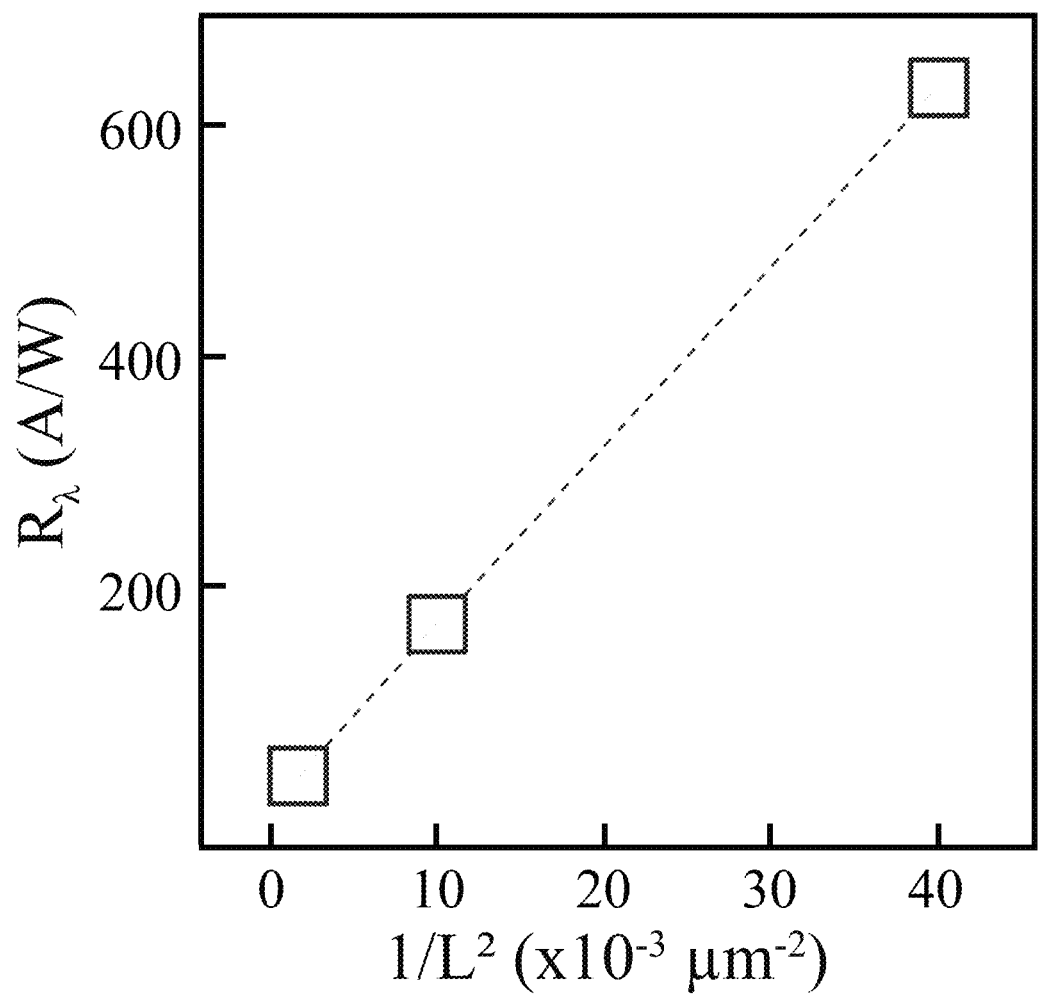
FIG. 13H illustrates responsivity for a FAPbBr$_3$/(6,5) heterojunction phototransistor as a function of 1/L$^2$, where L is the channel length, according to some embodiments of the present disclosure. V$_{GS}$=0V and V$_{DS}$=3V and 532 nm laser fluence 30 mW/cm$^2$.

While the impressive performance metrics of the NC/SWCNT heterojunction phototransistors reflect a high efficiency for the photoinduced hole transfer process shown in FIG. 7E, and FIG. 12B demonstrates that a slow transient process contributes significantly to the photocurrent. FIG. 12B shows the photocurrent switching performance of a FAPbBr$_3$/s-SWCNT heterojunction phototransistor when a 405 nm wavelength laser was used as the light source. Upon illumination with the blue laser (18 mW/cm²), the channel current ($I_{DS}$) increased up to $2.6 \times 10^{-5}$ A, corresponding to an on/off ratio ($I_{on}/I_{off}$) of $1 \times 10^3$. While a fraction of this $I_{ph}$ arose promptly (e.g. within 60 seconds), $I_{ph}$ generally grew in slowly over the course of thirty minutes. When the laser irradiation was turned off, $I_{DS}$ showed an initial decrease and then a slow recovery to the dark current, with full recovery not reached even after 30 minutes. Comparison of these slow kinetics to the fast kinetics observed for a heterojunction between (6,5) SWCNTs and bulk perovskite thin films (see inset of FIG. 14B) indicates that the perovskite nanocrystal absorber layer is important to realizing PPC in these heterojunctions. FIG. 12C demonstrates that this long-lived PPC response can also be optically stimulated in all three perovskite NC/SWCNT heterojunctions with short light pulses (e.g., 5 seconds), with photocurrent lasting well over an hour (see inset of FIG. 12C).

It is important to stress that the PPC effect illustrated in FIGS. 12A-12F do not rely upon the application of a gate voltage ($V_{GS}=0V$) and was achieved with a very small source-drain bias ($V_{DS}=0.1V$). This contrasts strongly with commonly reported PPC phenomena that arise from substrate-induced charge trapping. In these systems, photocurrent at $V_{GS}=0V$ is short-lived, whereas application of a gate voltage leads to longer-lived photocurrent due to the trapping of charge carriers at the substrate-channel interface. This stochastic effect is agnostic to the identity of the channel material and importantly reduces the energy efficiency of any neuromorphic operations due to the need for maintaining large resting voltages. The exceptionally long lifetimes observed here at $V_{GS}=0V$ implies that the PPC observed in the examples described herein are due to the perovskite NC/SWCNT heterojunction (i.e., perovskite NC layer 130/charge separating layer 120 heterojunction).

To confirm the nature of PPC in these heterojunctions, complementary measurements were performed on transparent quartz substrates with no electrodes. First, the time-dependent static absorption spectrum was tracked of the s-SWCNT charge separating layer 120 within a continuously illuminated (405 nm) FAPbBr$_3$ perovskite NC layer 130/s-SWCNT charge separating layer 120 heterojunction (see FIG. 12D). If charge traps in the SiO$_2$ dielectric layer (i.e. insulating layer 110) contribute to the transient photo-response, this would imply a slow increase in the mobility of carriers in the s-SWCNT channel during illumination and/or a slow trap-limited recombination pathway for carriers localized at oxide defect sites after turning the laser off. Under illumination, the $S_{11}$ peak of the (6,5) s-SWCNTs was slowly quenched and the trion peak $X^+$ continuously grew in. The $S_{11}$ and $X^+$ then slowly recovered when the laser was turned off. Since the $S_{11}$ bleach and $X^+$ induced absorption both correlate to the density of charge carriers in the s-SWCNTs and do not reflect the carrier mobility, this experiment confirms that the photoinduced hole density increases within the SWCNT layer during continuous illumination and these holes then slowly recombine with electrons when illumination is halted. Similar results were also found in separate studies of CsPbI$_3$ and CsPbBr$_3$ NC/SWCNT heterojunctions (see FIGS. 16, 17, and 18A-18C).

Second, because chemical reactions can occur between noble metal electrodes and lead halide perovskites, one can envision that charge injection barriers at these gold electrodes may dynamically change. To rule out any effects of the electrodes, the conductance of identically prepared FAPbBr$_3$ NC/SWCNT heterojunctions with contactless microwave conductivity measurements were made (see FIG. 12E). Here, changes in the dark conductance of the sample were probed by a microwave field at 9 GHz as the heterojunction was illuminated continuously at 500 nm. The measured microwave attenuation was proportional to the conductance of the sample and the time-dependent dark conductance was extracted by numerical simulation of the microwave cavity resonance. Upon illumination, the sample conductance slowly increased over the course of ca. 5000 seconds (about 1.5 hours). When the laser was turned off, the conductance then slowly decayed over another 1.5 hours. Since this contactless measurement utilized a quartz substrate, this result demonstrates that the observed slow transient photo-response is a property of the NC/SWCNT heterojunction that is not influenced by the gold electrodes. In addition, such changes in conductance were exclusively observed for NC/SWCNT heterojunctions. In contrast, the conductance of a layer of FAPbBr$_3$ NC not in contact with a layer of s-SWCNTs showed no light-induced conductance changes.

Figure 19:
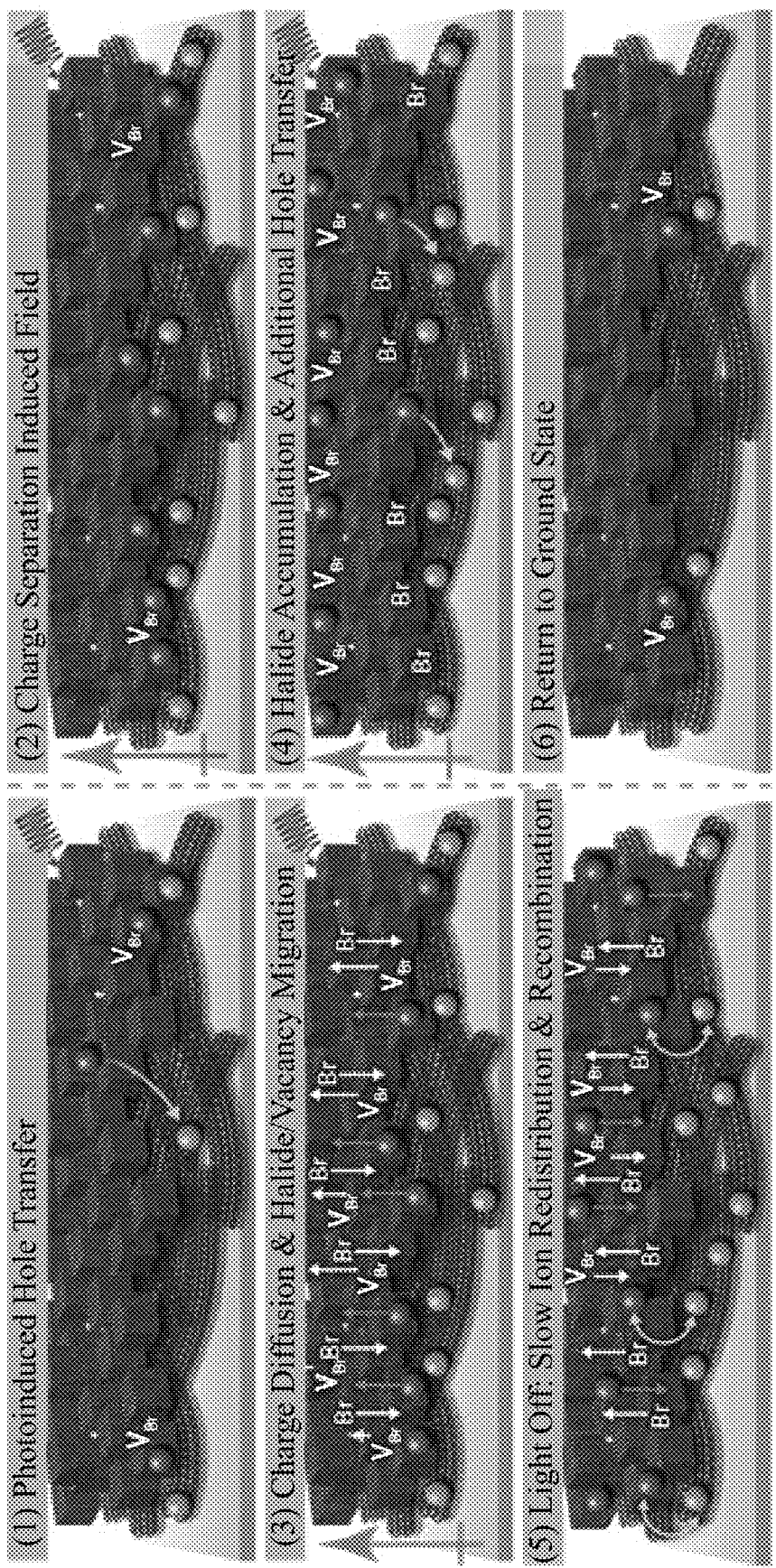
FIG. 19 illustrates a schematic of mechanism for prompt photocurrent and persistent photoconductivity, according to some embodiments of the present disclosure. (1) Ground-state hole transfer from NCs to SWCNTs leads to bromine vacancy (V$_{Br}$) accumulation at interface before photoexcitation. Photoexcitation leads to excited-state hole transfer from NCs to SWCNTs, whereby (2) the separated electrons and holes induce an out-of-plane electric field. (3) This photogenerated field serves to migrate V$_{Br}$ and electrons away from the interface, generating a Br-rich interface and vacancy-rich surface of the NC array. (4) Accumulation of halide ions at the interface induces additional hole transfer that appears as delayed photocurrent. (5) Once the light is turned off and some portion of charges recombine promptly, the large photogenerated electric field is removed. The much slower process of coupled charge and ion diffusion (that is not field-assisted) then (6) returns the system to the ground state.

The time scales of the slow $I_{ph}$ growth and decay are consistent with ion migration induced poling in lead halide perovskites, so it may be hypothesized that in addition to a prompt photo-response, the heterojunctions also capitalize upon a dynamic ionic contribution. To elucidate the role of ion migration in the transient response of the NC/SWCNT heterojunctions, ion movement was chemically probed using time-of-flight secondary ion mass spectrometry (ToF-SIMS) to explain the observed PPC. In this experiment (see FIG. 12F), the time-dependent surface concentration of bromine in a FAPbBr$_3$ NC/SWCNT heterojunction was measured after different illumination time with a 405 nm laser (5 mW). The bromine surface concentration in the heterojunction gradually decreased during 405 nm laser illumination. This behavior contrasts strongly with the control sample, a FAPbBr$_3$ NC array that was not in contact with (6,5) s-SWCNTs, where the bromine surface concentration did not decrease in response to continuous illumination. When the illumination was turned off, the bromine surface concentration slowly recovered. These results provide strong evidence that the slow transient photo-response is coupled to a similar transient response in the ion distribution within the perovskite NC array. The observed response is consistent with a field-induced net migration of bromide anions toward the positively charged s-SWCNT channel, which is equivalent to the migration of bromide vacancies away from the s-SWCNT channel where they accumulate at the surface of the NC array. The detailed proposed mechanism is illustrated in FIG. 19 and discussed below.

Figure 14A:
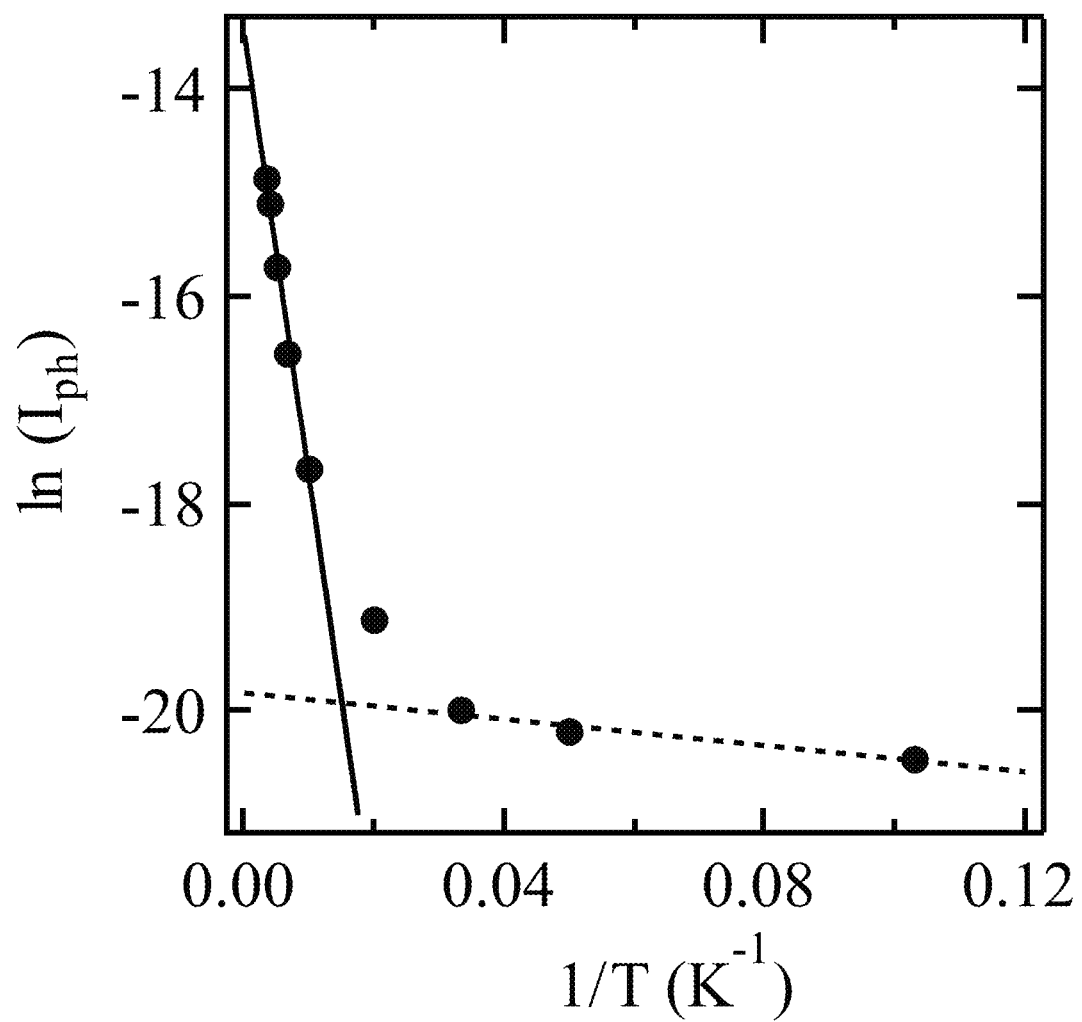
FIG. 14A illustrates temperature-dependent photocurrent for a photoexcited CsPbBr3/(6,5) heterojunction, photoexcited at 405 nm for 5 seconds with a fluence of 18 mW/cm$^2$, according to some embodiments of the present disclosure. V$_{GS}$=0V, V$_{DS}$=0.1V. Corresponding photocurrent activation energies, Arrhenius fits, are 3.6 kJ/mol and 0.053 kJ/mol, for the solid versus dashed lines, respectively.
Figure 14B:
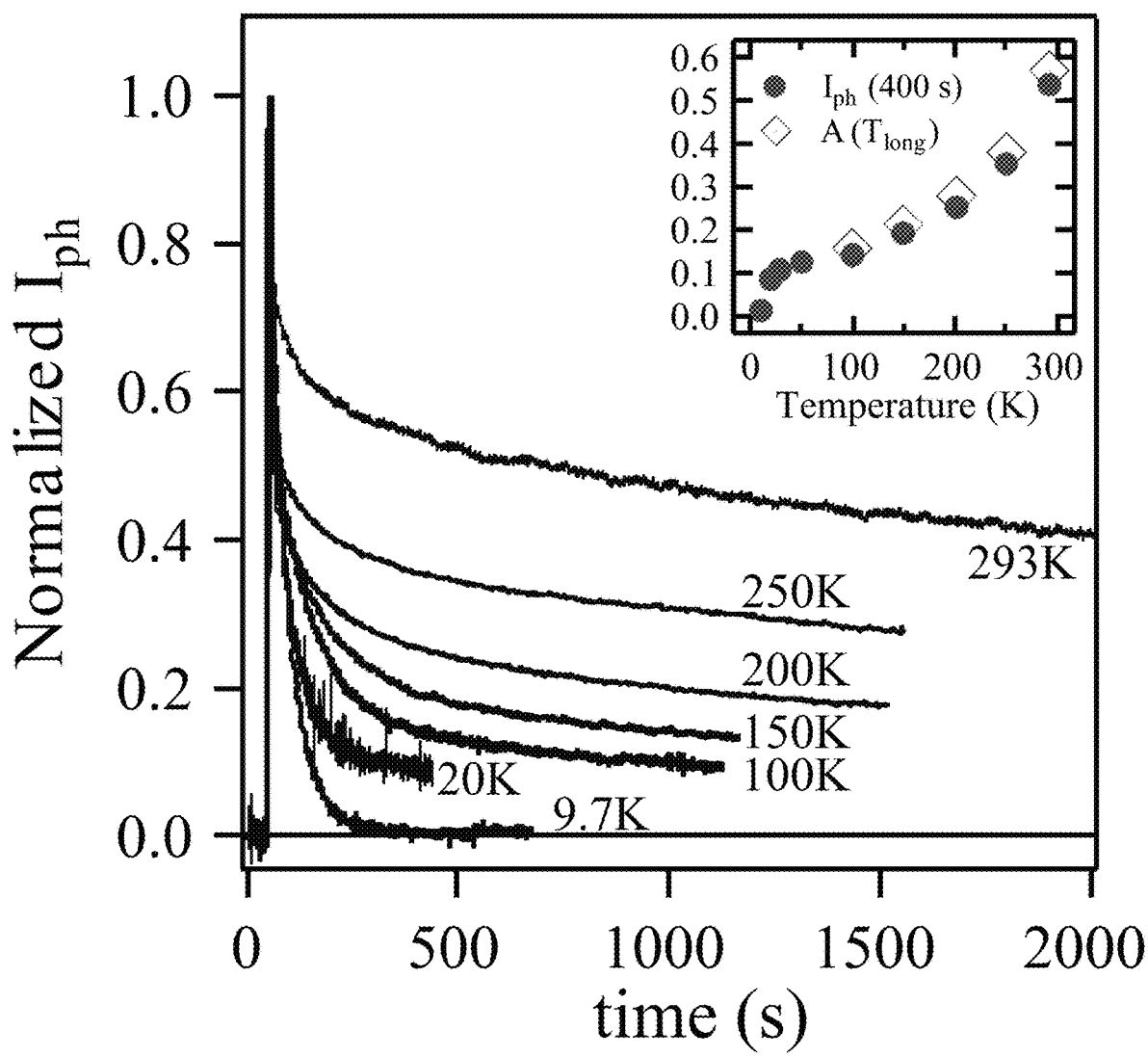
FIG. 14B illustrates temperature-dependent photocurrent decay transients of CsPbBr3/(6,5) heterojunctions, photoexcited at 405 nm for 5 seconds with a fluence of 18 mW/cm$^2$, according to some embodiments of the present disclosure. V$_{GS}$=0V, V$_{DS}$=0.1V. Inset shows the dependence of the photocurrent at 400 seconds and the amplitude of the long time constant (2,000 seconds <$\tau_{long}$<5,500 seconds) on temperature.
Figure 14C:
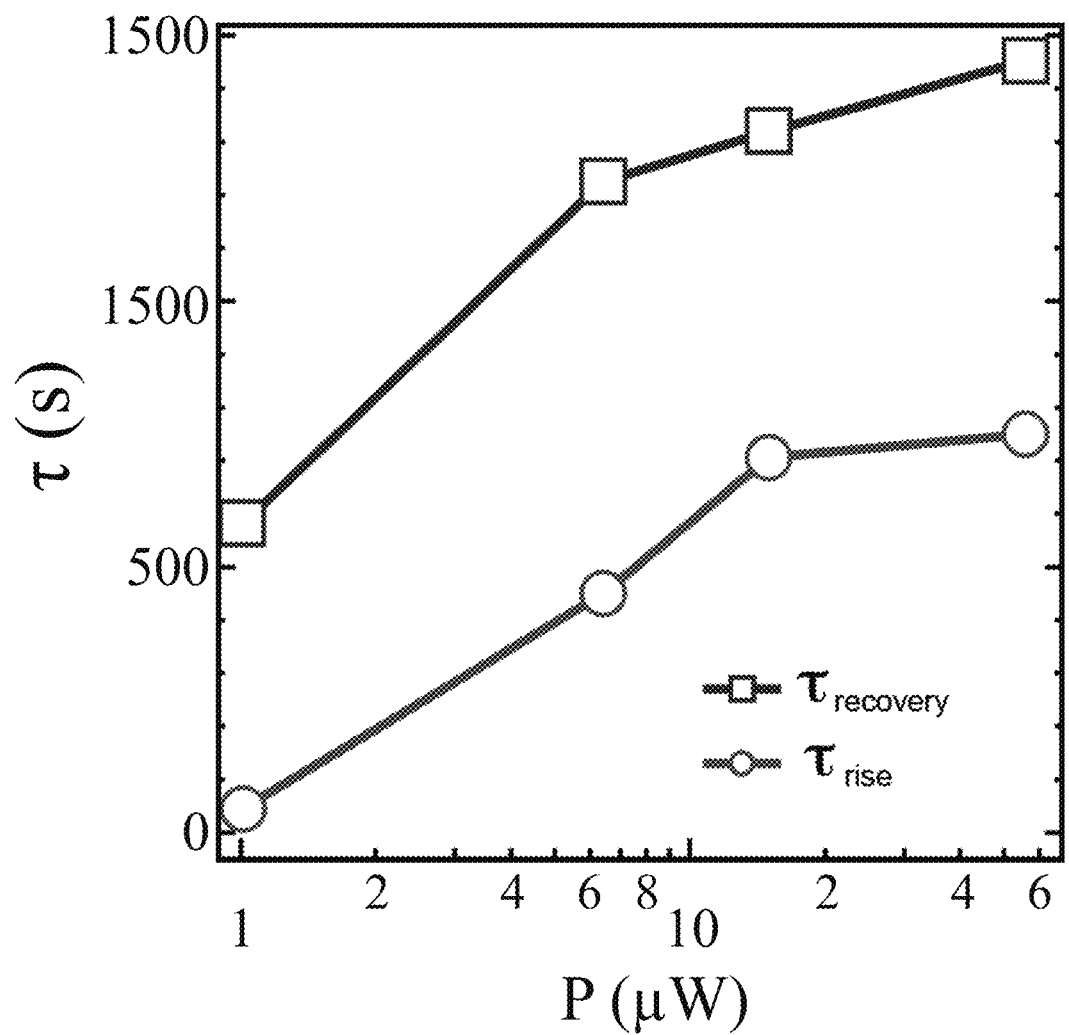
FIG. 14C illustrates the dependence of I$_{ph}$, rise time ($\tau_{rise}$) (circles) and recovery time ($\tau_{recovery}$) (squares) on incident 405 nm laser power (continuous excitation during I$_{ph}$ rise), according to some embodiments of the present disclosure.
Figure 15:
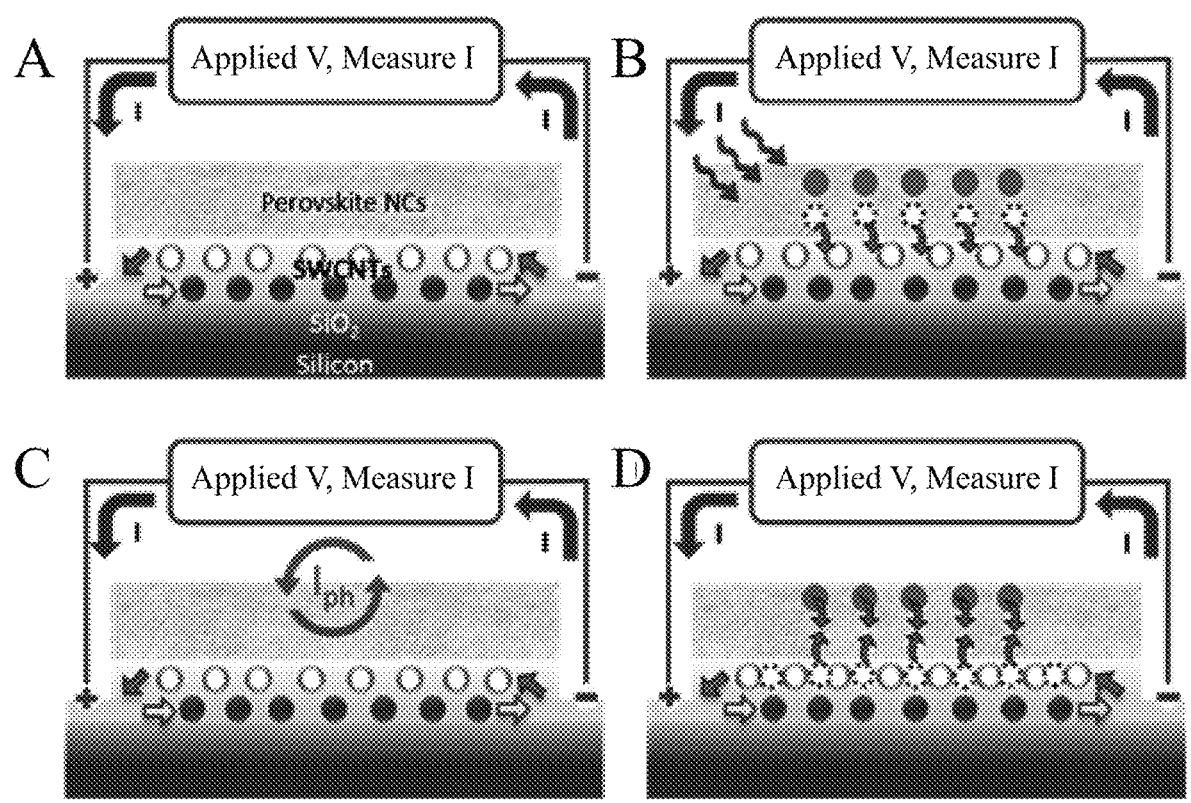
FIG. 15 illustrates a schematic of quantum reinvestment mechanism at perovskite NCs/SWCNT heterojunctions, according to some embodiments of the present disclosure. Panel A illustrates dark current under a voltage bias due to the intrinsic carriers in junction structure, electrons and holes are denoted by dark and light circles, respectively. Panel B illustrates that due to the built-in potential at the junction area, holes transport into SWCNT networks from perovskite NCs, while the electrons move away toward to the upper surface of perovskite NCs layer. Panel C illustrates that these carriers p-doped the s-SWCNT networks and remain available for a certain time scale (t$_r$, recombination time) before they recombine back to perovskite NCs layer. During this time, the applied voltage replaces these carriers many times by letting them travel through the external circuit, causing the photocurrent, I$_{ph}$. Panel D illustrates that at the end of their lifetime, these carriers recombine.
Figure 16:
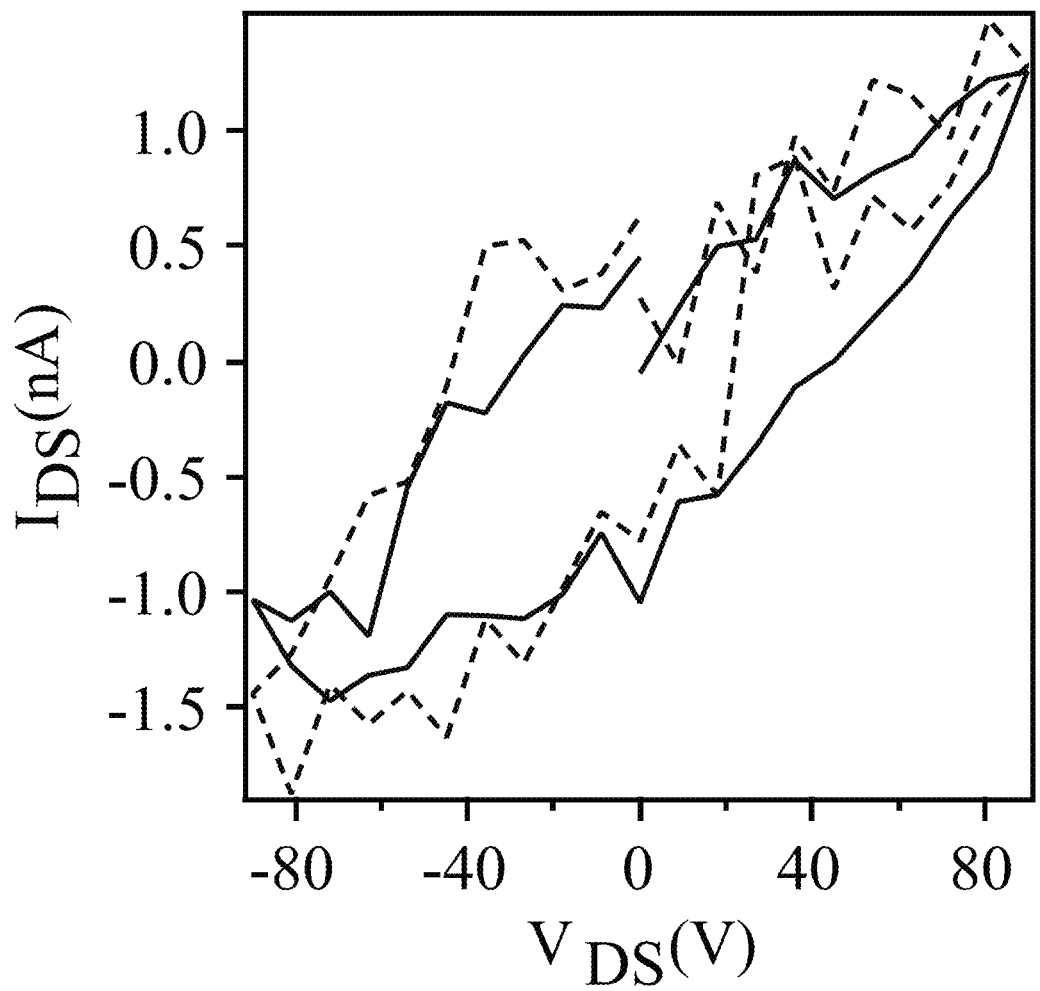
FIG. 16 illustrates I$_{DS}$ vs. V$_{DS}$ measurements of a FAPbBr$_3$ NC device with 10 μm channel length in the dark (solid lines) and under 405 nm laser illumination (dashed lines) in a nitrogen-filled glovebox, according to some embodiments of the present disclosure.
Figure 17:
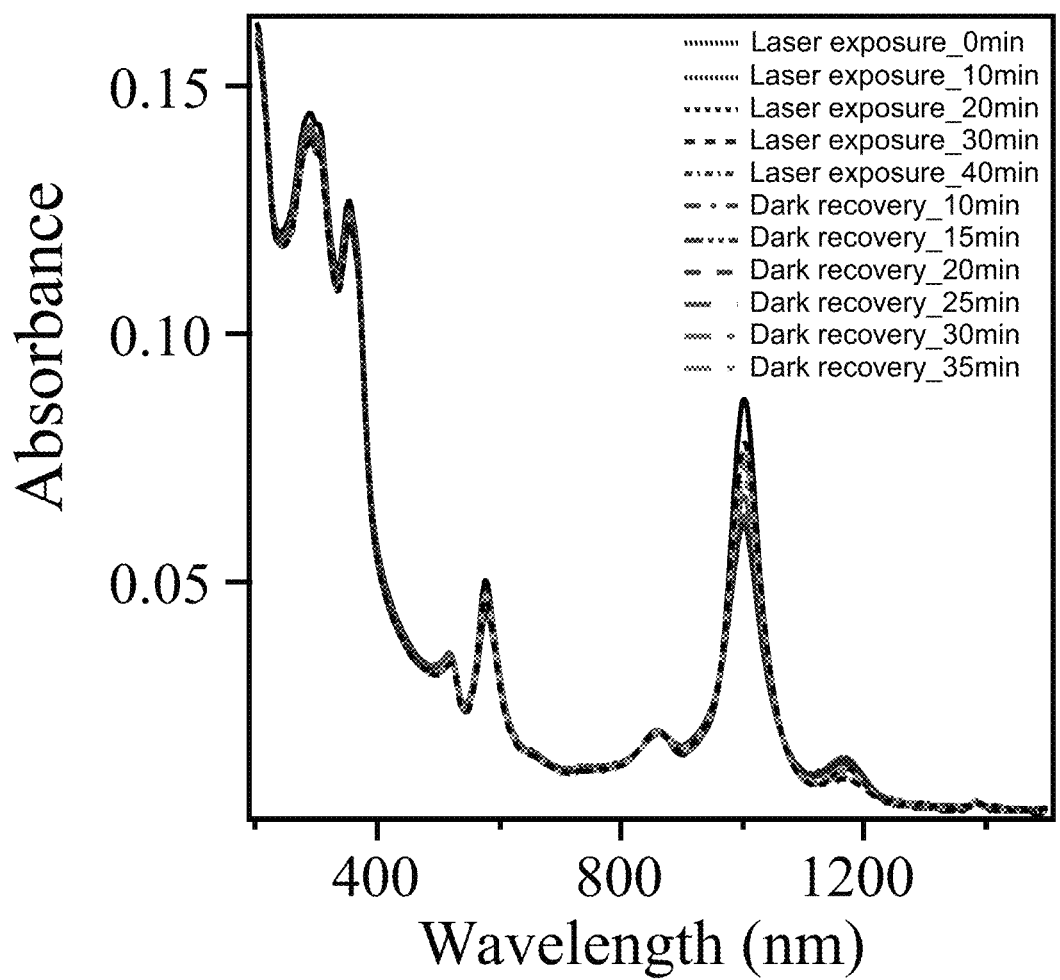
FIG. 17 illustrates a full suite of absorption spectra for FAPbBr$_3$ perovskite NCs/(6,5) s-SWCNT heterojunctions under continuous 405 nm laser illumination (exposure times from 0 to 40 minutes) and recovery (from 10 to 35 minutes) in the dark, according to some embodiments of the present disclosure.
Figure 18A:
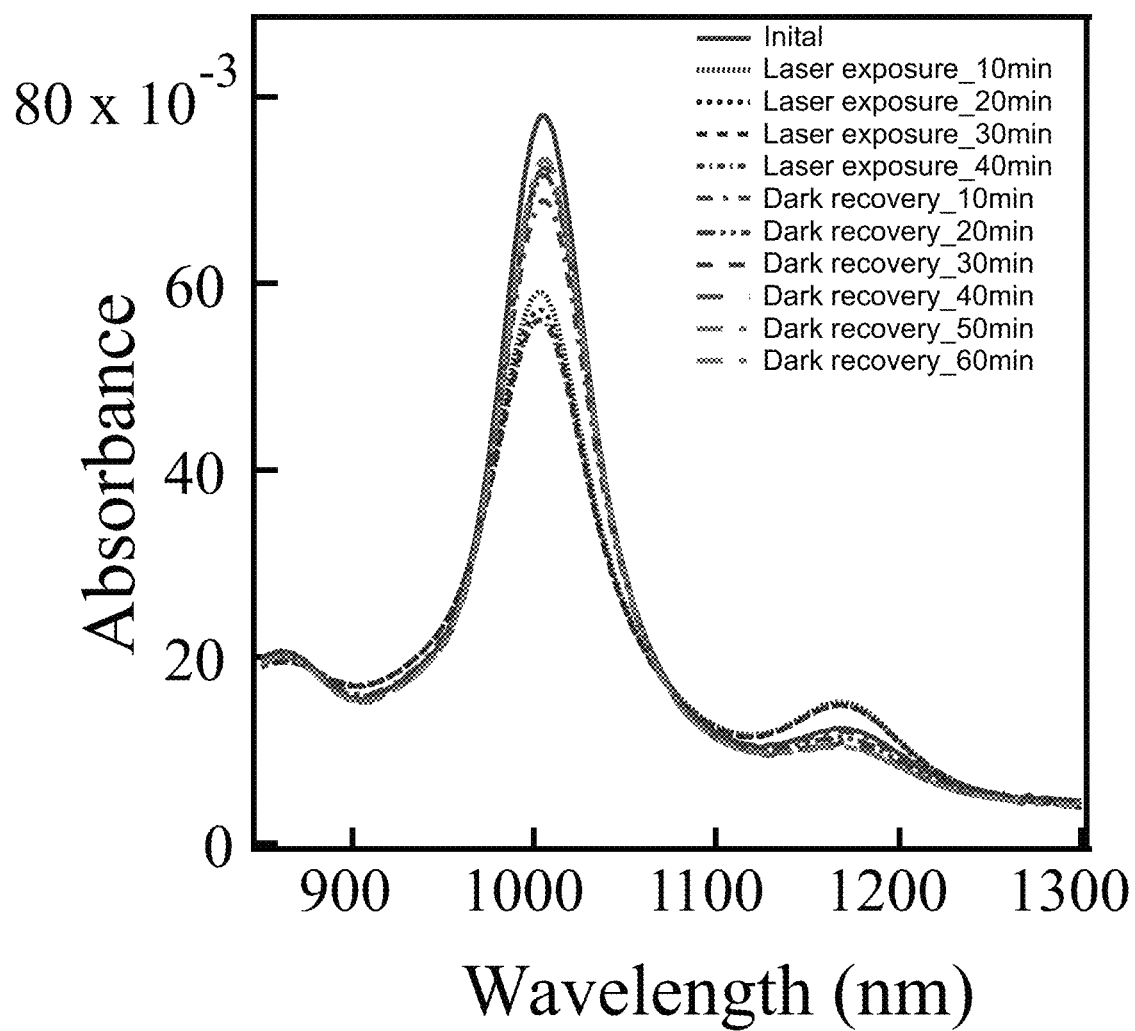
FIG. 18A illustrates absorption spectra of a CsPbBr$_3$ perovskite NCs/(6,5) s-SWCNT heterojunctions under continuous 405nm laser illumination and recovery in the dark, according to some embodiments of the present disclosure.
Figure 18B:
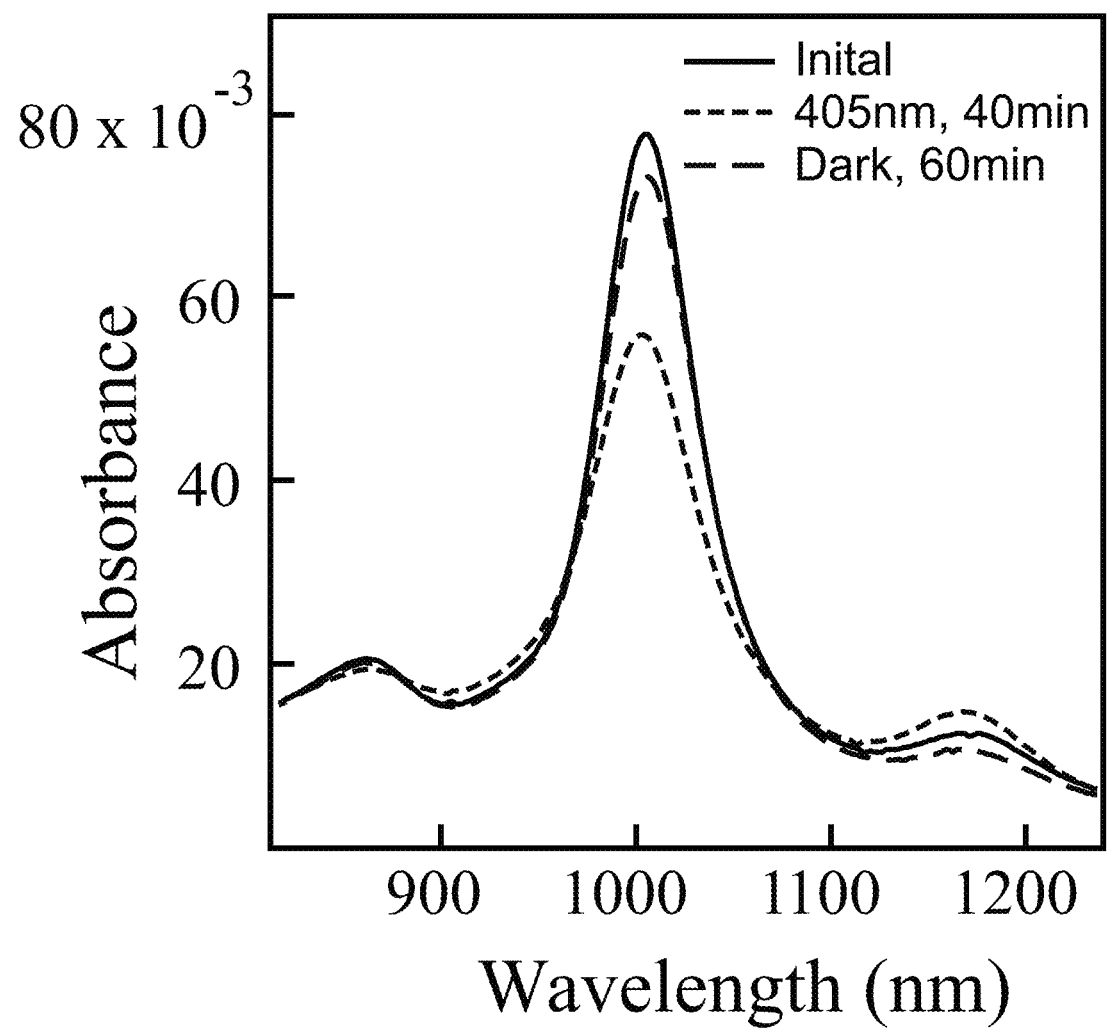
FIG. 18B illustrates absorption spectra of a CsPbBr$_3$/(6,5) heterojunction under 405nm laser for 40 minutes illumination and in the dark for a 60 minute recovery, according to some embodiments of the present disclosure.
Figure 18C:
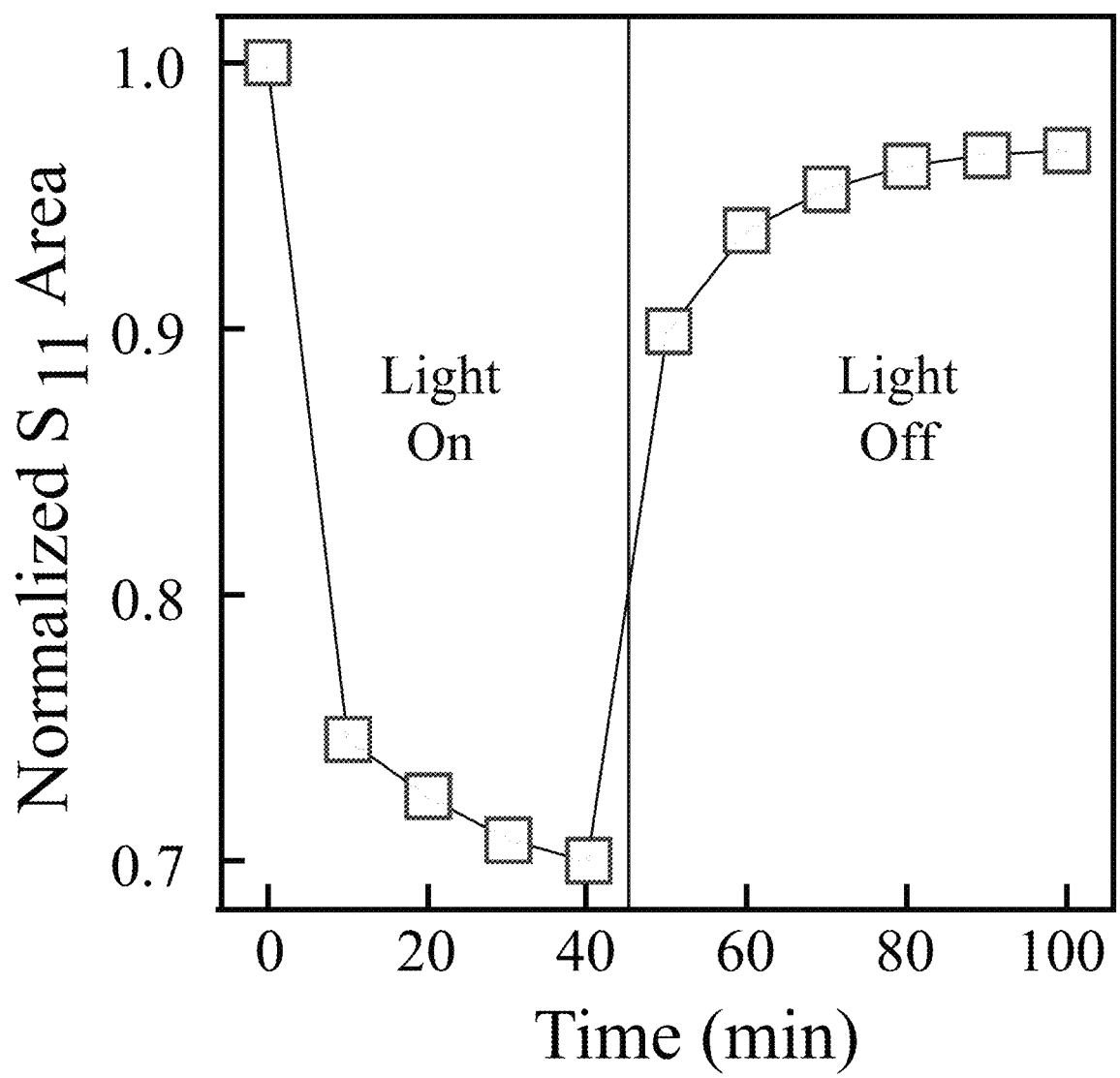
FIG. 18C illustrates the variation of normalized S$_{11}$ peak area of a CsPbBr3/(6,5) heterojunction under laser illumination and recovery in the dark, according to some embodiments of the present disclosure.
Figure 20A:
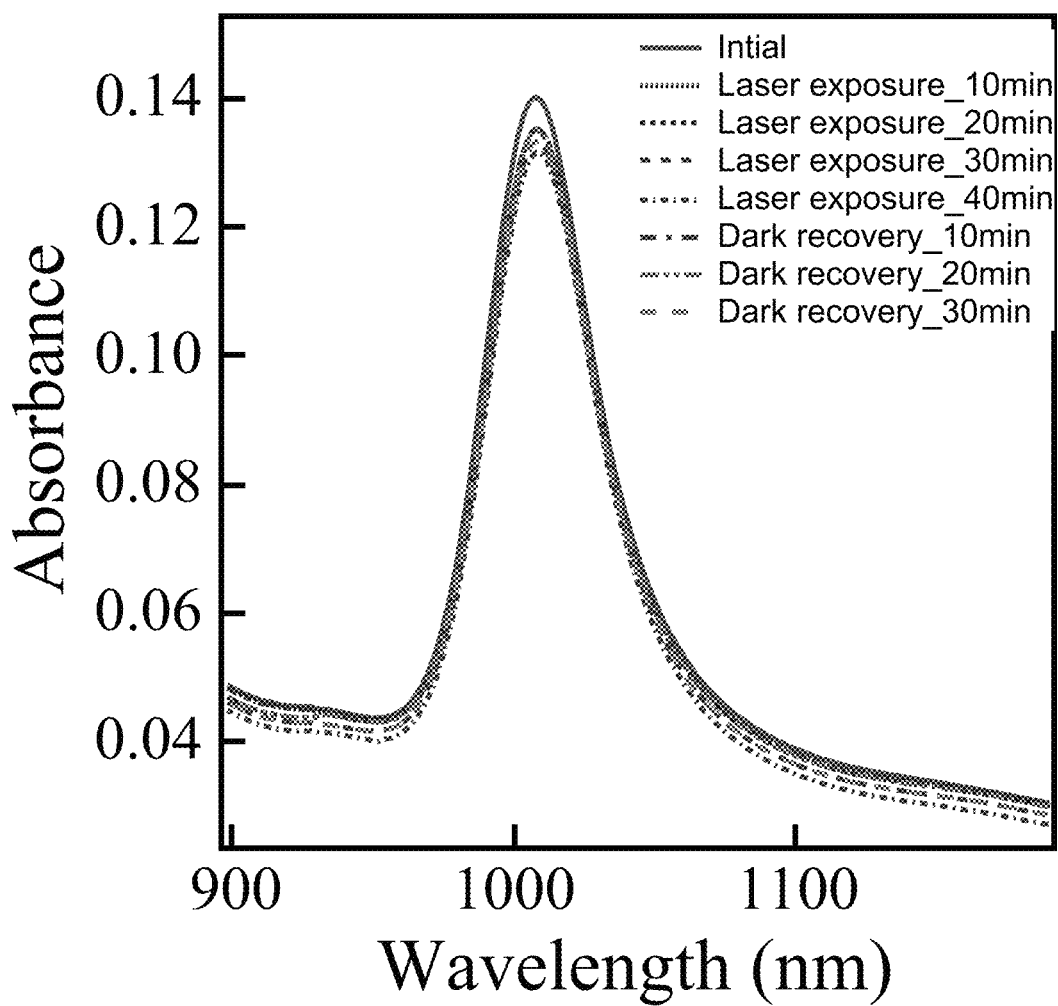
FIG. 20A illustrates absorption spectra of CsPbI$_3$ perovskite NC$_s$/(6,5) s-SWCNT heterojunctions under continuous 405nm laser illumination and recovery in the dark, according to some embodiments of the present disclosure.
Figure 20B:
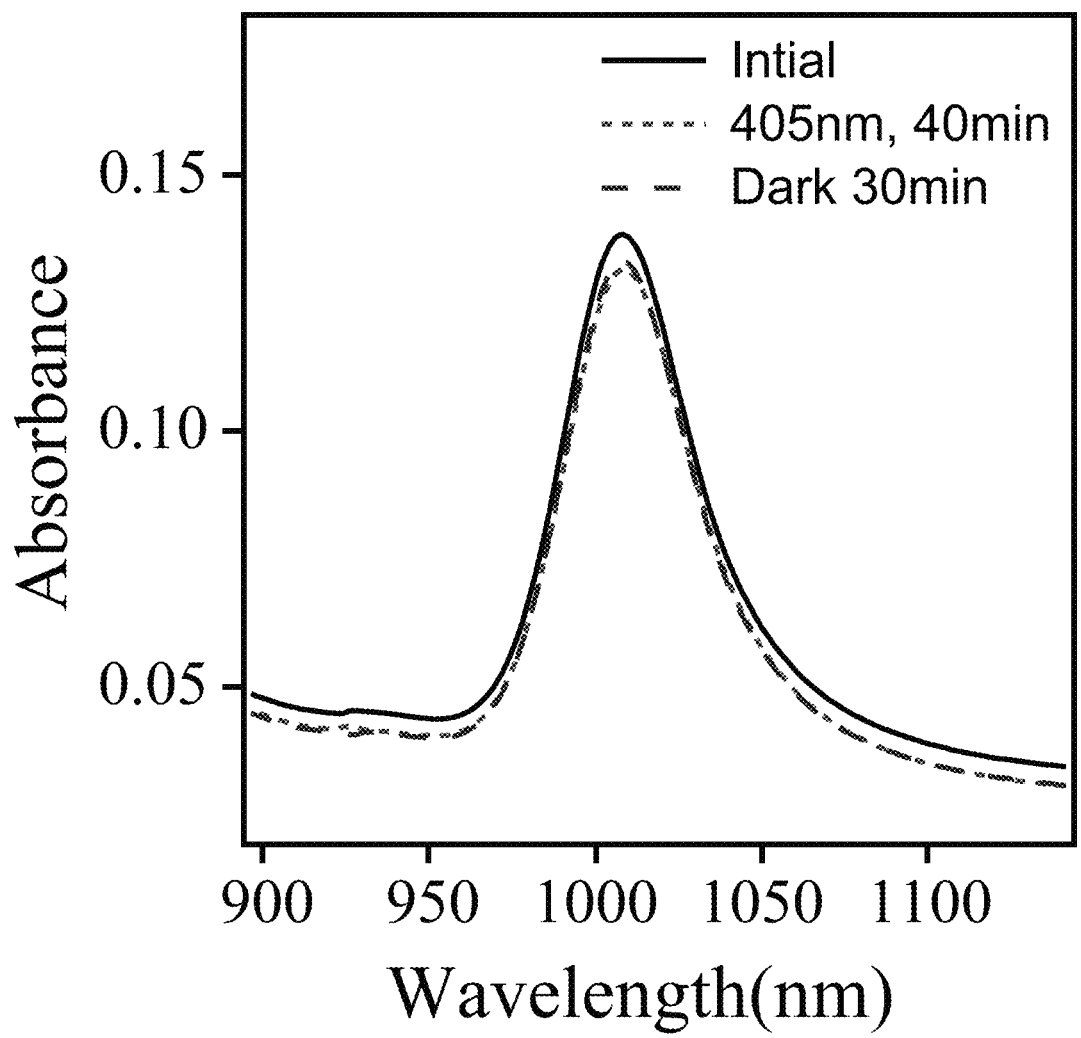
FIG. 20B illustrates absorption spectra of CsPbI$_3$/(6,5) heterojunction under 405nm laser for 40 minutes of illumination and in the dark for 60 minutes of recovery, according to some embodiments of the present disclosure.
Figure 20C:
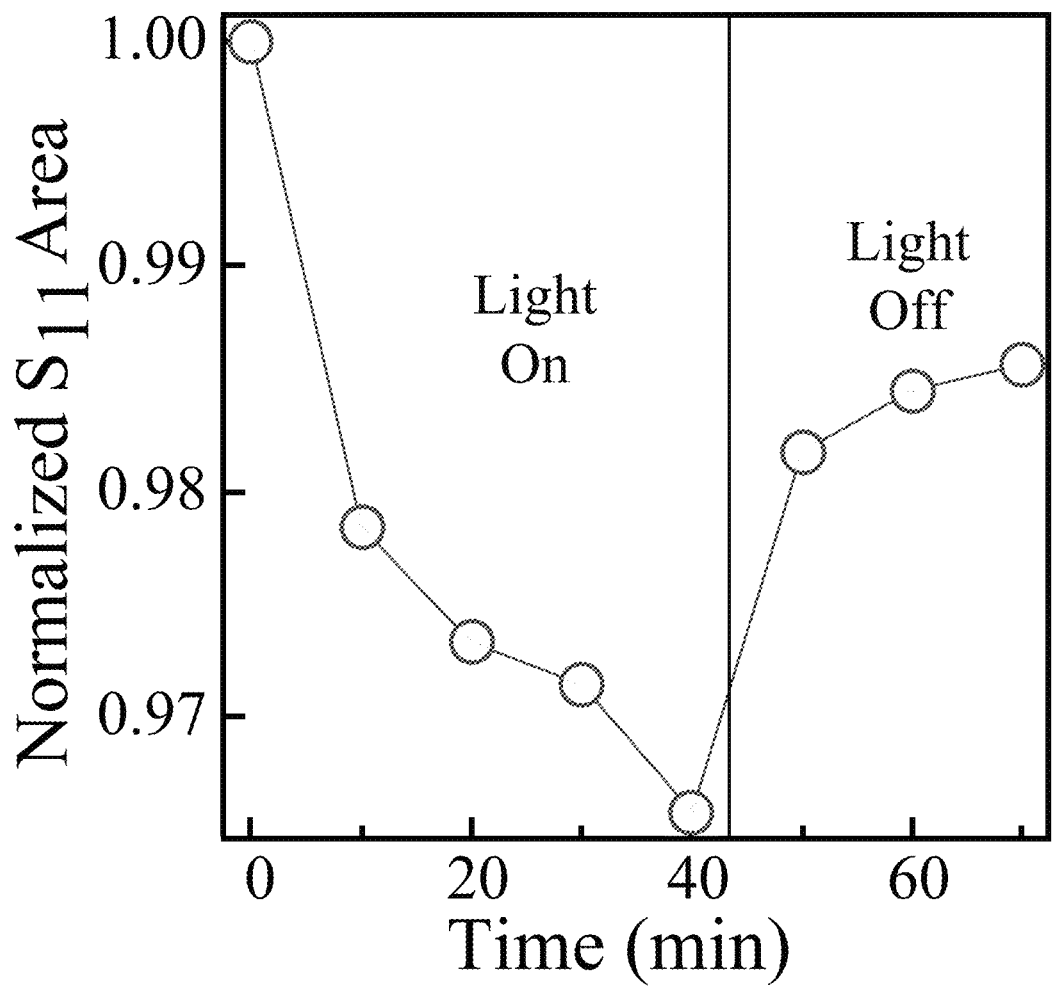
FIG. 20C illustrates the variation of the normalized area of S$_{11}$ peak area of a CsPbI$_3$/(6,5) heterojunction under the laser illumination and recovery in the dark, according to some embodiments of the present disclosure.

The experiments summarized in FIGS. 12A-12F demonstrate that field-driven ion migration contributes to PPC in perovskite NC/SWCNT heterojunctions. To further explore the influence of ion migration on the photocurrent response of the heterojunction phototransistors, temperature-, time-, and fluence-dependent photocurrent measurements were collected. FIGS. 14A, 14B, and 14C use the CsPbBr$_3$ heterojunction as an example, and the other heterojunctions are illustrated in FIGS. 20A, 20B and 20C. As shown in FIGS. 14A and 14B, a five-second laser pulse was applied for all temperature conditions, over a range of 9.7K to 293K, and the time-dependent photocurrent ($I_{ph}$) was recorded. Since recent measurements demonstrate that significant ion migration can occur on the microsecond time scale (see also FIGS. 21A-21E), the five-second laser pulse was sufficient to track the temperature-dependent effects of ion migration on the photocurrent magnitude and recovery time. FIG. 14A demonstrates that $I_{ph}$ increased with increasing temperature. The rate (k) of an activated process is related to the temperature (I) and the activation energy ($E_A$) through the Arrhenius relationship:

$$k = Ae^{\frac{-E_A}{k_B T}}$$ Equation 3 where $k_B$ is the Boltzmann constant and A is a pre-exponential factor. In the present disclosure, the rate is reflected by $I_{ph}$, since the photocurrent is a measure of the current extracted per unit time. $E_A$ can be extracted from the slope of $\ln(I_{ph})$ versus 1/T, as shown in FIG. 14A. Two linear regimes suggest that different activated processes contributed to the observed photocurrent. The small activation energy extracted from FIG. 14A may be attributed to a small band-bending induced thermodynamic barrier to hole injection at the NC/s-SWCNT interface and/or the activation energy for source-drain hole conduction due to energetic disorder in the SWCNT channel.

The larger activation energy is consistent with a thermodynamic barrier for halide vacancy migration in illuminated lead-halide perovskites. One could expect ion migration in lead halide nanocrystals to be quite favorable, since the NC array can be envisioned as a polycrystalline film with exceptionally small (i.e. between about 10 nm and about 15 nm) grains, where undercoordinated surfaces can facilitate ion migration in response to a field. This expectation is consistent with the large PPC observed in NC-based heterojunctions and small/negligible PPC in heterojunctions incorporating bulk perovskite. Thus, the observed $E_a$ of 3.6 kJ/mol (0.037 eV) is consistent with the hypothesis that the photocurrent response of our NC/SWCNT heterojunctions has a large contribution from ion migration at temperatures above 20 K. Similar analyses to FIG. 14A calculated activation energies of 5.8 kJ/mol and 2.6 kJ/mol for $FAPbBr_3$ and $CsPbI_3$ NC/SWCNT heterojunctions.

FIG. 14B demonstrates that the photocurrent decay dynamics vary significantly with temperature. $I_{ph}$ decayed relatively rapidly at temperatures less than 20 K, returning to the dark current in less than 500 seconds. Transients taken at T≥20 K all featured photocurrent that lasted substantially longer than 500 seconds. The photocurrent decay transients match exponential fits with multiple exponential time constants. The long-lived photocurrent can be fit satisfactorily with two time constants that are in the range of ca. 100 seconds and between about 2000 seconds and about 5000 s ($\tau_{long}$), although the accuracy of $\tau_{long}$ is limited by the temporal fitting range. The inset of FIG. 14B demonstrates that the residual photocurrent at 400 seconds ($I_{ph}(400\,s)$) and the amplitude of $\tau_{long}$ extracted from a multi-exponential fit both increase systematically with increasing T. This observation is fully consistent with the magnitude of residual PPC correlating with the number density of ions that can undergo thermally activated migration over the duration of the laser pulse at a given temperature. Technologically, these are exciting observations since they enable room-temperature optical memory in a simple solution-processed heterojunction at no applied gate voltage. This behavior contrasts strongly with incumbent technologies of optical memory that require low temperatures (T<180 K) due to the PPC effect being driven by a small thermodynamic barrier to recombination, or requiring large gate voltages, due to PPC arising from an interfacial charge-trapping effect. In contrast, the ion migration-enabled PPC for the perovskite NC devices described herein enables optical memory which does not require these extra energetic inputs.

Since the results presented herein point to thermally activated ion migration as the source of PPC, the photocurrent rise and recovery should also depend on the magnitude of the excitation power-dependent photogenerated field. FIG. 14C displays the excitation power-dependent photocurrent rise time ($\tau_{rise}$) and recovery time ($\tau_{recovery}$) for the $CsPbBr_3$ NC/SWCNT heterojunction, measured under conditions of continuous illumination at 405 nm for the rise time. Both $\tau_{rise}$ and $\tau_{recovery}$ increased very rapidly with increasing incident photon fluence at low power and saturated somewhat at higher incident powers. A higher laser power induced more photogenerated electron-hole pairs in the perovskite NCs, which in turn led to more holes being transferred from the NCs to the SWCNTs. Thus, higher incident power led to a larger transverse photogenerated electric field (see FIG. 7E), which in turn is expected to induce the migration of more halide vacancies away from the NC/SWCNT interface. As with the temperature-dependent measurements illustrated in FIG. 14B, a larger number density of reorganizing ions leads to a larger magnitude of the slow time constants associated with this ion motion. The saturation fluence of $\tau_{rise}$ and $\tau_{recovery}$ is then most likely related to the absolute density of defects/vacancies species contributing to the slower migration-induced photocurrent. It is also important to note that $\tau_{recovery}$ is always substantially slower than $\tau_{rise}$. Due to the photogenerated electric field, the motion of halide vacancies under illumination ($\tau_{rise}$) is a drift process, whereas the reestablishment of equilibrium in the dark ($\tau_{recovery}$) relies upon the much slower process of diffusion which is not field-assisted.

Without wishing to be bound by theory, FIG. 19 summarizes the mechanisms responsible for the prompt and persistent photoconductivity response in the perovskite NC/s-SWCNT heterojunctions. In the dark, upon the formation of NC/SWCNT interface Fermi levels line up, leading to localized electrons in NCs and holes in the s-SWCNTs in the interface region. Coulomb attraction to the electrons in the NC layer also serves to localize positively charged bromine vacancies at this interface. When light is absorbed by the perovskite NC layer, electron-hole pairs are generated. The splitting of electron and hole quasi-Fermi levels induces prompt (but thermally activated at low T) transfer of holes from perovskite NCs to the (6,5) s-SWCNT layer, leaving electrons in the perovskite layer as shown in Panel 1 of FIG. 19. These injected holes produce a prompt $I_{ph}$ within the s-SWCNT channel. The charges separated across the NC/SWCNT interface produce an electric field ($E_{ph}$) perpendicular to the film, as shown in Panel 2 of FIG. 19, that induces halide vacancy migration away from the interface. Such migration of vacancies away from this interface reduces the interfacial activation barrier for hole transfer, leading to additionally delayed photocurrent where the slow temporal rise reflects the ion migration kinetics that serves to establish equilibrium under illumination. It is also possible that the slow migration-induced halide accumulation at the NC/SWCNT interface during illumination induces a transient 'top gate' that contributes to the slow rise of the hole current in the s-SWCNT channel, since halogens are known to chemically dope nanotubes and produce conductive p-type nanotubes.

The illumination interval establishes a new equilibrium of positively charged halide vacancies, away from the NC/SWCNT interface, that 'trap' electrons via Coulomb attraction or potentially via more complex defect chemistry. Reestablishment of equilibrium needs the movement of the halide vacancies (and coupled charges) back to the interface, which is now a diffusion process that no longer benefits from the large photogenerated electric field. The significantly larger activation barrier for this process, relative to the migration barrier under illumination, is thus responsible for the slow ion redistribution, electron-hole recombination, and photoconductivity decay.

Figure 21A:
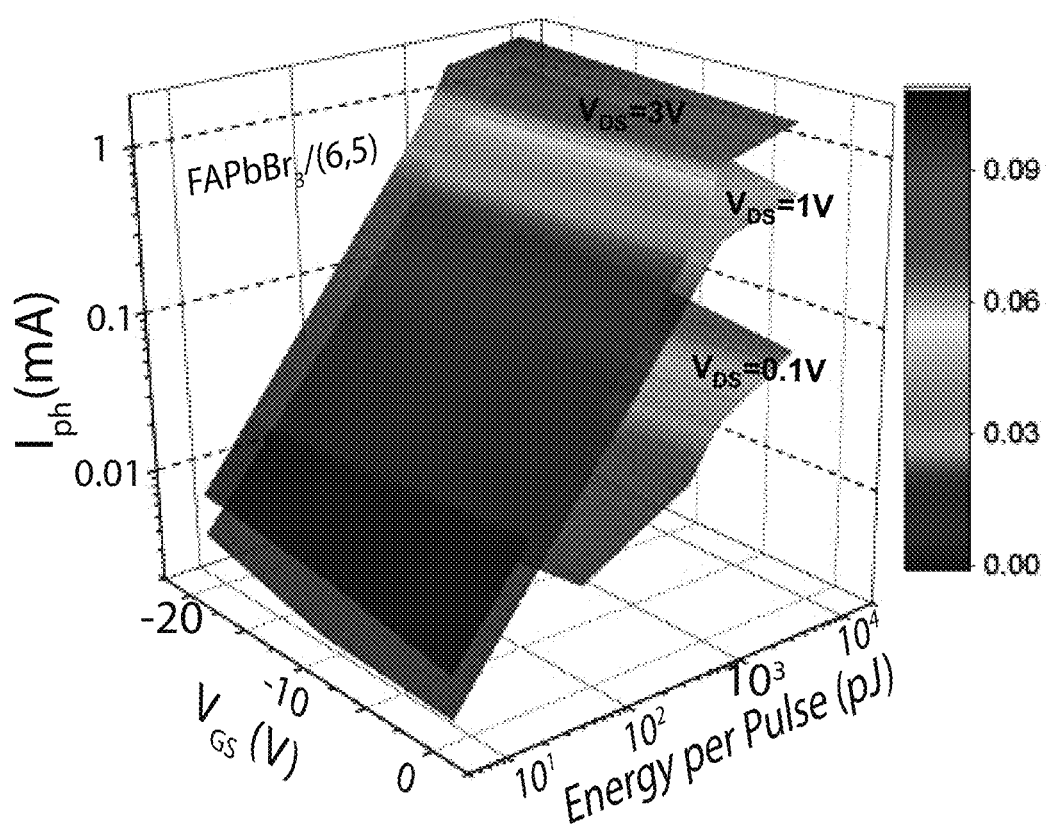
FIGS. 21A-21E illustrate various performance metrics of the devices described herein, according to some embodiments of the present disclosure.

The perovskite NC/s-SWCNT heterojunctions demonstrated herein, with high photo-response and PPC, are attractive for developing nonvolatile optical memory devices. Neuromorphic devices aim, in part, to emulate synaptic stimulation, whereby low-energy electrical pulses (pre-synaptic inputs or 'spikes') induce post-synaptic currents with highly tunable 'weight'. Pre-synaptic inputs in the brain are typically very low in energy, in the range of about 1 femtoJoules to about 100 femtoJoules per spiking event. Using the $FAPbBr_3/(6,5)$ sample as an example, FIG. 21A illustrates that the NC/SWCNT heterojunction phototransistors described herein can be optically switched with very short light pulses and at spiking energies that approach the low energies of synapses in the brain. With no applied gate voltage ($V_{GS}$=0 V, $V_{DS}$=0.1 V), 30 μs pulses of 405 nm light can induce persistent 2 nA photocurrents at 84 pJ per spiking event. The small $V_{DS}$ used here can be supplied by a wide variety of inexpensive and self-powered sources, including for example organic thermoelectric energy harvesters. The optical energy input can be further lowered by tuning $V_{GS}$ and $V_{DS}$ (see FIGS. 21A-21E) with the caveat that this increases the steady-state energy required to maintain the gate and source-drain bias. The photocurrents of the $FAPbBr_3$/SWCNT heterojunction transistor have been measured at different combinations of gate voltage ($V_{GS}$), source-drain voltage ($V_{DS}$), and laser pulse energy. The applied gate voltages ($V_{GS}$) are 0 V, −10 V, and −20 V, the applied source-drain voltages ($V_{DS}$) were 0.1V, 1V, and 3V, and the applied 405 nm wavelength laser pulse energies were 7.4 pJ, 724 pJ, 1300 pJ, and 6290 pJ, separately. If only the drain voltage is increased ($V_{GS}$=0 V, $V_{DS}$=1 V), similar optical switching can be accomplished at only 7.4 pJ per spiking event, and increasing both the gate and drain voltage ($V_{GS}$=−20 V, $V_{DS}$=3 V) enables optical switching at ca. 740 fJ per spiking event. These spiking energies are significantly lower than those for incumbent optical synapses. The following experimental conductions were tested: Pulse laser energy range: 7.4 pJ to 5 mJ; laser pulse duration: 1 μs to several hours (i.e. continuous); source-drain voltage: 0.01 V to 10 V; Gate voltage: −60 V to 60 V; light wavelength: 200 nm to 1500 nm.

Figure 21B:
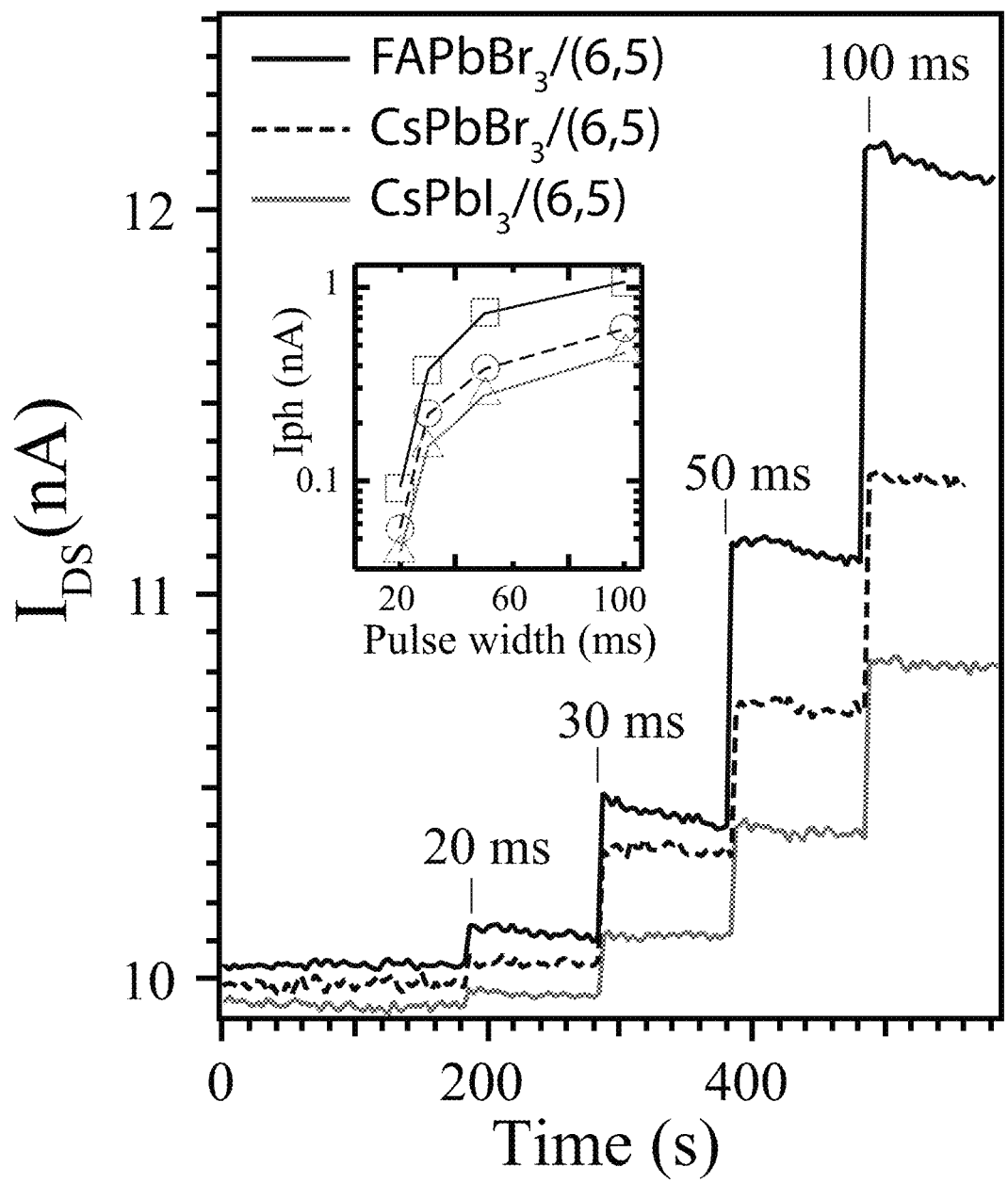
Figure 21C:
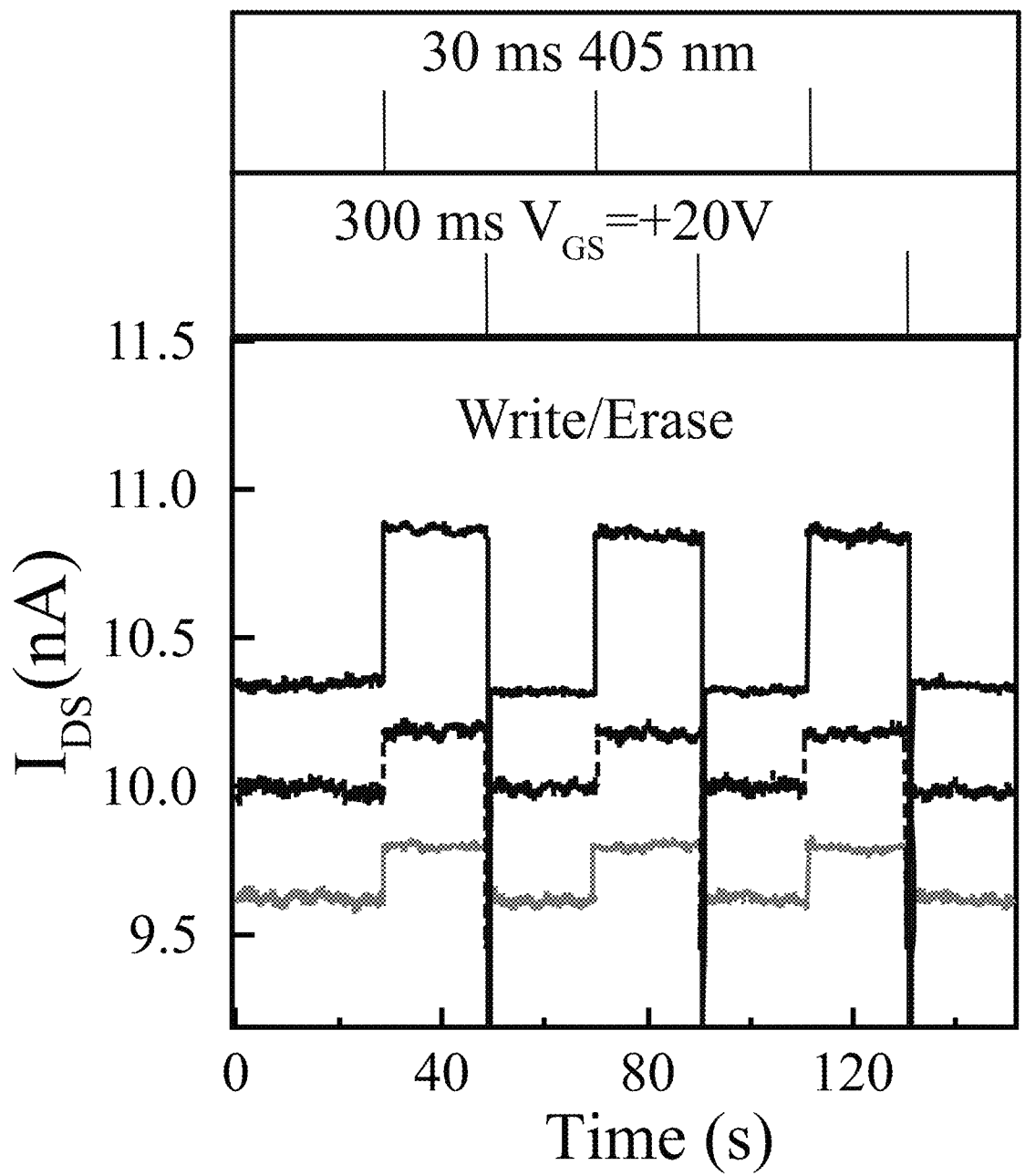
Figure 21D:
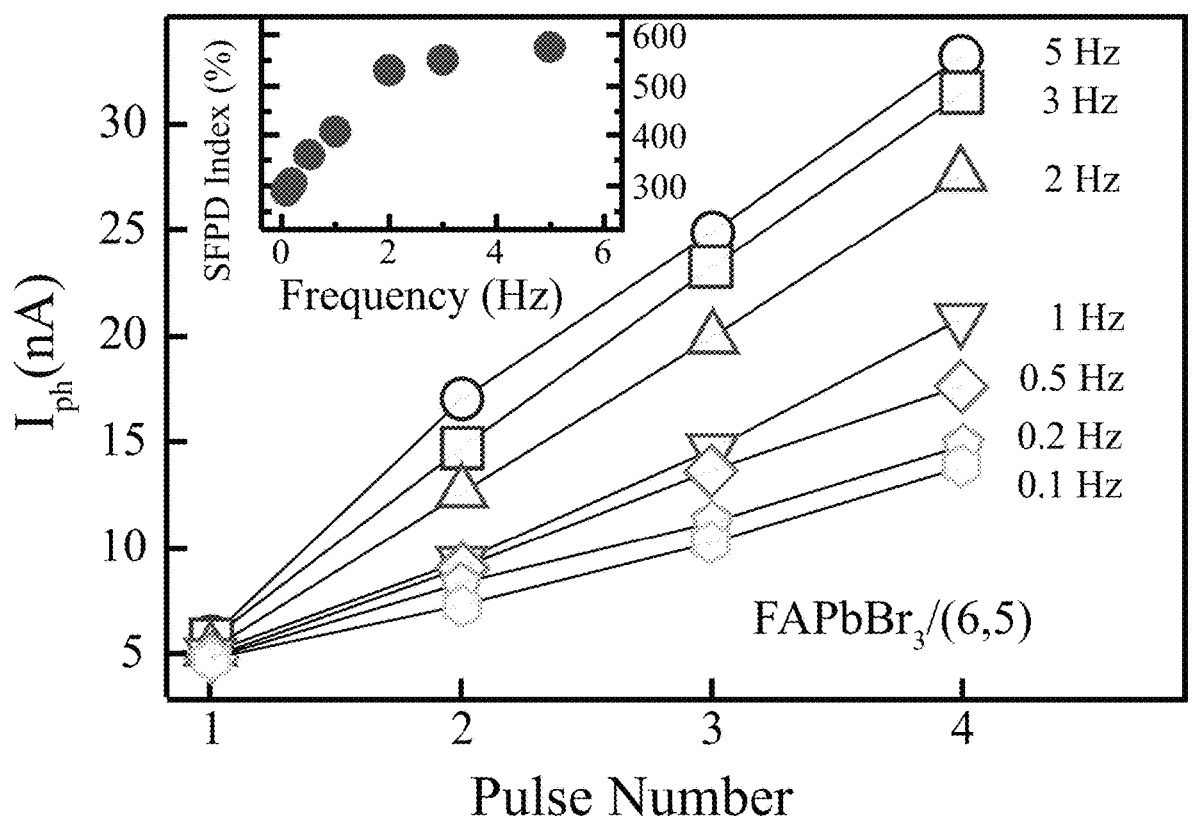
Figure 21E:
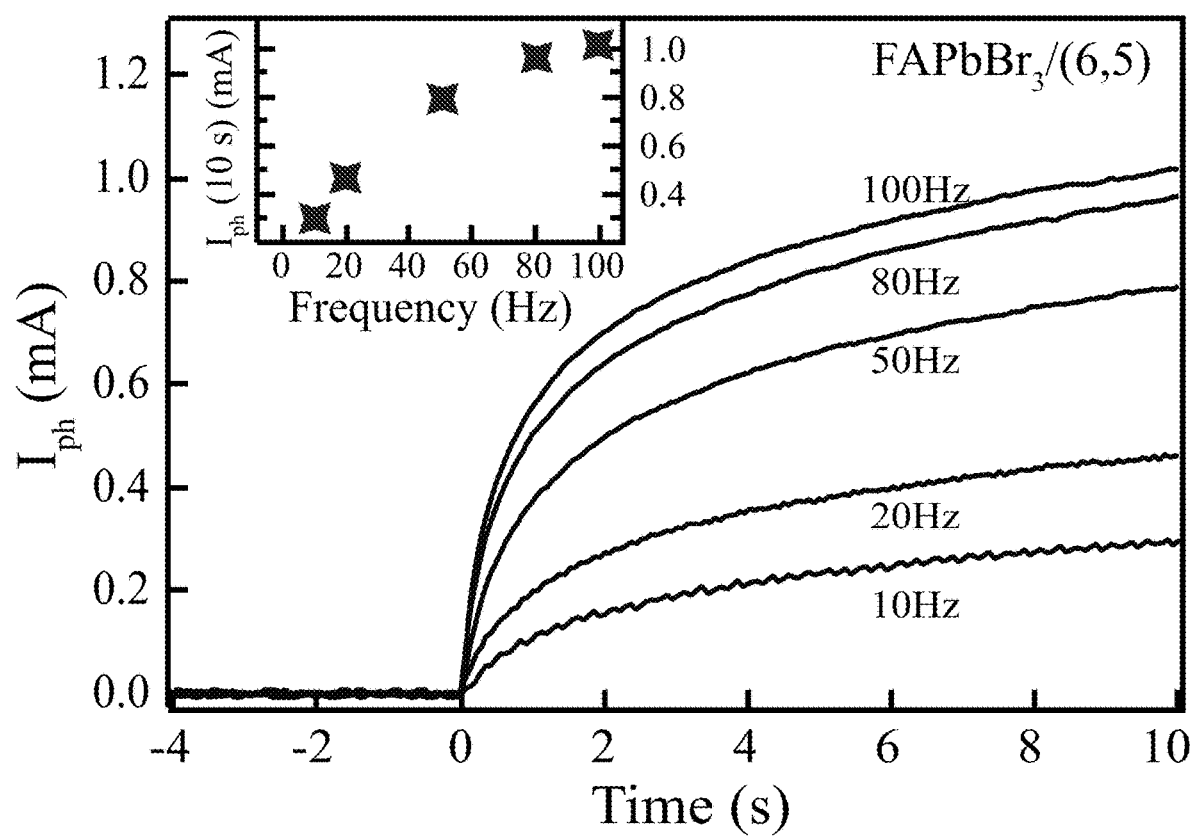

In FIG. 21B, it is illustrated that a multi-level memory function can be realized by illuminating the three heterojunctions with 405 nm laser pulses having different pulse widths. For all three devices, $I_{ph}$ shows a step-like increase when the laser pulse is applied to the device, and $I_{ph}$ increases sub-linearly with pulse width (see the inset of FIG. 21B). FIG. 21C demonstrates the rewritable function of such heterojunctions whereby the persistent photocurrent programmed by the laser pulse (30 μs pulse width) can be removed by using a short gate voltage pulse ($V_{GS}$=+20V) with a duration of 300 ms.

Materials and Methods:

Chemicals: Formamidinium acetate (FA-acetate, 99%), cesium carbonate ($Cs_2CO_3$; 99.9%), $PbBr_2$ (≥98%), oleic acid (OA, technical grade 90%), oleylamine (OAm, technical grade 70%), 1-octadecene (ODE, technical grade 90%), hexane (reagent grade≥95%), octane (anhydrous, ≥99%), methyl acetate (MeOAc, anhydrous 99.5%), sodium borohydride ($NaBH_4$, ≥98%), Cesium toluene (anhydrous 99.8%),%), ethanol (EtOH, 200 proof, ≥99.5%) were purchased from Sigma Aldrich. Purchased from Alfa Aesar: lead (II) iodide (PbI2, 99.9985%).

Synthesis of $CsPbBr_3$ NCs: In a three-necked round-bottom flask, 1.25 mmol (0.407 g) of $Cs_2CO_3$, 20 ml 1-ODE and 1.25 ml OA were degassed under a vacuum at room temperature and 50° C. for 30 min, respectively. The temperature was then increased to 120° C. under $N_2$ and kept at this temperature for injection. In another three-necked round-bottom flask, 1.08 mmol (0.407 g) $PbBr_2$ and 25 mL of 1-ODE were degassed under vacuum at room temperature and 120° C. for 30 min, respectively. Mixtures of 7.56 mmol (2.5 mL) of OA and 7.56 mmol (2.5 mL) of OAm were preheated to 120° C., then injected into the $PbBr_2$ mixture under vacuum. After $PbBr_2$ was fully dissolved, the temperature of the solution was increased to 180° C. Under $N_2$ flow, 2 mL of the Cs-oleate stock solution was swiftly injected into the $PbBr_2$ mixture, which was then quenched by immersing the flask in an ice-bath.

Synthesis of $FAPbBr_3$ NCs: In a three-necked round-bottom flask, 15 mmol (1.563 g) of FA-acetate, 15 ml OA and 15 ml ODE were degassed under a vacuum at room temperature and 50° C. for 30 min, respectively. The temperature was then increased to 120° C. under $N_2$ and kept at this temperature for injection. In another three-necked round-bottom flask, 0.74 mmol (0.2738 g) $PbBr_2$ and 25 ml 1-ODE were degassed under vacuum at room temperature and 120° C. for 30 min, respectively. Mixtures of 12.1 mmol (4 mL) of OA and 3.025 mmol (1 mL) of OAm were preheated to 120° C., then injected into the $PbBr_2$ mixture under vacuum. After $PbBr_2$ was fully dissolved, the temperature of the solution was increased to 160° C. Under $N_2$ flow, 5 mL of the FA-oleate stock solution was swiftly injected into the $PbBr_2$ mixture, which was then quenched by immersing the flask in an ice-bath.

Purification of NCs: 50 mL of MeOAc was added to the as-synthesized $CsPbBr_3$ NCs and $FAPbBr_3$ NCs. After the mixed solutions were shaken few times, they were centrifuged at 7500 rpm for 5 min. The resulting precipitate was dispersed in 5 mL of hexane and then 10 mL of MeOAc was added again followed by centrifugation at 7500 rpm for 5 min. The precipitate was collected and redispersed in 5 mL of octane to coat the film.

Synthesis of $CsPbI_3$ NCs: $CsPbI_3$ nanocrystals (NCs) were synthesized and concentrated in an octane/hexane solution using previously published methods.1 For most of the films in this work, the temperature of the solution containing PbI2, ODE, OA, and OAm was raised to 185° C. at the time of injection of the Cs-oleate solution, with a reaction time of 5 sec before quenching in an ice bath. For the optical studies used to monitor the exciton peak during doping (FIG. S1), a more monodisperse NC sample was prepared by injecting at a lower temperature and using size selective precipitation: The PbI2 solution was raised to 160° C. for the injection of the Cs-oleate. MeOAc was added to the cooled synthesis solution for a total of 50 mL volume and then centrifuged at 7500 rpm for 5 min. The NCs were re-dispersed in ~10 mL of hexane after the supernatant was discarded. Then ~10 mL of MeOAc was added to the NC solution and it was centrifuged at 7500 rpm for 5 min again. The supernatant was transferred to another centrifuge tube and ~15 mL of MeOAc was added to it. The centrifuge process was performed again at 7500 rpm for 5 min. The NC pellet was redispersed in ~3 mL of hexane and then stored in a refrigerator before use.

$CsPbI_3$ NC Film Deposition: 1×1 inch glass substrates (Abs, PL) or 1×2 cm quartz substrates (TRMC) were sonicated in isopropanol then acetone for 10 min each, followed by a 10 min UV-ozone treatment. The following deposition process was done in a flow box kept at ~20% humidity: The NC solution was spin-cast onto the glass substrate at 1000 rpm for 20 sec, then 2000 rpm for 5 sec. The film was then dipped three times in quick succession into dry methyl acetate (MeOAc), which was rapidly dried off using an $N_2$ gun.

Purification of NCs: 50 mL of MeOAc was added to the as-synthesized $CsPbBr_3$ NCs and $FAPbBr_3$ NCs. After the mixed solutions were shaken a few times, they were centrifuged at 7500 rpm for 5 min. The resulting precipitate was dispersed in 5 mL of hexane and then 10 mL of MeOAc was added again followed by centrifugation at 7500 rpm for 5 min. The precipitate was collected and redispersed in 5 mL of octane to coat the film.

Preparation of polymer and s-SWCNT dispersion: The (6,5) SWCNT raw material was commercially purchased from Sigma-Aldrich Inc. The polymer used in this study was poly [(9, 9-dioctylfluorenyl-2, 7-diyl)-alt-co-(6, 6'-1)] (PFO-BPy) purchased from American Dye Source. The PFO-BPy normally selects the large-diameter semiconducting tubes with no preference for the particular chiralities and lower the metallic SWCNT purity level down to less than 1% in an SWCNT dispersion. Once the SWCNT powder was dispersed in the toluene-based polymer solution, the dispersion was sonicated by using a tip sonicator (Cole-Parmer CPX 750) for 30 min. And then the majority of the excess polymer was removed through the continuous 20-hour ultracentrifuge runs (Beckman Optima™ L-100XP ultracentrifuge), the generated polymer mixed SWCNT pellet was re-dispersed in toluene for the further spray-coating.

Fabrication of Field-effect transistor (FET) device: The typical device was fabricated on the 200 nm thickness $SiO_2$/highly doped Si wafer (1-10 Ω·cm) purchased from MTI corporation by using the standard optical lithography technique, 5 nm thickness Ti and 20 nm thickness Au electrodes were deposited on the patterned device by using the thermal evaporation deposition system, and the gate electrode was directly contacted with highly doped Si wafer, all the procedures were performed in the cleanroom. The designed channel lengths (Lch) of the typical device are 5, 10 and 25 μms and the channel width (Wch) is 1000 μm.

Preparation of (6,5) semiconducting SWCNTs and perovskite NCs hybrid film: Semiconducting SWCNT networks were prepared by spraying the prepared s-SWCNT inks to the prepared substrate ($SiO_2$/Si wafer or quartz substrate) using the ultrasonic sprayer with a Sonotek 120 kHz impact nozzle. And the s-SWCNT solution was sprayed at 300 μl/min controlled by using a syringe pump under the 7 std 1/min nitrogen flow with a 0.8 W spray nozzle power at room temperature. And the substrate was normally heated up to about 130° C. when spraying. After the spray coating, the s-SWCNT thin film was soaked in the 78° C. toluene solution in 10 min to remove the excess fluorene-based polymers. After depositing the SWCNTs networks, the perovskite thin films were then prepared by spin coating the precursor solution on to the prefabricated device by using a spin-rate of 3000 rpm for 30 s, followed by annealing at 150° C. for 30 min on the hotplate in the Nitrogen-filled glovebox.

Scanning Electron Microscopy (SEM): The morphologies and microstructures of the prepared perovskite nanocrystals with (6,5) SWCNTs were investigated using a field-emission scanning electron microscopy (FESEM, Hitachi S-4800), samples were imaged at 3 kV acceleration and 7-10 mm working distance.

Ultraviolet-visible-near-infrared absorbance measurement: Absorbance measurements of perovskite nanocrystals with (6, 5) SWCNTs were performed on the Agilent Cary 5000 spectrophotometer and Agilent Cary 7000 spectrophotometer, with a step size of 2 nm and a scanning speed of 600 nm min$^{-1}$. The blank substrate was calibrated as the baseline before the film measurement.

High-resolution confocal Raman spectra microscope characterization: Raman spectra characterization of perovskite NCs and (6, 5) SWCNTs were performed by using the high-resolution confocal Renishaw in Via Raman microscope (RE04) system with Wire 5.0 control software. The applied laser excitation wavelength is 785 nm (1.58 eV), the exposure time was is per spectrum and the number of data accumulation was is with 600 lines per millimeter grating, and the laser intensity ratio was set as 0.01% with 100 times objective lens.

Field-effect transistor (FET) measurement: The typical FET measurement was setup and performed in the $N_2$ filled glovebox, which is consist of two Keithley 2400 source meters, GPIB card and cable, and a laptop with a LabVIEW control program. One Keithley 2400 source-meter was used to supply the source-drain voltage ($V_{DS}$) and monitor the channel current ($I_{DS}$), and the other source-meter was used to supply the gate voltage ($V_{GS}$) and monitor the gate leakage current ($I_{GS}$).

Photocurrent response measurements: All photocurrent measurements were performed inside a nitrogen atmosphere glove box with 3 mbar pressure. This measurement was conducted using two Keithley 2400 source meters: one was used to supply the power to the laser diode, the other was used to supply the voltage to devices and monitor the channel current. All the experimental parameters and data were controlled and collected by an in house written LabVIEW program. The white light source used for photocurrent response measurement was a white LED array with Dino-lite digital microscope. 532 nm laser and 405 nm laser were from KOKUYO laser diodes. The power intensity of the laser source was adjusted by placing a series of neutral density filters purchased from Thorlabs Inc. And the pulse mode laser signal was generated by using Agilent 33220A function generator with controlled software. The power of laser was measured by using Newport dual-channel power meter (Model 2832C).

Microwave Conductivity Measurements: Microwave conductivity is a technique that can probe the photoexcited, mobile charge carriers in a semiconductor. The probe in this case is a microwave field which can resonantly interact with the mobile charge carriers. This interaction results in a slight attenuation of the microwave field. The magnitude of the microwave field attenuation is proportional to the number of mobile charges and their mobility. Fundamental considerations and a detailed discussion of this technique has been extensively described by Reid et al. (10.1088/1361-6463/aa9559).

Here, we deposit perovskite nanocrystals as single layers or as heterojunctions with s-SWCNTs onto quartz substrates which are precisely cut to fill the cross-section of a microwave X-band waveguide (ca. 10.2 mm×22.8 mm). For the measurement an individual sample is placed inside the microwave cavity which is directly attached to the waveguide. The microwave frequency of the probing field is then tuned to resonance with the sample cavity around 9 GHz. At resonance, the photoconductance $\Delta G$ of the sample is proportional to the changes in the microwave power and can be expressed as $\Delta G=-1/K*\Delta P/P$ where K is an empirically determined calibration factor for the microwave cavity used in this experiment. The fraction of the microwave power $\Delta P/P$ quantifies the attenuation of the reflected microwave field.

The sample was then excited with by a laser pulse with a width of around 5 ns from an optical parametric oscillator (Spectra-Physics PremiScan ULD/500) pumped by the third harmonic of an Nd:YAG laser (Spectra-Physics Quanta-Ray). The pumping wavelength was 500 nm, with a fluence of about $2.5 \times 10^{15}$ photons/cm$^2$. The changes in photoconductance were measured by continuously scanning the frequency range around the resonance of the microwave field i.e. by adjusting the voltage of the microwave generating oscillator (VCO, Sivers V03262X/00).

Temperature-dependent photocurrent measurement: All temperature-dependent photocurrent measurements were performed by using the Lake Shore 8400 helium cryogenic probe station, and the applied pulse-mode laser was supplied by using a laser diode, controlled by using an Agilent 33220A function generator with control software.

EXAMPLES

Example 1. A device comprising: a perovskite nanocrystal (NC) layer; a charge separating layer; an insulating layer; a gate electrode; a cathode, and an anode, wherein: the charge separating layer is positioned between the perovskite NC layer and the insulating layer, the insulating layer is positioned between the charge separating layer and the gate electrode, and the cathode and the anode both electrically contact the charge separating layer and the insulating layer.

Example 2. The device of Example 1, wherein the perovskite NC layer comprises a plurality of perovskite nanocrystals where each perovskite nanocrystal has an average characteristic width between about 1 nm and about 100 nm.

Example 3. The device of either Example 1 or Example 2, wherein the average characteristic width is between about 5 nm and about 20 nm.

Example 4. The device of any one of Examples 1-3, wherein the average characteristic width is between about 10 nm and about 15 nm.

Example 5. The device of any one of Examples 1-4, wherein the plurality of perovskite nanocrystals comprise at least one of a formamidinium lead halide (FAPbX$_3$) or a cesium lead halide (CsPbX$_3$).

Example 6. The device of any one of Examples 1-5, wherein the plurality of perovskite nanocrystals comprise at least one of CsPbI$_3$, CsPbBr$_3$, or FAPbBr$_3$.

Example 7. The device of any one of Examples 1-6, wherein the perovskite NC layer has a thickness between about 10 nm and about 100 nm.

Example 8. The device of any one of Examples 1-7, wherein the thickness is between about 30 nm and about 50 nm.

Example 9. The device of any one of Examples 1-8, wherein the charge separating layer comprises at least one of a carbonaceous material, a semiconductor, a polymer, or a small molecule.

Example 10. The device of any one of Examples 1-9, wherein the carbonaceous material comprise at least one of a carbon nanotube, graphene, a graphene oxide, a fullerenes, a carbon fiber, or graphite.

Example 11. The device of any one of Examples 1-10, wherein the carbon nanotube comprises at least one of a single-walled carbon nanotube (SWCNT), a double-walled carbon nanotube (DWCNTs), or a multi-walled carbon nanotube (MWCNTs).

Example 12. The device of any one of Examples 1-11, wherein the SWCNT comprises a semiconducting single-walled carbon nanotube (s-SWCNT).

Example 13. The device of any one of Examples 1-12, wherein the s-SWCNT comprises a (6, 5) SWCNT.

Example 14. The device of any one of Examples 1-13, wherein the charge separating layer comprises a network of (6, 5) single-walled carbon nanotubes.

Example 15. The device of any one of Examples 1-14, wherein the charge separating layer has a thickness between about 1 nm and about 100 nm.

Example 16. The device of any one of Examples 1-15, wherein the thickness is between about 5 nm and about 20 nm.

Example 17. The device of any one of Examples 1-16, wherein the insulating layer comprises a metal oxide.

Example 18. The device of any one of Examples 1-17, wherein the metal oxide comprises at least one of SiO$_2$, Al$_2$O$_3$, TiO$_2$, or ZrO$_2$.

Example 19. The device of any one of Examples 1-18, wherein the insulating layer is constructed of SiO$_2$.

Example 20. The device of any one of Examples 1-19, wherein the insulating layer has a thickness between about 50 nm and about 500 nm.

Example 21. The device of any one of Examples 1-20, wherein the thickness is between about 100 nm and about 300 nm.

Example 22. The device of any one of Examples 1-21, wherein the device is configured to generate a current when the perovskite NC layer is exposed to a light.

Example 23. The device of any one of Examples 1-22, further comprising a light source configured to provide the light.

Example 24. The device of any one of Examples 1-23, wherein the light has a wavelength between about 200 nm and about 1500 nm.

Example 25. The device of any one of Examples 1-24, wherein the wavelength is between about 400 nm and about 700 nm.

Example 26. The device of any one of Examples 1-25, wherein the light provides a pulse energy between about 73 fJ and about 250 µJ.

Example 27. The device of any one of Examples 1-26, wherein device is characterized by an optical responsivity between about $2.57 \times 10^3$ A/W and about $1.1 \times 10^9$ A/W.

Example 28. The device of any one of Examples 1-27, wherein the optical responsivity corresponds to a fluence between about 30.7 mW/cm2 and about $10^{-1}$ mW/cm$^2$, respectively.

Example 29. The device of any one of Examples 1-28, further comprising a source drain voltage electrically connecting the cathode and the anode.

Example 30. The device of any one of Examples 1-29, wherein the source drain voltage is configured to provide a voltage between about 0.01 V and about 10 V.

Example 31. The device of any one of Examples 1-30, further comprising a gate voltage electrically connected to the gate electrode.

Example 32. The device of any one of Examples 1-31, wherein the gate voltage is configured to provide a voltage between about −60 V and about 60 V.

Example 33. The device of any one of Examples 1-32, wherein the device is characterized by a photocurrent decay transient is up to 5,000 seconds.

Example 34. The device of any one of Examples 1-33, wherein the perovskite NC layer further comprise a surface that is enriched in charge trapping sites.

Example 35. The device of any one of Examples 1-34, wherein the device is configured to generate a photocurrent in response to at least one of a source drain voltage, a gate voltage, or a light pulse.

Example 36. The device of any one of Examples 1-35, wherein the photocurrent is capable of being erased by the gate voltage.

Example 37. The device of any one of Examples 1-36, configured to operate as at least one of a photodetector, an optical switching device, or a neuromorphic switching device.

Example 38. A method comprising: applying at least one of a source drain voltage, a gate voltage, or a light pulse to a device, and measuring a photocurrent generated by the device as a result of the applying, wherein the device comprises: a perovskite nanocrystal (NC) layer; a charge separating layer; an insulating layer; a gate electrode; a cathode and an anode.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A device comprising:
a perovskite nanocrystal (NC) layer;
a charge separating layer;
an insulating layer;
a gate electrode;
a cathode, and an anode, wherein:
the charge separating layer is positioned between the perovskite NC layer and the insulating layer,
the insulating layer is positioned between the charge separating layer and the gate electrode, and
the cathode and the anode both electrically contact the charge separating layer and the insulating layer.

2. The device of claim 1, wherein the perovskite NC layer comprises a plurality of perovskite nanocrystals where each perovskite nanocrystal has an average characteristic width between about 1 nm and about 100 nm.

3. The device of claim 2, wherein the plurality of perovskite nanocrystals comprise at least one of a formamidinium lead halide ($FAPbX_3$) or a cesium lead halide ($CsPbX_3$).

4. The device of claim 2, wherein the plurality of perovskite nanocrystals comprise at least one of $CsPbI_3$, $CsPbBr_3$, or $FAPbBr_3$.

5. The device of claim 1, wherein the charge separating layer comprises at least one of a carbonaceous material, a semiconductor, a polymer, or a small molecule.

6. The device of claim 5, wherein the carbonaceous material comprises at least one of a carbon nanotube, graphene, a graphene oxide, a fullerene, a carbon fiber, or graphite.

7. The device of claim 6, wherein the carbon nanotube comprises at least one of a single-walled carbon nanotube (SWCNT), a double-walled carbon nanotube (DWCNT), or a multi-walled carbon nanotube (MWCNT).

8. The device of claim 1, wherein the insulating layer comprises a metal oxide.

9. The device of claim 1, wherein the device is configured to generate a current when the perovskite NC layer is exposed to a light.

10. The device of claim 9, further comprising a light source configured to provide the light.

11. The device of claim 10, wherein the light has a wavelength between about 200 nm and about 1500 nm.

12. The device of claim 10, wherein the light provides a pulse energy between about 73 fJ and about 250 µJ.

13. The device of claim 1, wherein device is characterized by an optical responsivity between about $2.57 \times 10^3$ A/W and about $1.1 \times 10^9$ A/W.

14. The device of claim 13, wherein the optical responsivity corresponds to a fluence between about 30.7 mW/cm$^2$ and about $10^{-8}$ mW/cm$^2$, respectively.

15. The device of claim 1, further comprising a source drain voltage electrically connecting the cathode and the anode.

16. The device of claim 15, wherein the source drain voltage is configured to provide a voltage between about 0.01 V and about 10 V.

17. The device of claim 1, further comprising a gate voltage electrically connected to the gate electrode.

18. The device of claim 17, wherein the gate voltage is configured to provide a voltage between about −60 V and about 60 V.

19. The device of claim 1, wherein the device is configured to operate as at least one of a photodetector, an optical switching device, or a neuromorphic switching device.

20. A method comprising:
applying at least one of a source drain voltage, a gate voltage, or a light pulse to a device, and
measuring a photocurrent generated by the device as a result of the applying, wherein the device comprises:

a perovskite nanocrystal (NC) layer;
a charge separating layer;
an insulating layer;
a gate electrode;
a cathode, and an anode.

\* \* \* \* \*